US009685452B2

(12) United States Patent
Lee et al.

(10) Patent No.: US 9,685,452 B2
(45) Date of Patent: Jun. 20, 2017

(54) THREE-DIMENSIONAL SEMICONDUCTOR DEVICE WITH VERTICAL AND HORIZONTAL CHANNELS IN STACK STRUCTURE HAVING ELECTRODES VERTICALLY STACKED ON THE SUBSTRATE

(71) Applicant: Samsung Electronics Co., Ltd., Suwon-Si, Gyeonggi-do (KR)

(72) Inventors: Changhyun Lee, Suwon-si (KR); Heonkyu Lee, Hwaseong-si (KR); Shinhwan Kang, Seoul (KR); Youngwoo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/245,218

(22) Filed: Aug. 24, 2016

(65) Prior Publication Data
US 2017/0084624 A1   Mar. 23, 2017

(30) Foreign Application Priority Data
Sep. 18, 2015   (KR) .................. 10-2015-0132515

(51) Int. Cl.
| H01L 27/115 | (2017.01) |
| H01L 27/11568 | (2017.01) |
| H01L 27/1157 | (2017.01) |
| H01L 27/11524 | (2017.01) |
| H01L 27/11582 | (2017.01) |
| H01L 23/535 | (2006.01) |

(52) U.S. Cl.
CPC ...... *H01L 27/11568* (2013.01); *H01L 23/535* (2013.01); *H01L 27/1157* (2013.01); *H01L 27/11524* (2013.01); *H01L 27/11582* (2013.01)

(58) Field of Classification Search
CPC ......... H01L 27/11524; H01L 27/11568; H01L 27/11582
See application file for complete search history.

(56) References Cited

U.S. PATENT DOCUMENTS

| 7,679,133 B2 | 3/2010 | Son et al. |
| 8,553,466 B2 | 10/2013 | Han et al. |
| 8,559,235 B2 | 10/2013 | Yoon et al. |
| 8,592,873 B2 | 11/2013 | Kim et al. |
| 8,654,587 B2 | 2/2014 | Yoon et al. |
| 8,829,598 B2 | 9/2014 | Lim et al. |
| 8,912,592 B2 | 12/2014 | Lim et al. |
| 9,000,510 B2 | 4/2015 | Hong |

(Continued)

*Primary Examiner* — Thanh V Pham
(74) *Attorney, Agent, or Firm* — Ward and Smith, P.A.

(57) ABSTRACT

A three-dimensional (3D) semiconductor device includes a stack structure including electrodes vertically stacked on a substrate, a channel structure coupled to the electrodes to constitute a plurality of memory cells three-dimensionally arranged on the substrate, the channel structure including first vertical channels and second vertical channels penetrating the stack structure and a first horizontal channel disposed under the stack structure to laterally connect the first vertical channels and the second vertical channels to each other, a second horizontal channel having a first conductivity type and connected to a sidewall of the first horizontal channel of the channel structure, and conductive plugs having a second conductivity type and disposed on top ends of the second vertical channels.

20 Claims, 42 Drawing Sheets

(56) References Cited

U.S. PATENT DOCUMENTS

| | | | |
|---|---|---|---|
| 9,012,974 B2 | 4/2015 | Chae et al. | |
| 9,019,767 B2 | 4/2015 | Aritome et al. | |
| 9,053,977 B2 | 6/2015 | Choi et al. | |
| 9,099,348 B2 | 8/2015 | Lee et al. | |
| 9,184,216 B2 | 11/2015 | Park | |
| 9,443,866 B1 * | 9/2016 | Sakakibara | H01L 27/11582 |
| 2011/0233648 A1 | 9/2011 | Seol et al. | |
| 2013/0341702 A1 | 12/2013 | Kar et al. | |
| 2015/0115348 A1 | 4/2015 | Nam et al. | |
| 2016/0163729 A1 * | 6/2016 | Zhang | H01L 27/11582 257/321 |
| 2016/0233231 A1 * | 8/2016 | Lee | H01L 27/1157 |
| 2016/0233270 A1 * | 8/2016 | Takaki | H01L 27/10 |
| 2016/0358933 A1 * | 12/2016 | Rabkin | H01L 27/11582 |

* cited by examiner

THREE-DIMENSIONAL SEMICONDUCTOR DEVICE WITH VERTICAL AND HORIZONTAL CHANNELS IN STACK STRUCTURE HAVING ELECTRODES VERTICALLY STACKED ON THE SUBSTRATE

CROSS-REFERENCE TO RELATED APPLICATION

This U.S. non-provisional patent application claims priority under 35 U.S.C. §119 to Korean Patent Application No. 10-2015-0132515, filed on Sep. 18, 2015, in the Korean Intellectual Property Office, the disclosure of which is hereby incorporated by reference in its entirety.

BACKGROUND

The inventive concepts relate to three-dimensional (3D) semiconductor devices and, more particularly, to 3D semiconductor devices capable of improving reliability and integration density.

Semiconductor devices have been highly integrated to provide high performance and low costs. The integration density of semiconductor devices may affect the costs of the semiconductor devices, thereby resulting in a demand of a highly integrated semiconductor device. An integration density of a conventional two-dimensional (2D) or planar semiconductor device may be mainly determined by an area where a unit memory cell occupies. Therefore, the integration density of the conventional 2D semiconductor device may be greatly affected by a technique of forming fine patterns. However, since extremely high-priced apparatuses are needed to form fine patterns, the integration density of 2D semiconductor devices continues to increase but is still limited. Thus, three-dimensional (3D) semiconductor devices including three-dimensionally arranged memory cells have been developed.

SUMMARY

Embodiments of the inventive concepts may provide three-dimensional (3D) semiconductor devices capable of improving reliability and integration density.

According to some example embodiments of the inventive concepts, a 3D semiconductor device may include a stack structure including electrodes vertically stacked on a substrate, a channel structure coupled to the electrodes to constitute a plurality of memory cells three-dimensionally arranged on the substrate, the channel structure including first vertical channels and second vertical channels penetrating the stack structure and a first horizontal channel disposed under the stack structure to laterally connect the first vertical channels and the second vertical channels to each other, a second horizontal channel having a first conductivity type and connected to a sidewall of the first horizontal channel of the channel structure, and conductive plugs having a second conductivity type and disposed on top ends of the second vertical channels.

According to some example embodiments of the inventive concepts, a 3D semiconductor device may include a plurality of stack structures extending in a first direction and spaced apart from each other in a second direction, each of the stack structures including electrodes vertically stacked on a substrate, first vertical channels and second vertical channels penetrating each of the stack structures, a first horizontal channel extending in the first direction under each of the stack structures and connecting the first vertical channels and the second vertical channels to each other, second horizontal channels being in contact with both sidewalls of the first horizontal channel, a conductive line extending in the first direction on each of the stack structures and connected to the second vertical channels, and a bit line extending in the second direction on the conductive line and connected to the vertical channels. Each of the second horizontal channels may extend in the first direction between the stack structures adjacent one another when viewed from a plan view.

According to some example embodiments of the inventive concepts, a 3D semiconductor device may include a first horizontal channel extending in a first direction on a substrate, second horizontal channels extending in the first direction at both sides of the first horizontal channel and being in contact with both sidewalls of the first horizontal channel, a stack structure extending in the first direction and including a plurality of electrodes vertically stacked on the first horizontal channel, first vertical channels and second vertical channels penetrating the stack structure so as to be connected to the first horizontal channel, and conductive plugs disposed on top ends of the second vertical channels. The second horizontal channels may have a first conductivity type, and the conductive plugs may have a second conductivity type.

According to some embodiments of the present inventive concepts, a three-dimensional (3D) semiconductor device is provided. In some embodiments, the device includes a stack structure that extends in a first direction and that includes a plurality of electrodes that are vertically stacked on a substrate, first vertical channels and second vertical channels that penetrate the stack structure, a first horizontal channel that extends in the first direction under the stack structure and that connects the first vertical channels and the second vertical channels to each other, a second horizontal channel that extends in the first direction and that contacts both sidewalls of the first horizontal channel and conductive plugs that are on top ends of the second vertical channels, the conductive plugs having a second conductivity type that different from the first conductivity type.

In some embodiments, the first vertical channels are arranged along the first direction and along the second direction that is perpendicular to the first direction and the first horizontal channel is connected to the first vertical channels that are arranged along the first direction and the first vertical channels that are arranged along the second direction.

Some embodiments provide that the vertical channels, the second vertical channels, and the first horizontal channel constitute one semiconductor layer that continuously extends without an interface therein. In some embodiments, an interface exists between the first horizontal channel and the second horizontal channel.

Some embodiments include source plugs that are on top ends of the second vertical channels. In some embodiments, the source plugs have a conductivity type opposite to a conductivity type of the second horizontal channel and bottom surfaces of the source plugs are lower than a bottom surface of an uppermost one of the electrodes.

Some embodiments include a data storage layer that is between the stack structure and the first vertical channels and that is between the stack structure and the second vertical channels, and a residual data storage pattern that is between the first horizontal channel and the substrate. Some embodiments provide that the stack structure includes insulating layers that are between the electrodes. In some embodiments, the data storage layer extends between a bottom surface of a lowermost insulating layer of the stack structure and the first horizontal channel and the second horizontal channel is in contact with a portion of the data storage layer and a portion of the residual data storage pattern.

Some embodiments further include a conductive pad that is on a top end of each of the vertical channels. In some embodiments, the conductive pad has the second conductivity type and a bottom surface of the conductive pad is higher than a top surface of an uppermost one of the electrodes.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
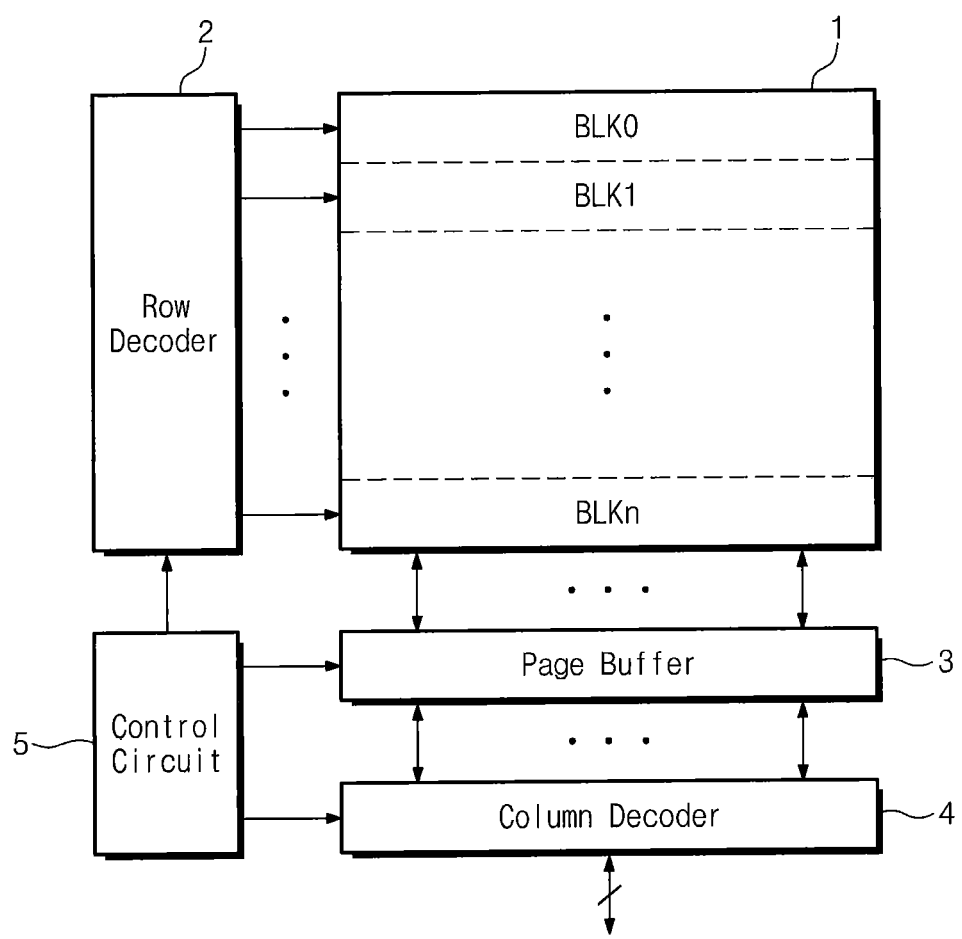
FIG. 1 is a schematic block diagram illustrating a three-dimensional (3D) semiconductor device according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Additionally, exemplary embodiments are described herein with reference to cross-sectional views and/or plan views that are idealized exemplary views. Accordingly, shapes of exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

FIG. 1 is a schematic block diagram illustrating a three-dimensional (3D) semiconductor device according to some embodiments of the inventive concepts.

Referring to FIG. 1, a 3D semiconductor device may include a memory cell array 1, a row decoder 2, a page buffer 3, a column decoder 4, and a control circuit 5. The 3D semiconductor device may be a 3D semiconductor memory device.

The memory cell array 1 may include a plurality of memory blocks BLK0 to BLKn. Each of the memory blocks BLK0 to BLKn may include a plurality of memory cells, a plurality of word lines, and a plurality of bit lines. The word lines and the bit lines may be electrically connected to the memory cells.

The row decoder 2 may decode an address signal inputted from an external system to select one of the word lines. The address signal decoded in the row decoder 2 may be provided to a row driver (not shown). The row driver may provide a selected word line voltage and unselected word line voltages generated from a voltage generation circuit (not shown) to the selected word line and unselected word lines in response to a control signal of the control circuit 5. The row decoder 2 may be connected in common to the plurality of memory blocks BLK0 to BLKn and may provide driving signals to the word lines of one memory block selected by a block selection signal.

The page buffer 3 may be connected to the memory cell array 1 through the bit lines to sense data stored in the memory cells. The page buffer 3 may be connected to a bit line selected by an address signal decoded in the column decoder 4. According to an operation mode, the page buffer 3 may temporarily store data to be stored in the memory cells or may sense data stored in the memory cells. For example, the page buffer 3 may be operated as a write driver during a program operation mode and may be operated as a sense amplifier during a sensing operation mode. The page buffer 3 may receive power (e.g., a voltage or a current) from the control circuit 5 and may provide the received power to the selected bit line.

The column decoder 4 may provide a data-transmitting path between the page buffer 3 and an external device (e.g., a memory controller). The column decoder 4 may decode an address signal inputted from the external device to select one of the bit lines. The column decoder 4 may be connected in common to the plurality of memory blocks BLK0 to BLKn and may provide data to the bit lines of the memory block selected by the block selection signal.

The control circuit 5 may control overall operations of the 3D semiconductor device. The control circuit 5 may receive control signals and an external voltage and may be operated in response to the received control signals. The control circuit 5 may include a voltage generator that generates voltages (e.g., a program voltage, a sensing voltage, and an erase voltage) necessary to inner operations by means of the external voltage. The control circuit 5 may control a sensing operation, a write operation, and/or an erase operation in response to the control signals.

Figure 2:
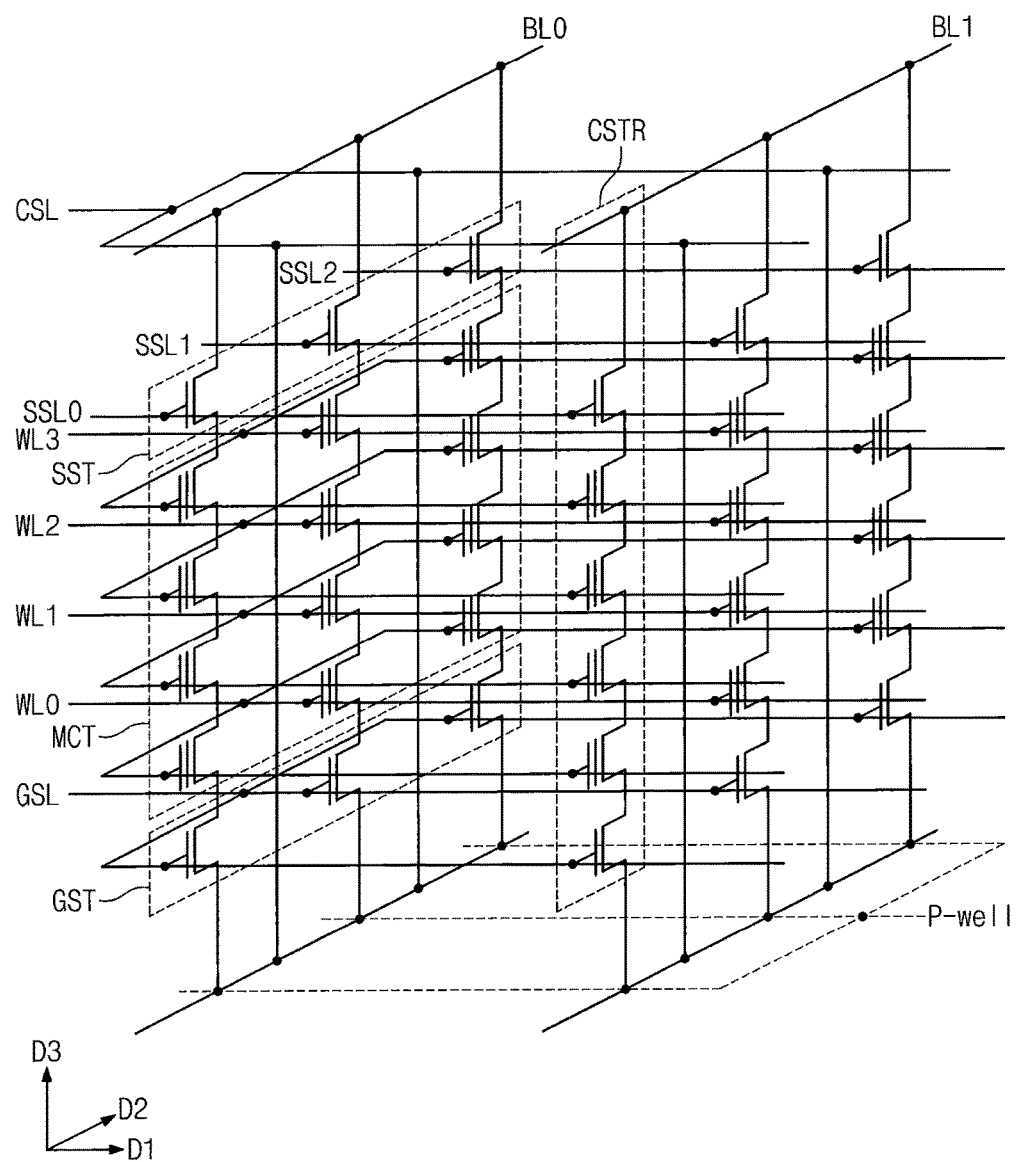
FIG. 2 is a circuit diagram illustrating a cell array of a 3D semiconductor device according to some embodiments of the inventive concepts.

FIG. 2 is a circuit diagram illustrating a cell array of a 3D semiconductor device according to some embodiments of the inventive concepts.

Referring to FIG. 2, a cell array of a 3D semiconductor device according to some embodiments of the inventive concepts may include a common source line CSL, a plurality of bit lines BL, and a plurality of cell strings CSTR connected between the common source line CSL and the bit lines BL.

The bit lines BL may be two-dimensionally arranged. A plurality of the cell strings CSTR may be connected in parallel to each of the bit lines BL. The cell strings CSTR may be connected in common to the common source line CSL. In other words, a plurality of the cell strings CSTR may be disposed between one common source line CSL and the plurality of bit lines BL. In some embodiments, the common source line CSL may include a plurality of common source lines CSL two-dimensionally arranged. The same voltage may be applied to the plurality of the common source lines CSL, or the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT, and the string selection transistor SST may be connected in series to each other in the order named.

The common source line CSL may be connected in common to sources of the ground selection transistors GST. A ground selection line GSL, a plurality of word lines WL0 to WL3 and a string selection line SSL which are disposed between the common source line CSL and the bit lines BL may be used as a gate electrode of the ground selection transistor GST, gate electrodes of the memory cell transistors MCT and a gate electrode of the string selection transistor SST, respectively. Each of the memory cell transistors MCT may include a data storage element. In addition, channel regions of the transistors constituting the cell strings CSTR may be electrically connected in common to a P-type well (P-well).

Figure 3:
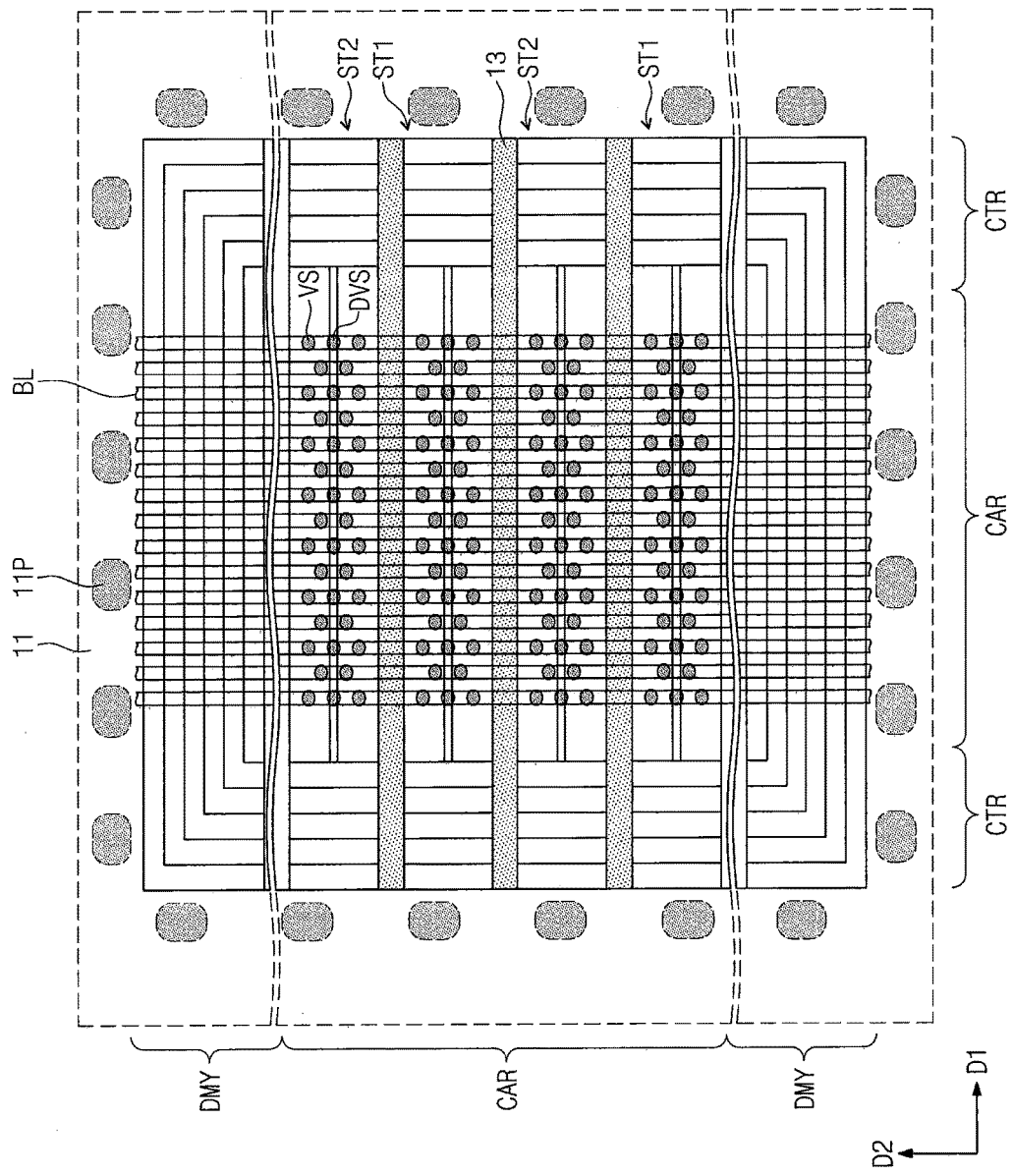
FIG. 3 is a plan view illustrating a 3D semiconductor device according to some embodiments of the inventive concepts.
Figure 4A:
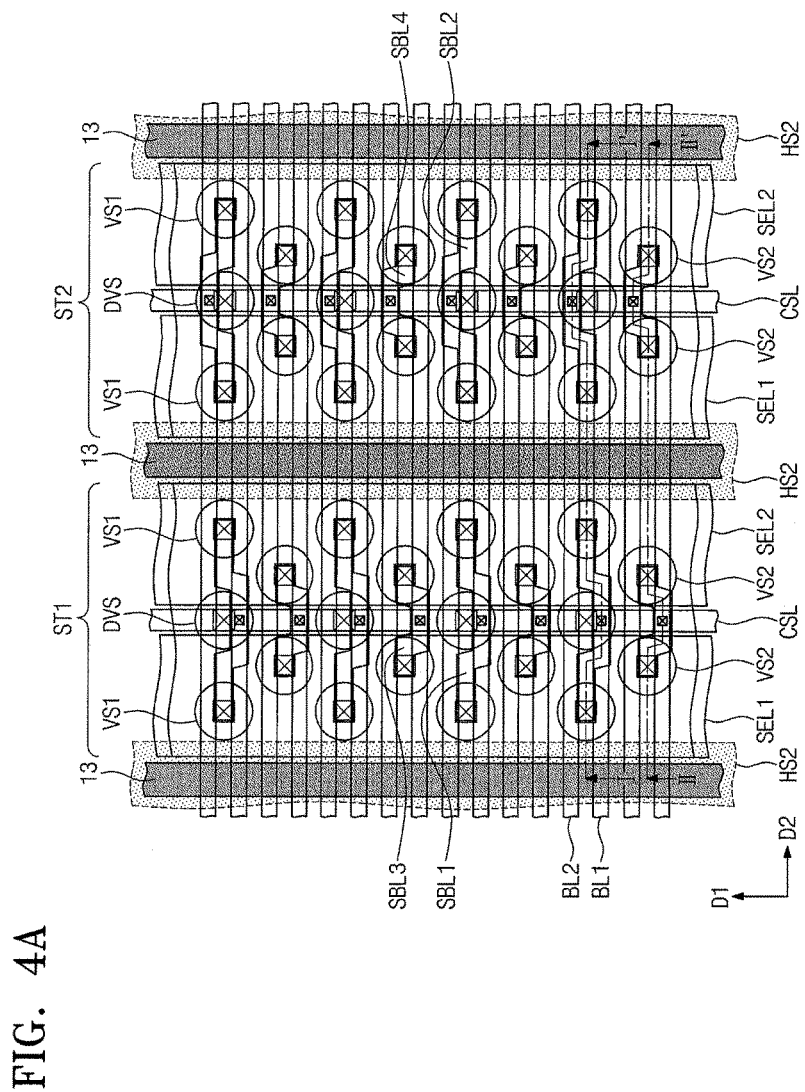
FIG. 4A is a plan view illustrating a cell array region of a 3D semiconductor device according to some embodiments of the inventive concepts.
Figure 4B:
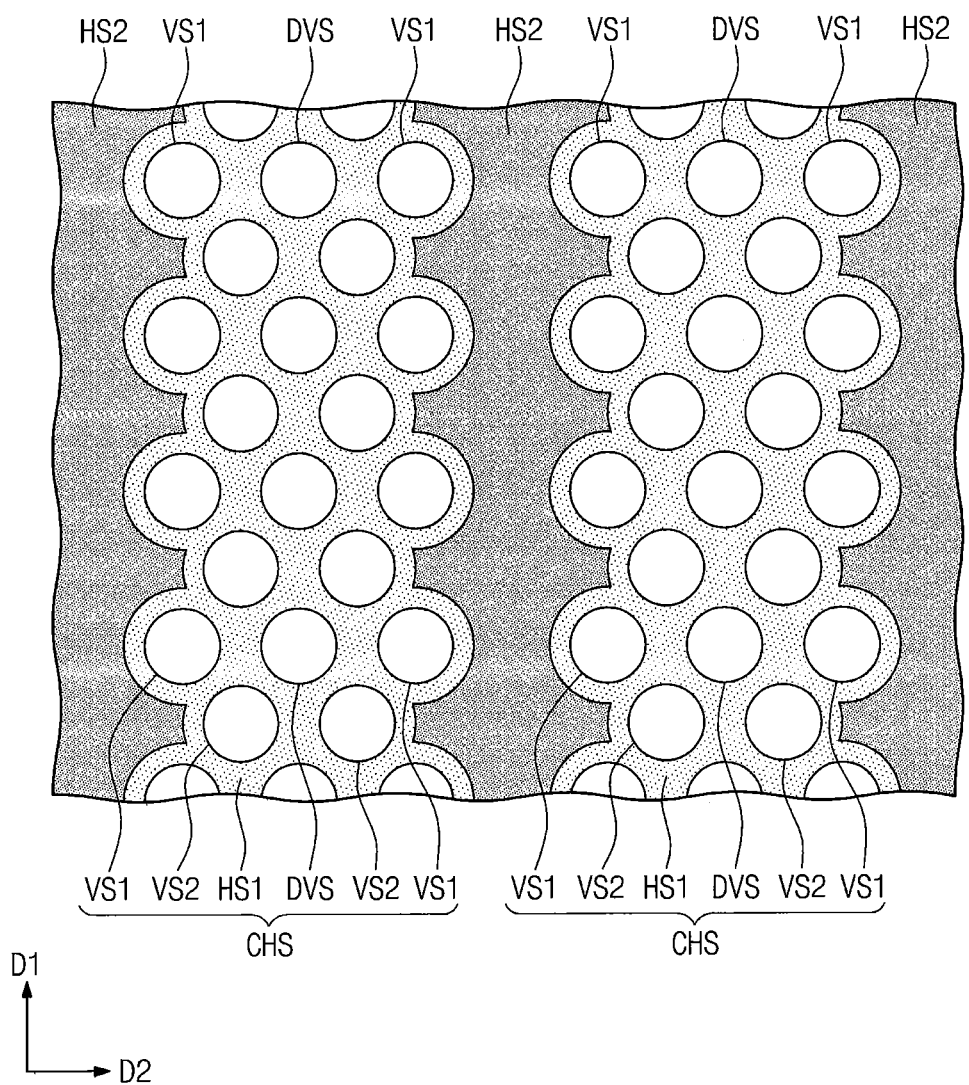
FIG. 4B is a plan view illustrating a channel structure of a 3D semiconductor device according to some embodiments of the inventive concepts.
Figure 5:
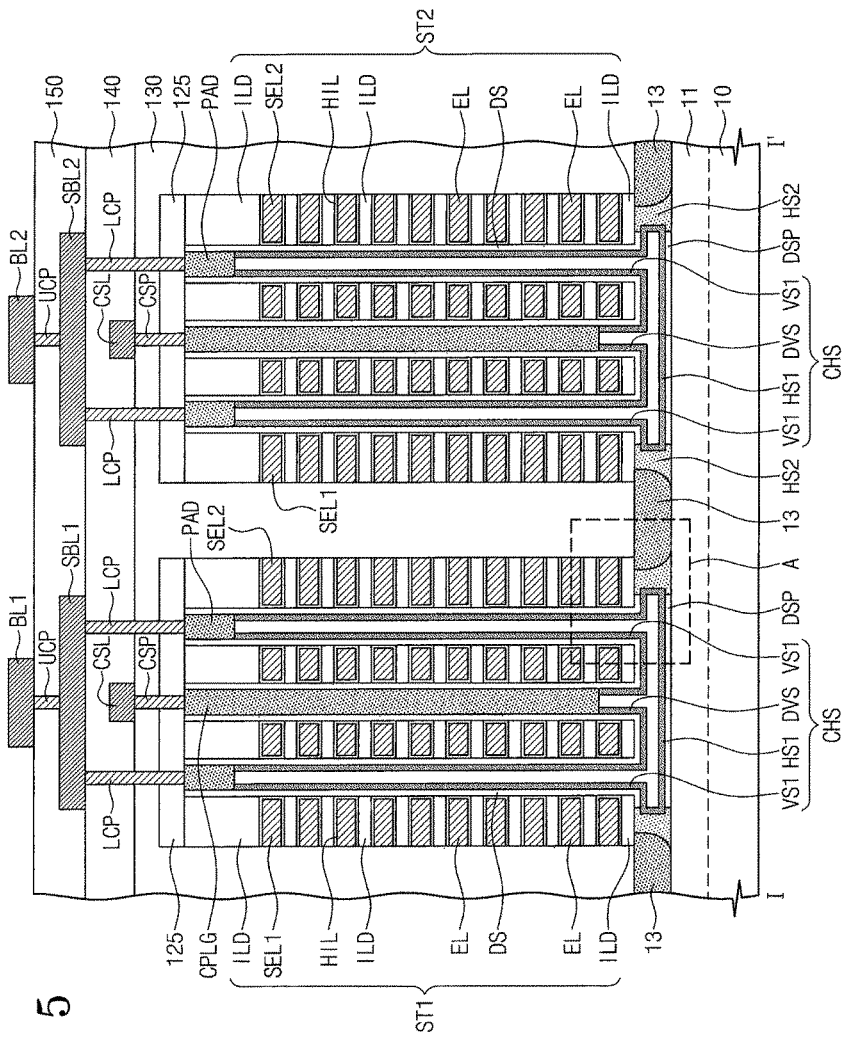
FIGS. 5 and 6 are cross-sectional views taken along lines I-I' and II-II' of FIG. 4A, respectively, to illustrate a 3D semiconductor device according to some embodiments of the inventive concepts.
Figure 6:
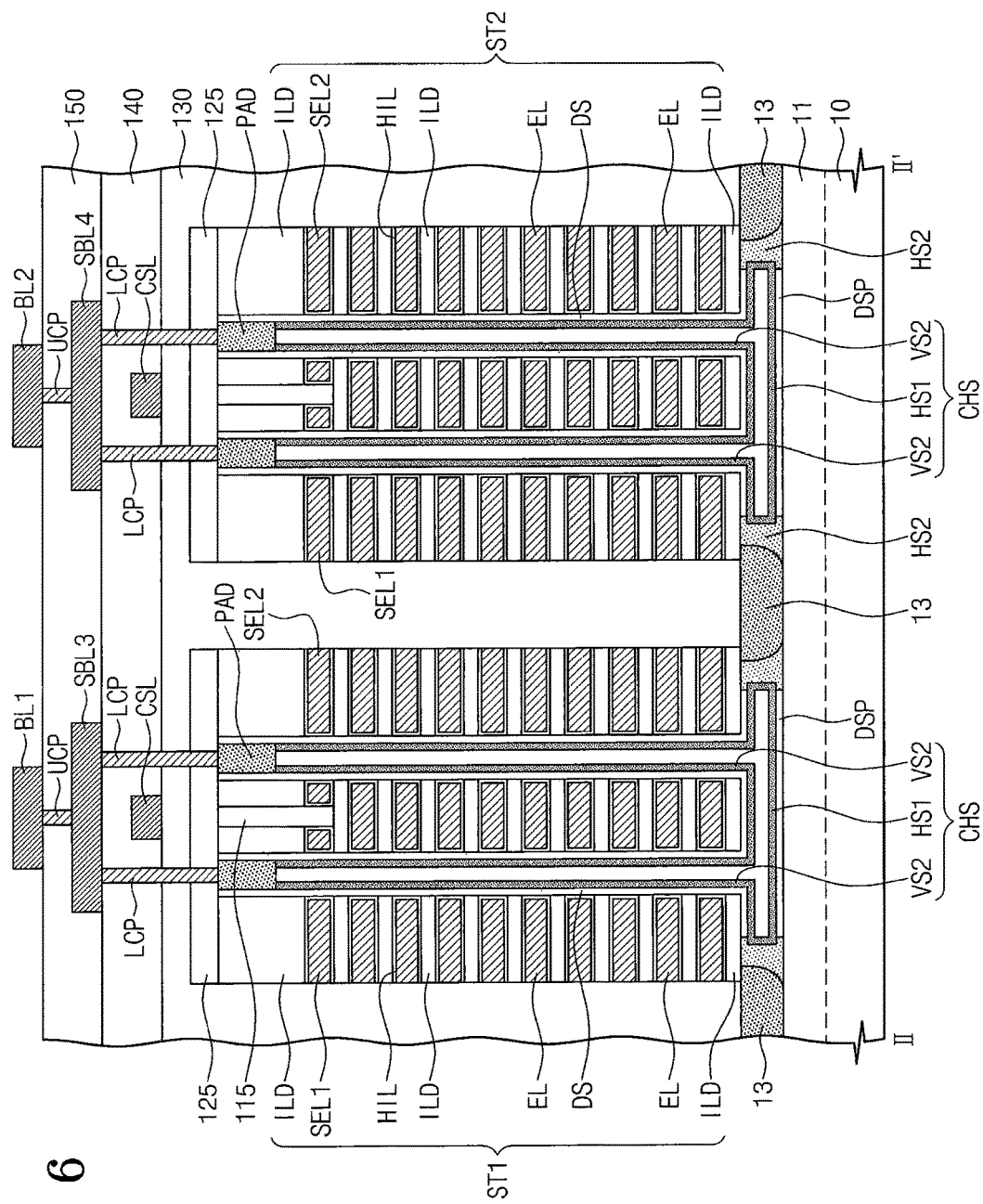

FIG. 3 is a plan view illustrating a 3D semiconductor device according to some embodiments of the inventive concepts. FIG. 4A is a plan view illustrating a cell array region of a 3D semiconductor device according to some embodiments of the inventive concepts. FIG. 4B is a plan view illustrating a channel structure of a 3D semiconductor device according to some embodiments of the inventive concepts. FIGS. 5 and 6 are cross-sectional views taken along lines I-I' and II-II' of FIG. 4A, respectively, to illustrate a 3D semiconductor device according to some embodiments of the inventive concepts. FIGS. 7A to 7E are enlarged views of a portion 'A' of FIG. 5.

Referring to FIGS. 3, 4A, 4B, 5, and 6, a substrate 10 may include cell array region CAR, contact regions CTR, and dummy regions DMY. The contact regions CTR may be disposed at both sides of the cell array region CAR in a first direction D1. The dummy regions DMY may be disposed at both sides of the cell array region CAR in a second direction D2 perpendicular to the first direction D1. A plurality of first stack structures ST1 and a plurality of second stack structures ST2 may extend in the first direction D1 in parallel to each other on the substrate 10 and may be spaced apart from each other in the second direction D2. As illustrated in FIG. 3, the first stack structures ST1 and the second stack structures ST2 may be alternately arranged along the second direction D2 when viewed from a plan view. In some embodiments, the first and second directions D1 and D2 may be parallel to a top surface of the substrate 10.

In some embodiments, the substrate 10 may be formed of a semiconductor material and may include a well dopant layer 11 doped with dopants of a first conductivity type. For example, the substrate 10 may include at least one of silicon (Si), germanium (Ge), silicon-germanium (SiGe), gallium-arsenic (GaAs), indium-gallium-arsenic (InGaAs), aluminum-gallium-arsenic (AlGaAs), or any combination thereof. For example, the substrate 10 may be a bulk silicon substrate, a silicon-on-insulator (SOI) substrate, a germanium substrate, a germanium-on-insulator (GOI) substrate, a silicon-germanium substrate, and/or a substrate including an epitaxial layer obtained by performing a selective epitaxial growth (SEG) process.

In certain embodiments, the substrate 10 may include an insulating material and may include a single layer or a plurality of thin layers. For example, the substrate 10 may include at least one of a silicon oxide layer, a silicon nitride layer, or a low-k dielectric layer.

Each of the first and second stack structures ST1 and ST2 may include electrodes EL vertically stacked on the substrate 10 and insulating layers ILD disposed between the electrodes EL. In other words, the electrodes EL may be stacked along a third direction D3 perpendicular to the first and second directions D1 and D2. In some embodiments, the third direction D3 may be perpendicular to the top surface of the substrate 10. The electrodes EL of the first and second stack structures ST1 and ST2 may include a conductive material. For example, the electrodes EL may include at least one of a doped semiconductor (e.g., doped silicon), a metal (e.g., tungsten, copper, or aluminum), a conductive metal nitride (e.g., titanium nitride or tantalum nitride), or a transition metal (e.g., titanium or tantalum).

In some embodiments, the uppermost electrode of each of the first and second stack structures ST1 and ST2 may be divided into segments laterally spaced apart from each other. In other words, the uppermost electrode of each of the first and second stack structures ST1 and ST2 may include a first string selection electrode SEL1 and a second string selection electrode SEL2 which extend in the first direction D1 and are spaced apart from each other in the second direction D2, and a separation insulating pattern 115 may be disposed between the first and second string selection electrodes SEL1 and SEL2.

In each of the first and second stack structures ST1 and ST2, thicknesses of the insulating layers ILD may be varied according to characteristics of the 3D semiconductor device. In some embodiments, the thicknesses of the insulating layers ILD may be substantially equal to each other. In some embodiments, one or some of the insulating layers ILD may be thicker than another or others of the insulating layers ILD. In some embodiments, each of the insulating layers ILD may include at least one of a silicon oxide layer or a low-k dielectric layer. In some embodiments, the insulating layers ILD may include pores and/or air gaps.

In some embodiments, the 3D semiconductor device may be a vertical NAND flash memory device. In this case, some of the electrodes EL of each of the first and second stack structures ST1 and ST2 may be used as control gate electrodes of the memory cell transistors MCT of FIG. 2.

In some embodiments, the electrodes EL of each of the first and second stack structures ST1 and ST2 may be coupled to one channel structure CHS to constitute the memory cell transistors MCT of FIG. 2, the string selection transistors SST of FIG. 2, and the ground selection transistors GST of FIG. 2. In each of the first and second stack structures ST1 and ST2, the first and second string selection electrode SEL1 and SEL2 corresponding to the uppermost electrode may be used as the gate electrodes of the string selection transistors SST of FIG. 2 controlling electrical connection between a bit line BL and the channel structure CHS, the lowermost electrode EL may be used as the gate electrodes of the ground selection transistors GST of FIG. 2 controlling electrical connection between the channel structure CHS and the common source line CSL. The electrodes EL between the uppermost electrode and the lowermost electrode may be used as the control gate electrodes of the memory cell transistors MCT of FIG. 2 and word lines connecting the control gate electrodes.

In some embodiments, one channel structure CHS may include first vertical channels VS1, second vertical channels VS2, dummy vertical channels DVS, and a first horizontal channel HS1. The first and second vertical channels VS1 and VS2 and the dummy vertical channels DVS may penetrate each of the first and second stack structures ST1 and ST2. The first horizontal channel HS1 may be disposed under each of the first and second stack structures ST1 and ST2 and may laterally or horizontally connect the first and second vertical channels VS1 and VS2 and the dummy vertical channels DVS to each other.

The first vertical channels VS1 may be spaced apart from each other and may be arranged in the first direction D1 and the second direction D2. The second vertical channels VS2 may be spaced apart from each other and may be arranged in the first direction D1 and the second direction D2. At this time, each of the second vertical channels VS2 may be disposed at a position shifted from a corresponding one of the first vertical channels VS1 in a direction diagonal to the second direction D2. In other words, the first and second vertical channels VS1 and VS2 adjacent one another may be arranged in a zigzag form along the first direction D1. The dummy vertical channels DVS of each of the first and second stack structures ST1 and ST2 may be arranged in the first direction D1 and may be disposed between the first and second string selection electrodes SEL1 and SEL2. Each of the dummy vertical channels DVS may be disposed between the first vertical channels VS1 arranged in the second direction D2 and may be aligned with each of the second vertical channels VS2 adjacent thereto in a direction diagonal to the second direction D2. In some embodiments, each of the vertical channels VS1, VS2, and DVS may have a hollow pipe or macaroni shape. In certain embodiments, each of the vertical channels VS1, VS2, and DVS may have a cylindrical shape.

In some embodiments, the first horizontal channel HS1 may extend from bottom ends of the vertical channels VS1, VS2, and DVS so as to be disposed under each of the first and second stack structures ST1 and ST2. The first horizontal channel HS1 may extend along the first direction D1. In other words, the first horizontal channel HS1 may be connected in common to the first and second vertical channels VS1 and VS2 arranged in the first and second directions D1 and D2 and the dummy vertical channels DVS arranged in the first direction D1. In some embodiments, the first and second vertical channels VS1 and VS2, the dummy vertical channels DVS, and the first horizontal channel HS1 may constitute a single semiconductor layer that continuously extends without an interface.

In some embodiments, the first horizontal channel HS1 may have a hollow pipe or macaroni shape connected to the vertical channels VS1, VS2, and DVS. For example, the first and second vertical channels VS1 and VS2, the dummy vertical channels DVS, and the first horizontal channel HS1 may constitute a pipe shape which is in one body.

As illustrated in FIG. 4B, the first horizontal channel HS1 may overlap with the first or second stack structure ST1 or ST2 when viewed from a plan view. In addition, the first horizontal channel HS1 may have rounded sidewalls, and each rounded sidewall of the first horizontal channel HS1 may be in contact with a second horizontal channel HS2. A width of the first horizontal channel HS1 may be smaller than that of each of the first and second stack structures ST1 and ST2.

In some embodiments, the first and second vertical channels VS1 and VS2, the dummy vertical channels DVS, and the first horizontal channel HS1 may be formed of a semiconductor material and may be undoped or doped with dopants of the same conductivity type (i.e., the first conductivity type) as the well dopant layer 11. The vertical channels VS1, VS2, and DVS and the first horizontal channel HS1 may have a crystal structure including at least one of a single-crystalline structure, an amorphous structure, or a poly-crystalline structure.

In some embodiments, first and second vertical channels VS1 and VS2, the dummy vertical channels DVS, and the first horizontal channel HS1 may constitute the single semiconductor layer not having an interface, as described above. The semiconductor layer may have a substantially uniform thickness and may extend from inner sidewalls of the first or second stack structure ST1 or ST2 onto a bottom surface of the first or second stack structure ST1 or ST2. In other words, thicknesses of the first and second vertical channels VS1 and VS2 may be substantially equal to a thickness of the first horizontal channel HS1.

A filling insulation pattern VI may fill inner spaces of the vertical channels VS1, VS2, and DVS and the first horizontal channel HS1. For example, the filling insulation pattern VI may extend from the inner spaces of the vertical channels VS1, VS2, and DVS into the inner space of the first horizontal channel HS1.

The second horizontal channels HS2 may be disposed at both sides of the first horizontal channel HS1 of the channel structure CHS to connect the first horizontal channel HS1 to the well dopant layer 11. In some embodiments, the second horizontal channel HS2 may be formed of a semiconductor material and may be undoped or doped with dopants of the same conductivity type (i.e., the first conductivity type) as the well dopant layer 11. The second horizontal channel HS2 may have a crystal structure including at least one of a single-crystalline structure, an amorphous structure, or a poly-crystalline structure.

In more detail, the second horizontal channel HS2 may be disposed between the first and second stack structures ST1 and ST2 in a plan view and may extend in parallel to the first horizontal channel HS1 along the first direction D1. The second horizontal channels HS2 may be in contact with both sidewalls of the first horizontal channel HS1 below the first and second stack structures ST1 and ST2. An interface may exist between the first horizontal channel HS1 and the second horizontal channel HS2 which are formed of semiconductor materials. The second horizontal channel HS2 may be electrically connected to the vertical channels VS1, VS2, and DVS through the first horizontal channel HS1.

The second horizontal channel HS2 may include a dopant region 13 that is disposed between the first and second stack structures ST1 and ST2 when viewed from a plan view. Here, the dopant region 13 may be doped with dopants of the first conductivity type. A dopant concentration of the dopant region 13 may be higher than that of the second horizontal channel HS2.

In some embodiments, conductive pads PAD may be disposed on top ends of the first and second vertical channels VS1 and VS2, and source plugs CPLG may be disposed on top ends of the dummy vertical channels DVS. In some embodiments, the top ends of the vertical channels VS1, VS2, and DVS may be lower than the top surface of each of the first and second stack structures ST1 and ST2, and top surfaces of the conductive pad PAD and the source plug CPLG may be substantially coplanar with the top surface of each of the first and second stack structures ST1 and ST2. A vertical length of each of the source plugs CPLG may be greater than those of the conductive pads PAD. In other words, bottom surfaces of the conductive pads PAD may be higher than the top surface of the uppermost electrode SEL1 and SEL2, and bottom surfaces of the source plugs CPLG may be lower than the bottom surface of the uppermost electrode SEL1 and SEL2. For example, the source plug CPLG may vertically extend toward the substrate 10 such that the bottom surface of the source plug CPLG is adjacent the first horizontal channel HS1.

The conductive pads PAD and the source plugs CPLG may be dopant regions doped with dopants or may be formed of a conductive material. In some embodiments, the conductive pads PAD and the source plugs CPLG may have a second conductivity type opposite to the first conductivity type of the dopant region 13 and the well dopant layer 11.

In some embodiments, a data storage layer DS may be disposed between each of the vertical channels VS1, VS2, and DVS and each of the first and second stack structures ST1 and ST2 and may extend between the first horizontal channel HS1 and a bottom surface of each of the first and second stack structures ST1 and ST2. In addition, a residual data storage pattern DSP may be disposed between the first horizontal channel HS1 and the well dopant layer 11 and may be spaced apart from the data storage layer DS.

In some embodiments, when the 3D semiconductor device is the vertical NAND flash memory device, each of the data storage layer DS and the residual data storage pattern DSP may include a tunnel insulating layer TIL, a charge storage layer CIL, and a blocking insulating layer BLK, as illustrated in FIGS. 7A to 7E. Data stored in the data storage layer DS may be changed using Flower-Nordheim tunneling caused by a voltage difference between the electrode EL and each of the first and second vertical channels VS1 and VS2 including the semiconductor material. In some embodiments, the data storage layer DS may be a thin layer that is capable of storing data based on other operation principles. For example, the data storage layer DS may be a thin layer for a phase-change memory cell and/or a thin layer for a variable resistance memory cell.

A horizontal insulating pattern HIL may extend from between the data storage layer DS and each of the electrodes EL onto top and bottom surfaces of each of the electrodes EL. The horizontal insulating pattern HIL on top and bottom surfaces of the first and second string selection electrodes SEL1 and SEL2 may further extend between the separation insulating pattern 115 and the first and second string selection electrodes SEL1 and SEL2. In some embodiments, when the 3D semiconductor device is the vertical NAND flash memory device, the horizontal insulating pattern HIL may be used as a blocking layer.

A capping insulating pattern 125 may be disposed on each of the first and second stack structures ST1 and ST2 to cover top surfaces of the conductive pads PAD and top surfaces of the source plugs CPLG.

A filling insulation layer 130 may be disposed on an entire top surface of the substrate 10 to cover the first and second stack structures ST1 and ST2 and to completely fill a space between the first and second stack structures ST1 and ST2. In some embodiments, the filling insulation layer 130 may be in contact with a top surface of the second horizontal channel HS2, i.e., a top surface of the dopant region 13.

A common source line CSL extending in the first direction D1 may be disposed on the filling insulation layer 130. The common source line CSL may be connected to the source plugs CPLG through contact plugs CSP. The common source line CSL may be disposed on each of the first and second stack structures ST1 and ST2 and may be electrically connected in common to the dummy vertical channels DVS arranged along the first direction D1.

A first insulating layer 140 may be disposed on the filling insulating layer 130 to cover the common source lines CSL. First, second, third, and fourth assistant interconnections SBL1, SBL2, SBL3, and SBL4 may be disposed on the first insulating layer 140. The first and third assistant interconnections SBL1 and SBL3 may be disposed on the first stack structure ST1, and the second and fourth assistant interconnections SBL2 and SBL4 may be disposed on the second stack structure ST2. The first and third assistant interconnections SBL1 and SBL3 may intersect the common source line CSL disposed on the first stack structure ST1, and the second and fourth assistant interconnections SBL2 and SBL4 may intersect the common source line CSL disposed on the second stack structure ST2.

The first assistant interconnections SBL1 may be electrically connected to the first vertical channels VS1 penetrating the first stack structure ST1 through lower contact plugs LCP. The third assistant interconnections SBL3 may be electrically connected to the second vertical channels VS2 penetrating the first stack structure ST1 through lower contact plugs LCP.

The second assistant interconnections SBL2 may be electrically connected to the first vertical channels VS1 penetrating the second stack structure ST2 through lower contact plugs LCP. The fourth assistant interconnections SBL4 may be electrically connected to the second vertical channels VS2 penetrating the second stack structure ST2 through lower contact plugs LCP.

A second insulating layer 150 may be disposed on the first insulating layer 140 to cover the first to fourth assistant interconnections SBL1 to SBL4, and first and second bit lines BL1 and BL2 may be disposed on the second insulating layer 150. The first and second bit lines BL1 and BL2 may extend in the second direction D2 and may be alternately arranged along the first direction D1.

The first bit lines BL1 may be connected to the first assistant interconnections SBL1 and the third assistant interconnections SBL3 through upper contact plugs UCP, and the second bit lines BL2 may be connected to the second assistant interconnections SBL2 and the fourth assistant interconnections SBL4 through upper contact plugs UCP.

The channel structures according to various embodiments of the inventive concepts will be described in detail with reference to FIGS. 7A to 7E.

Referring to FIGS. 7A to 7E, the first and second vertical channels VS1 and VS2 may be continuously connected to the first horizontal channel HS1 without an interface therebetween. In some embodiments, the first horizontal channel HS1 may include an upper horizontal portion HP1, a lower horizontal portion HP2, and wall portions VP. The upper and lower horizontal portions HP1 and HP2 may be spaced apart from each other by the filling insulation pattern VI. One of the wall portions VP may be connected between one end of the upper horizontal portion HP1 and one end of the lower horizontal portion HP2, and the other of the wall portions VP may be connected to between another end of the upper horizontal portion HP1 and another end of the lower horizontal portion HP2. The upper and lower horizontal portions HP1 and HP2 and the wall portions VP may have a substantially uniform thickness. The second horizontal channels HS2 may be disposed at both sides of the first horizontal channel HS1 so as to be in direct contact with the wall portions VP of the first horizontal channel HS1.

Referring to FIGS. 7A to 7D, the second horizontal channel HS2 may be in direct contact with the well dopant layer 11. The second horizontal channel HS2 may be doped with dopants of the first conductivity type, and the dopant concentration of the second horizontal channel HS2 may be lower than or substantially equal to that of the well dopant layer 11. In the case in which the dopant concentration of the second horizontal channel HS2 is lower than that of the well dopant layer 11, the dopant region 13 of the first conductivity type may be disposed in the second horizontal channel HS2. Here, the dopant region 13 of the first conductivity type may extend in the first direction D1 and may be in contact with the well dopant layer 11. The dopant concentration of the dopant region 13 may be substantially equal to that of the well dopant layer 11. In other words, during an erase operation of the vertical NAND flash memory device, an erase voltage applied to the well dopant layer 11 may be provided to the dopant region 13 of the first conductivity type.

Figure 7A:
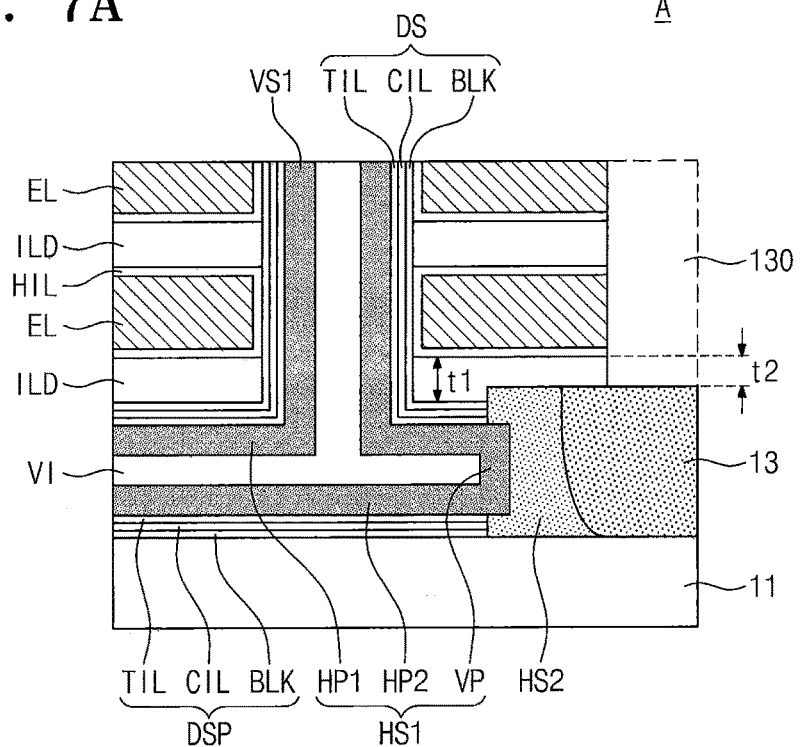
FIGS. 7A to 7E are enlarged views of a portion 'A' of FIG. 5.
Figure 7B:
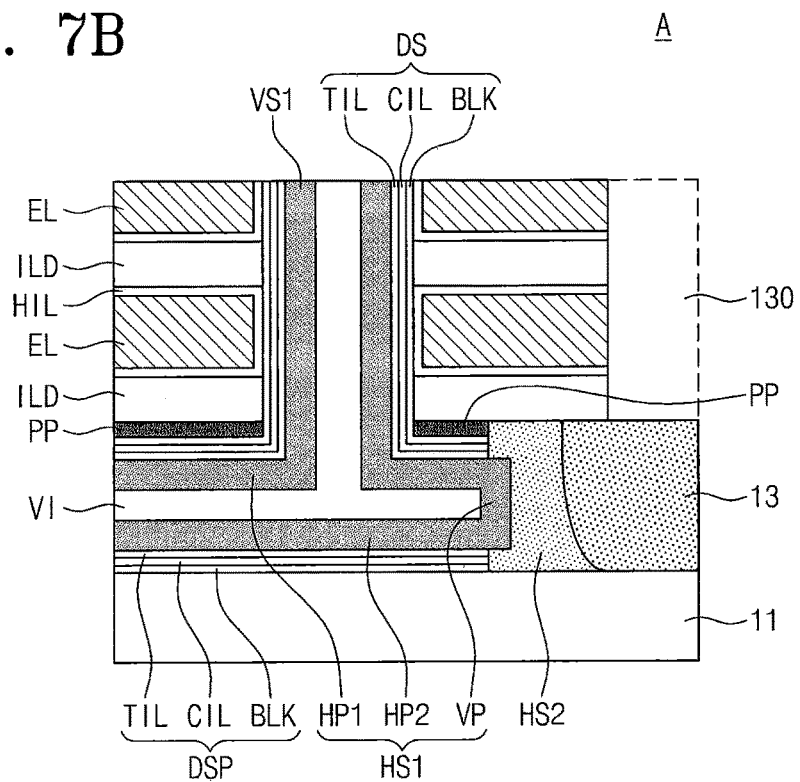
Figure 7C:
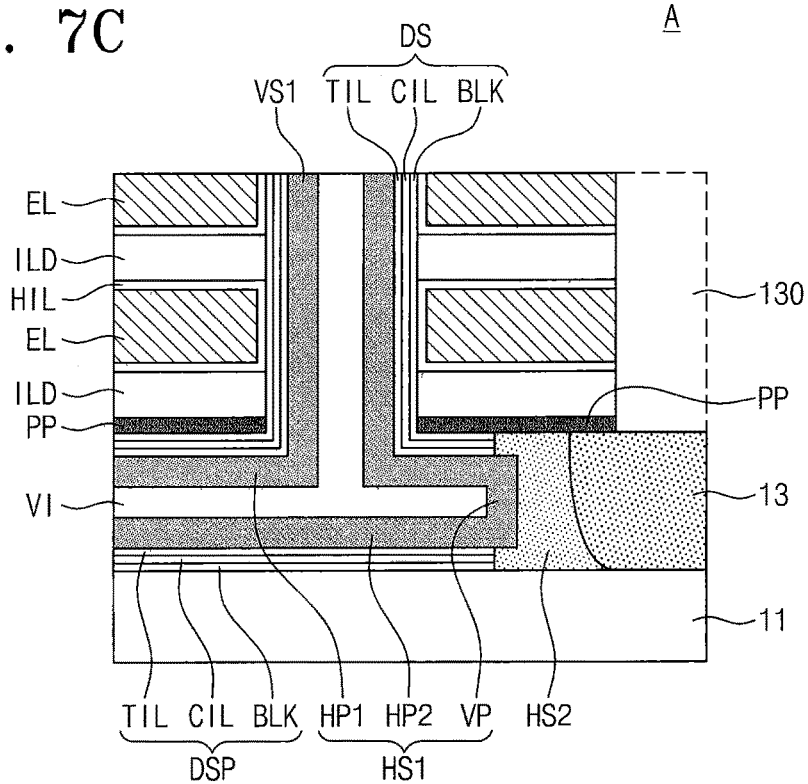
Figure 7D:
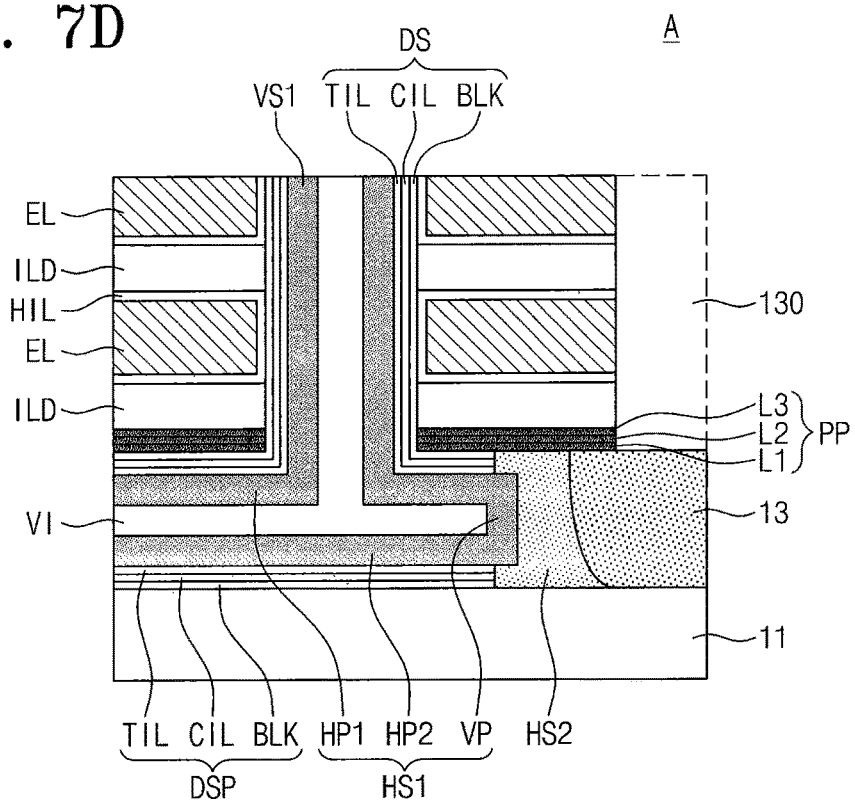
Figure 7E:
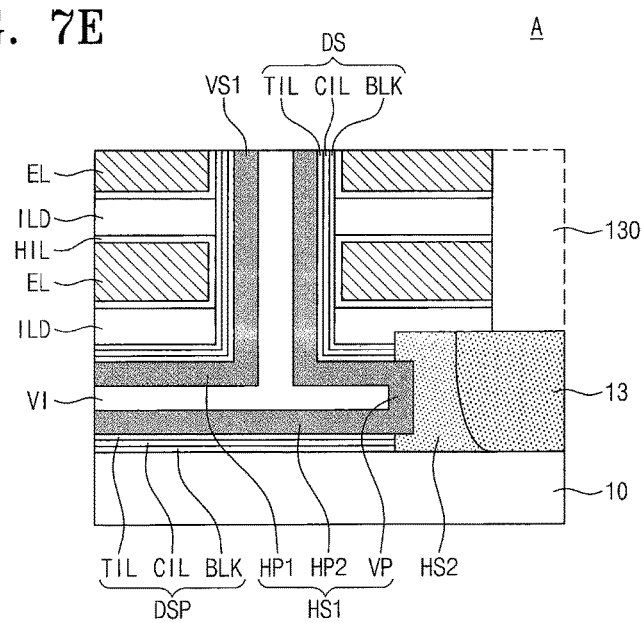

Referring to FIG. 7E, the first and second stack structures ST1 and ST2, the first and second vertical channels VS1 and VS2, the dummy vertical channels DVS, and the first and second horizontal channels HS1 and HS2 may be disposed on the substrate 10 formed of an insulating material. Here, the second horizontal channel HS2 may be in contact with the substrate 10 formed of the insulating material and may include the dopant region 13 of the first conductivity type. In this case, the erase voltage may be applied to the dopant region 13 of the first conductivity type during the erase operation of the vertical NAND flash memory device.

The data storage layer DS may extend from between the stack structure ST1 or ST2 and each of the first and second vertical channels VS1 and VS2 into between the first horizontal channel HS1 and the lowermost insulating layer ILD. The residual data storage pattern DSP may be disposed between the well dopant layer 11 and the lower horizontal portion HP2 of the first horizontal channel HS1. The data storage layer DS may have the same thin layer(s) as the residual data storage pattern DSP. In some embodiments, each of the data storage layer DS and the residual data storage pattern DSP may include the tunnel insulating layer TIL, the charge storage layer CIL, and the blocking insulating layer BLK.

In the data storage layer DS and the residual data storage pattern DSP, the charge storage layer CIL may include at least one of a trap site-rich insulating layer, a floating gate electrode, or an insulating layer including conductive nano dots (or nano particles). The charge storage layer CIL may be formed using a chemical vapor deposition (CVD) technique and/or an atomic layer deposition (ALD) technique. For example, the charge storage layer CIL may include at least one of, but not limited to, a silicon nitride layer, a silicon oxynitride layer, a silicon-rich nitride layer, a nano-crystalline silicon layer, and/or a laminated trap layer. The tunnel insulating layer TIL may include at least one of materials having energy band gaps greater than that of the charge storage layer CIL and may be formed by a CVD process and/or an ALD process. For example, the tunnel insulating layer TIL may include a silicon oxide layer formed using the CVD process or the ALD process. In some embodiments, the tunnel insulating layer TIL may include one of high-k dielectric layers such as an aluminum oxide layer and a hafnium oxide layer. The blocking insulating layer BLK may include at least one of materials having of which energy band gaps are smaller than that of the tunnel insulating layer TIL and greater than that of the charge storage layer CIL. For example, the blocking insulating layer BLK may include at least one of high-k dielectric layers such as an aluminum oxide layer and a hafnium oxide layer. The blocking insulating layer BLK may be formed using at least one of a CVD process or an ALD process. At least one of the layers TIL, CIL, and BLK may be formed using a wet oxidation process. In some embodiments, the blocking insulating layer BLK may include first and second blocking insulating layers. In this case, the first blocking insulating layer may include at least one of the high-k dielectric layers such as an aluminum oxide layer and a hafnium oxide layer, and the second blocking insulating layer may include a material having a lower dielectric constant than the first blocking insulating layer. Some embodiments provide that the second blocking insulating layer may include at least one of the high-k dielectric layers, and the first blocking insulating layer may include a material having a lower dielectric constant than the second blocking insulating layer.

According to some embodiments illustrated in FIG. 7A, the second horizontal channel HS2 may be in contact with the sidewall of the first horizontal channel HS1 and a portion of the data storage layer DS. In each of the first and second stack structures ST1 and ST2, the lowermost insulating layer ILD may have a first thickness t1 on the first horizontal channel HS1 and may have a second thickness t2 on the second horizontal channel HS2. Here, the second thickness t2 may be smaller than the first thickness t1.

According to some embodiments illustrated in FIG. 7B, a protection insulating pattern PP may be disposed between a bottom surface of the lowermost insulating layer ILD and the data storage layer DS. The second horizontal channel HS2 may be in contact with the sidewall of the first horizontal channel HS1, a portion of the data storage layer DS, and the protection insulating pattern PP. The protection insulating pattern PP may be formed of a different material from the lowermost insulating layer ILD. Here, the lowermost insulating layer ILD may be in contact with a portion of the second horizontal channel HS2 and may have a substantially uniform thickness.

According to some embodiments illustrated in FIG. 7C, a protection insulating pattern PP may be disposed between the bottom surface of the lowermost insulating layer ILD and the data storage layer DS and between the second horizontal channel HS2 and the lowermost insulating layer ILD. In other words, the second horizontal channel HS2 may be in contact with the sidewall of the first horizontal channel HS1 and a portion of the data storage layer DS and may be spaced apart from the lowermost insulating layer ILD.

According to some embodiments illustrated in FIG. 7D, a protection insulating pattern PP may be disposed between the bottom surface of the lowermost insulating layer ILD and the data storage layer DS and may include a plurality of thin layers. For example, the protection insulating pattern PP may have the same stacked structure as the data storage layer DS. For example, the protection insulating pattern PP may include a silicon oxide layer L1, a silicon nitride layer L2, and a silicon oxide layer L3 which are sequentially stacked. The protection insulating pattern PP may extend between the lowermost insulating layer ILD and the second horizontal channel HS2.

Figure 8A:
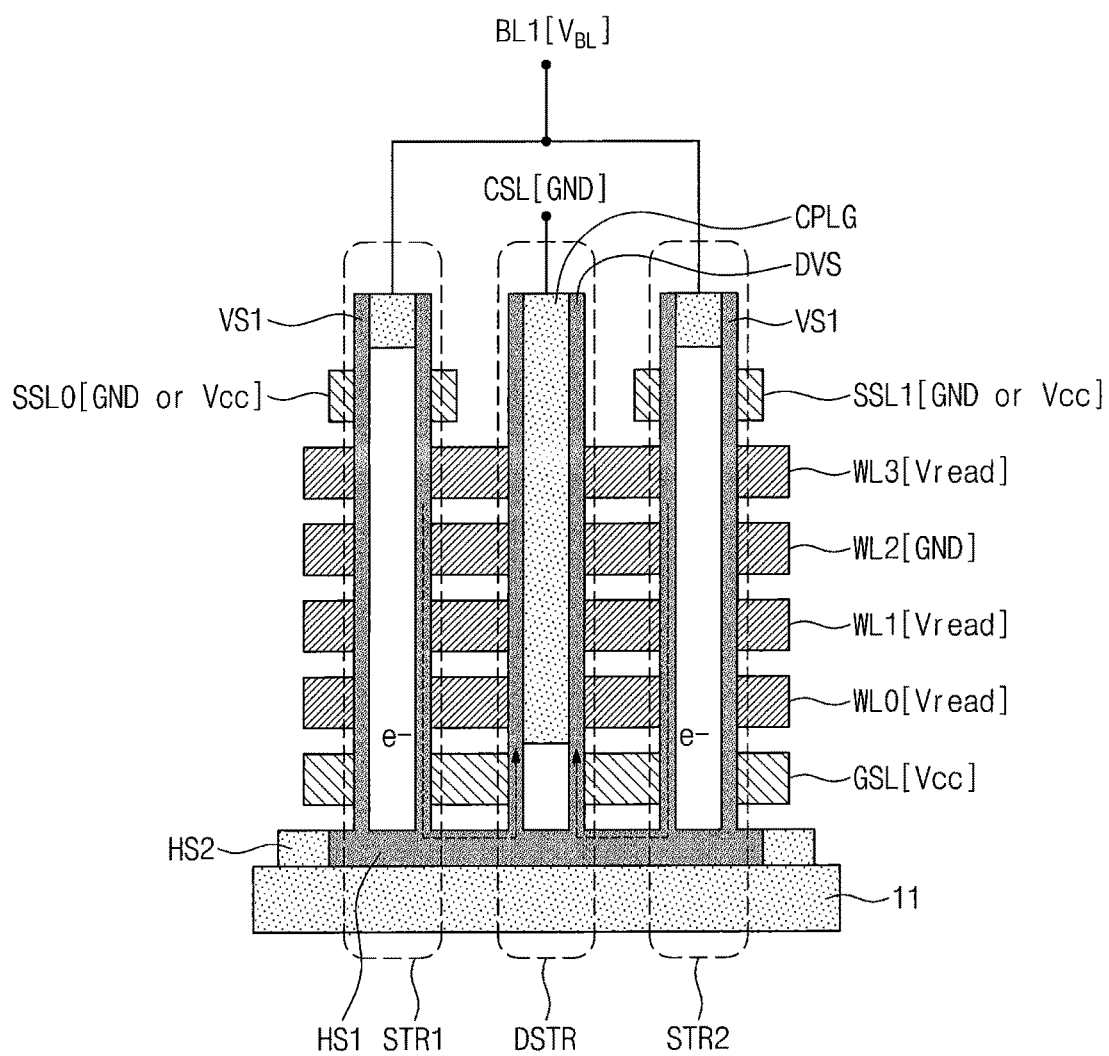
FIGS. 8A and 8B are views illustrating methods for operating a 3D semiconductor device according to some embodiments of the inventive concepts.
Figure 8B:
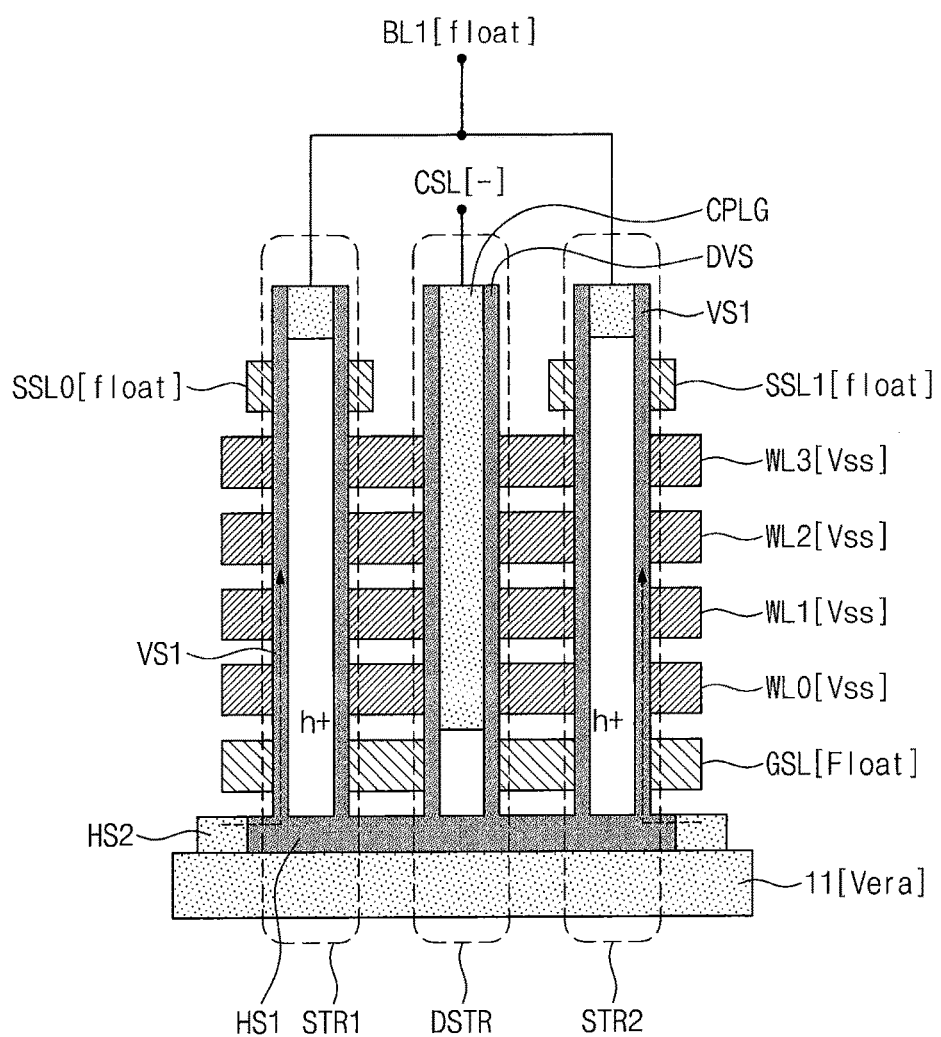

FIGS. 8A and 8B are views illustrating methods for operating a 3D semiconductor device according to some embodiments of the inventive concepts. FIG. 8A is a view illustrating a read operation of a 3D semiconductor device, and FIG. 8B is a view illustrating an erase operation of a 3D semiconductor device.

Referring to FIGS. 8A and 8B, a first string selection line SSL0, word lines WL0 to WL3, and a ground selection line GSL may be coupled to one of the first vertical channels VS1 to constitute a first string STR1. A second string selection line SSL1, the word lines WL0 to WL3, and the ground selection line GSL may be coupled to another of the first vertical channels VS1 to constitute a second string STR2. The word lines WL0 to WL3 and the ground selection line GSL may be coupled to the dummy vertical channel DVS to constitute a dummy string DSTR. The top ends of the dummy vertical channel DVS may be electrically connected to the source plug CPLG. The top ends of the first and second vertical channels VS1 and VS2 may be electrically connected to the first bit line BL1. The first and second strings STR1 and STR2 may be connected in common to the common source line CSL through the first horizontal channel HS1 and the dummy vertical channel DVS. In addition, the first and second strings STR1 and STR2 may be connected to the second horizontal channel HS2 and the well dopant layer (11) through the first horizontal channel HS1.

According to some embodiments of the inventive concepts, a path through which electrons move during the read operation may be different from a path through which holes move during the erase operation.

Referring to FIG. 8A, in the read operation of the 3D semiconductor device, a ground voltage GND may be applied to a selected word line WL2 and a read voltage Vread may be applied to unselected word lines WL0, WL1, and WL3. Here, the read voltage Vread may be higher than threshold voltages of the transistors to generate inversion layers in the first vertical channels VS1. A predetermined bit line voltage $V_{BL}$ may be applied to a selected bit line BL1, and the ground voltage GND may be applied to unselected bit lines. The power supply voltage Vcc for turning on the string and ground selection transistors may be applied to a selected string selection line SSL0 or SSL1 and a ground selection line GSL. The ground voltage GND may be applied to an unselected string selection line SSL0 or SSL1, the common source line CSL, and the well dopant layer (11).

Under the above voltage conditions, a read current path may be generated between the selected bit line BL1 and the common source line CSL during the read operation. When the first string selection line SSL0 is selected, a flow of electrons may occur through the first vertical channel VS1 of the first string STR1, the first horizontal channel HS1, and the dummy vertical channel DVS between the selected bit line BL1 and the common source line CSL. When the second string selection line SSL1 is selected, a flow of electrons may occur through the first vertical channel VS1 of the second string STR2, the first horizontal channel HS1, and the dummy vertical channel DVS between the selected bit line BL1 and the common source line CSL.

Referring to FIG. 8B, in the erase operation of the 3D semiconductor device, a ground voltage Vss may be applied to the word lines WL0 to WL3. In addition, the bit line BL1, the string selection lines SSL0 and SSL1, and the common source line CSL may be floated. Moreover, an erase voltage Vera may be applied to the well dopant layer (11) through a well pickup region 11p of FIG. 3. The erase voltage Vera may be transmitted to the second horizontal channel HS2.

Under these voltage conditions, holes may be provided into the first and second vertical channels VS1 and VS2 through the first and second horizontal channels HS1 and HS2 during the erase operation. In other words, the path through the holes are provided may be generated in the first and second horizontal channels HS1 and HS2 and the first and second vertical channels VS1 and VS2 during the erase operation.

Figure 9:
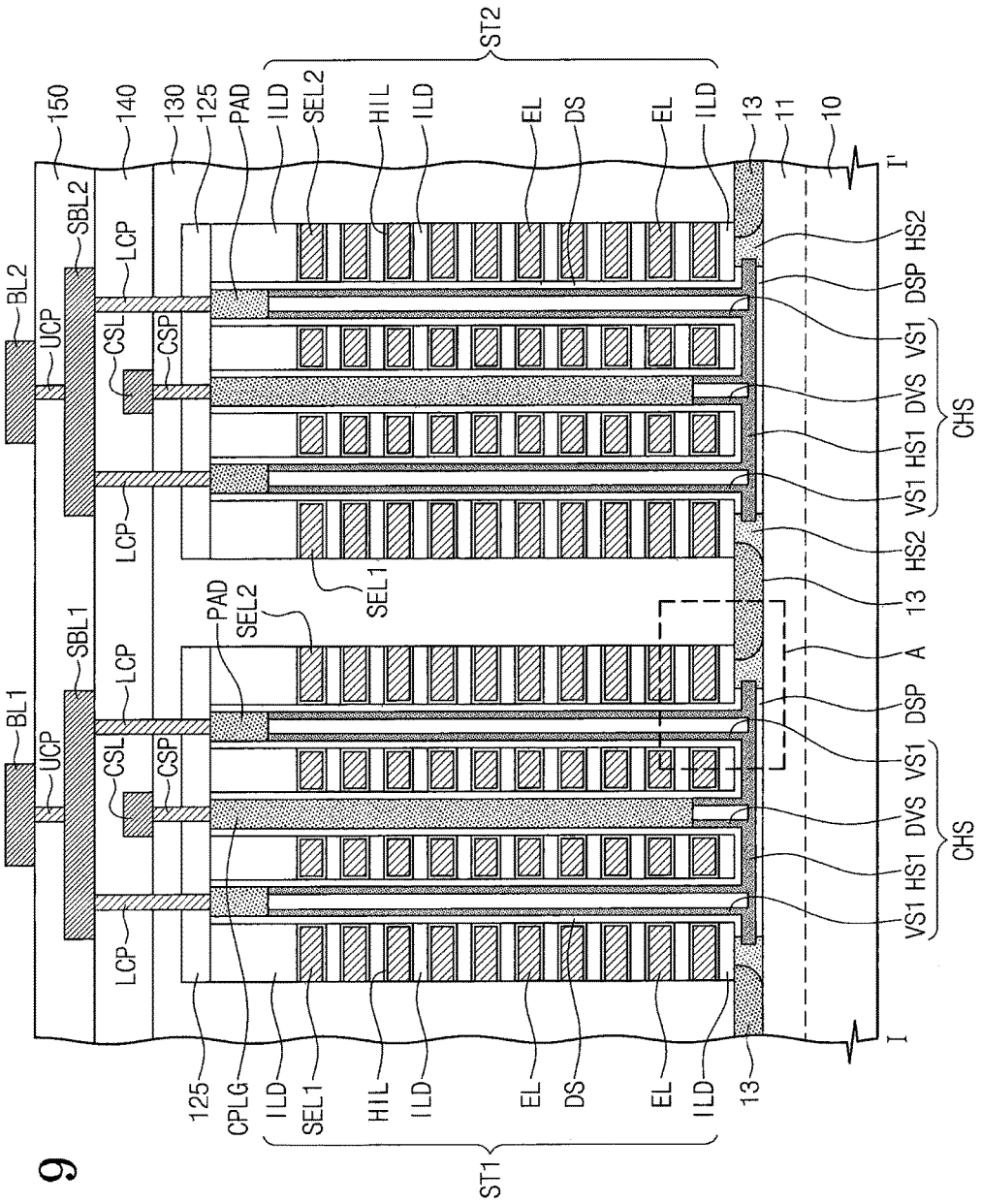
FIG. 9 is a cross-sectional view illustrating a 3D semiconductor device according to some embodiments of the inventive concepts.
Figure 10:
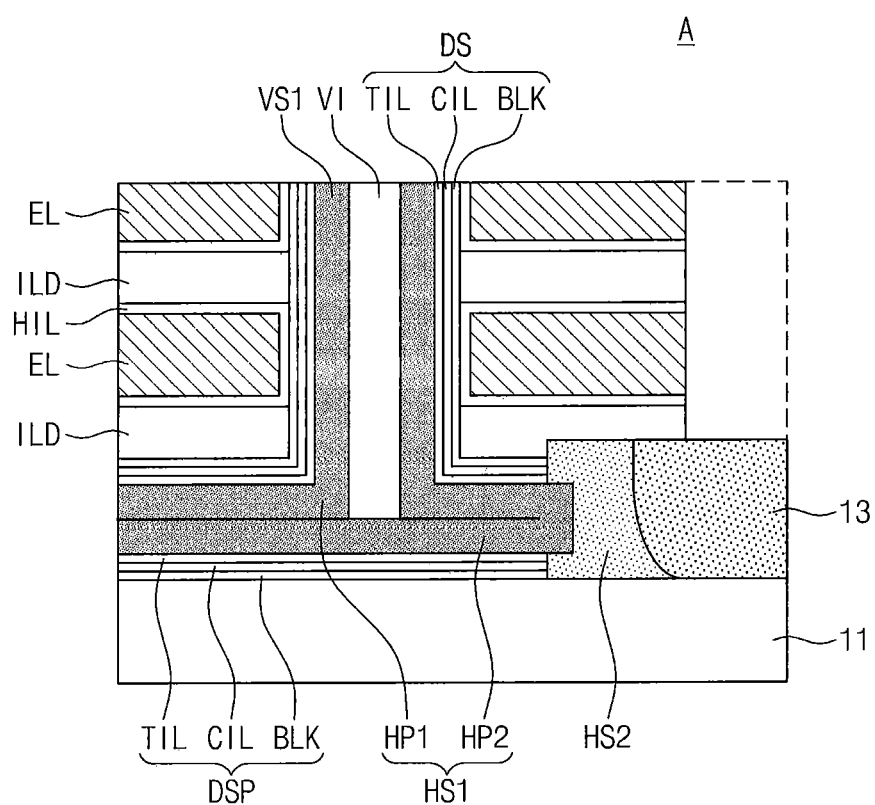
FIG. 10 is an enlarged view of a portion 'A' of FIG. 9.

FIG. 9 is a cross-sectional view illustrating a 3D semiconductor device according to some embodiments of the inventive concepts. FIG. 10 is an enlarged view of a portion 'A' of FIG. 9. In the present embodiment, the descriptions to the same technical features as in the embodiment of FIGS. 3, 4A, 4B, 5, and 6 will be omitted or mentioned briefly for the purpose of ease and convenience in explanation.

Referring to FIGS. 9 and 10, the first and second stack structures ST1 and ST2 extending in the first direction D1 may be disposed on the substrate 10 so as to be spaced apart from each other in the second direction D2. The channel structure CHS may be provided to each of the first and second stack structures ST1 and ST2. The channel structure CHS may include the first and second vertical channels VS1 and VS2, the dummy vertical channels DVS, and the first horizontal channel HS1.

The first and second vertical channels VS1 and VS2 and the dummy vertical channels DVS may penetrate each of the first and second stack structures ST1 and ST2, and the first horizontal channel HS1 may be disposed under each of the first and second stack structures ST1 and ST2. The first horizontal channel HS1 may continuously extend from the vertical channels VS1, VS2, and DVS and may extend in parallel to each of the first and second stack structures ST1 and ST2 along the first direction D1, as described with reference to FIGS. 4A and 4B. The second horizontal channels HS2 may be disposed at both sides of the first horizontal channel HS1. The second horizontal channels HS2 may extend in the first direction D1 and may be in contact with both sidewalls of the first horizontal channel HS1, respectively. The first horizontal channel HS1 may be connected to the first and second vertical channels VS1 and VS2 without an interface therebetween, but an interface may be formed between the first horizontal channel HS1 and the second horizontal channel HS2 by semiconductor crystals.

In some embodiments, the first horizontal channel HS1 may completely fill a space between the substrate 10 and each of the first and second stack structures ST1 and ST2 without the filling insulation pattern VI. In more detail, the first horizontal channel HS1 may have upper and lower horizontal portions HP1 and HP2 that are in contact with each other. At this time, an interface may be formed between the upper and lower horizontal portions HP1 and HP2 by semiconductor crystals. The upper horizontal portion HP1 may cover the data storage layer DS covering the bottom surface of each of the first and second stack structures ST1 and ST2, and the lower horizontal portion HP2 may cover the residual data storage pattern DSP disposed on the substrate 10.

The filling insulation pattern VI may fill the inner space of each of the vertical channels VS1, VS2, and DVS having the hollow pipe shapes. The filling insulation patterns VI of the vertical channels VS1, VS2, and DVS may be in contact with the first horizontal channel HS1 and may be separated from each other.

The data storage layer DS may be disposed between each of the first and second stack structures ST1 and ST2 and the vertical channels VS1, VS2, and DVS. The data storage layer DS may extend onto the bottom surface of the lowermost insulating layer ILD of each of the first and second stack structures ST1 and ST2.

The conductive pads PAD may be respectively disposed on the first and second vertical channels VS1 and VS2, and the source plugs CPLG may be respectively disposed on the dummy vertical channels DVS. In some embodiments, the conductive pads PAD and the source plugs CPLG may be dopant regions. In this case, the conductive pads PAD and the source plugs CPLG may have the second conductivity type opposite to the first conductivity type of the dopant region 13 formed in the second horizontal channel HS2.

FIGS. 11, 12, 13, and 14 are cross-sectional views illustrating 3D semiconductor devices according to some embodiments of the inventive concepts. Hereinafter, the descriptions to the same technical features as in the embodiment of FIGS. 3, 4A, 4B, 5, and 6 will be omitted or mentioned briefly for the purpose of ease and convenience in explanation.

Figure 11:
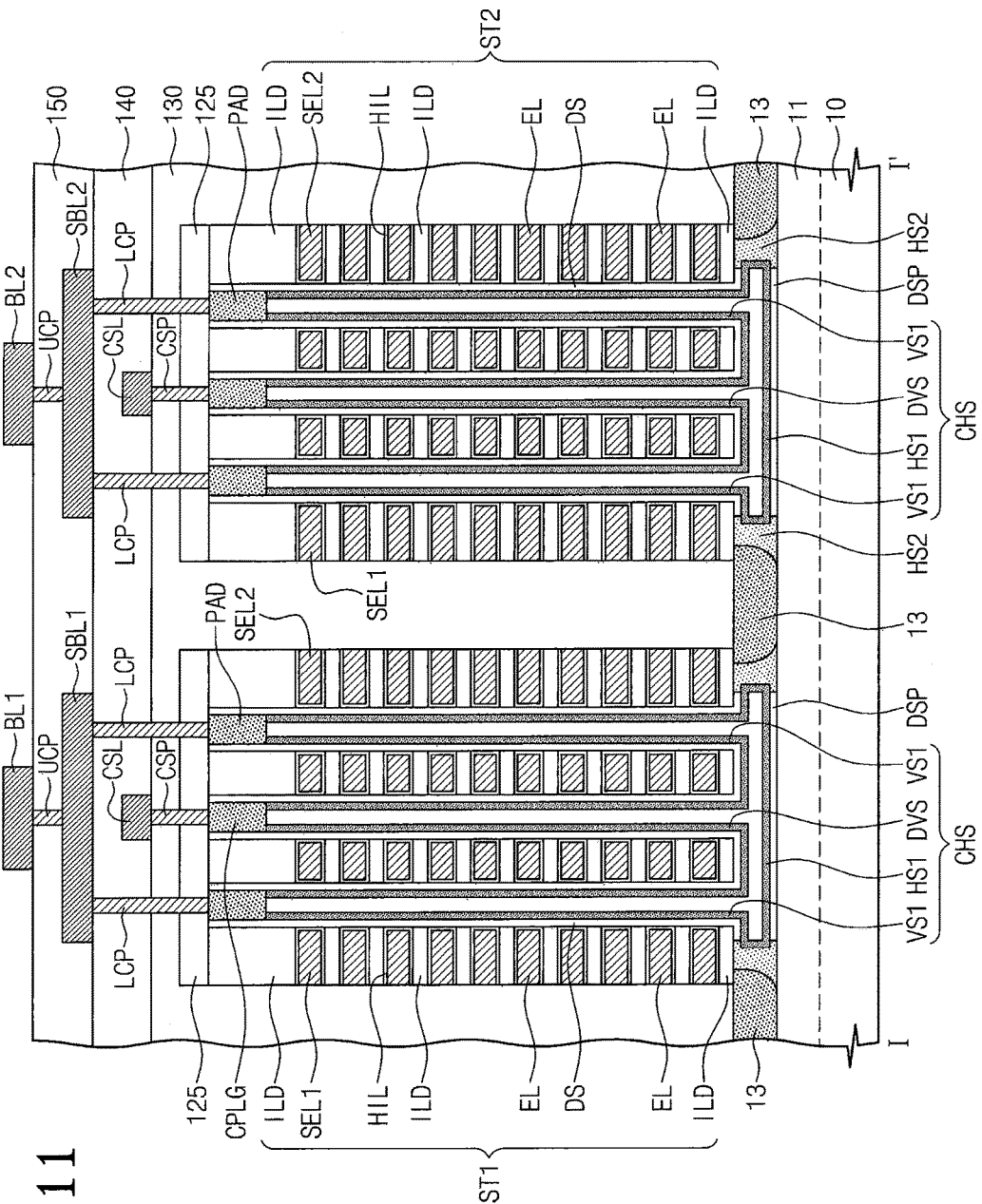
FIGS. 11, 12, 13, and 14 are cross-sectional views illustrating 3D semiconductor devices according to some embodiments of the inventive concepts.

Referring to FIG. 11, the first and second vertical channels VS1 and VS2 and the dummy vertical channels DVS may penetrate each of the first and second stack structures ST1 and ST2, and the first horizontal channel HS1 may be disposed under each of the first and second stack structures ST1 and ST2. The first horizontal channel HS1 may continuously extend from the vertical channels VS1, VS2, and DVS and may extend in parallel to each of the first and second stack structures ST1 and ST2 along the first direction D1. The second horizontal channels HS2 may be disposed at both sides of the first horizontal channel HS1. The second horizontal channels HS2 may extend in the first direction D1 and may be in contact with both sidewalls of the first horizontal channel HS1, respectively.

The conductive pads PAD may be respectively disposed on the first and second vertical channels VS1 and VS2, and the source plugs CPLG may be respectively disposed on the dummy vertical channels DVS. In some embodiments, the conductive pads PAD and the source plugs CPLG may have the second conductivity type opposite to the first conductivity type of the dopant region 13 of the second horizontal channel HS2.

In some embodiments, bottom surfaces of the source plugs CPLG connected to the dummy vertical channels DVS may be higher than the top surface of the uppermost electrode. For example, the bottom surfaces of the source plugs CPLG may be disposed at the same level as the bottom surfaces of the conductive pads PAD disposed on the top ends of the first and second vertical channels VS1 and VS2.

The source plugs CPLG may be electrically connected to the common source line CSL through the contact plugs CSP, and the conductive pads PAD may be electrically connected to the bit lines BL1 and BL2 through the lower and upper contact plugs LCP and UCP and the assistant interconnections SBL1 and SBL2.

Figure 12:
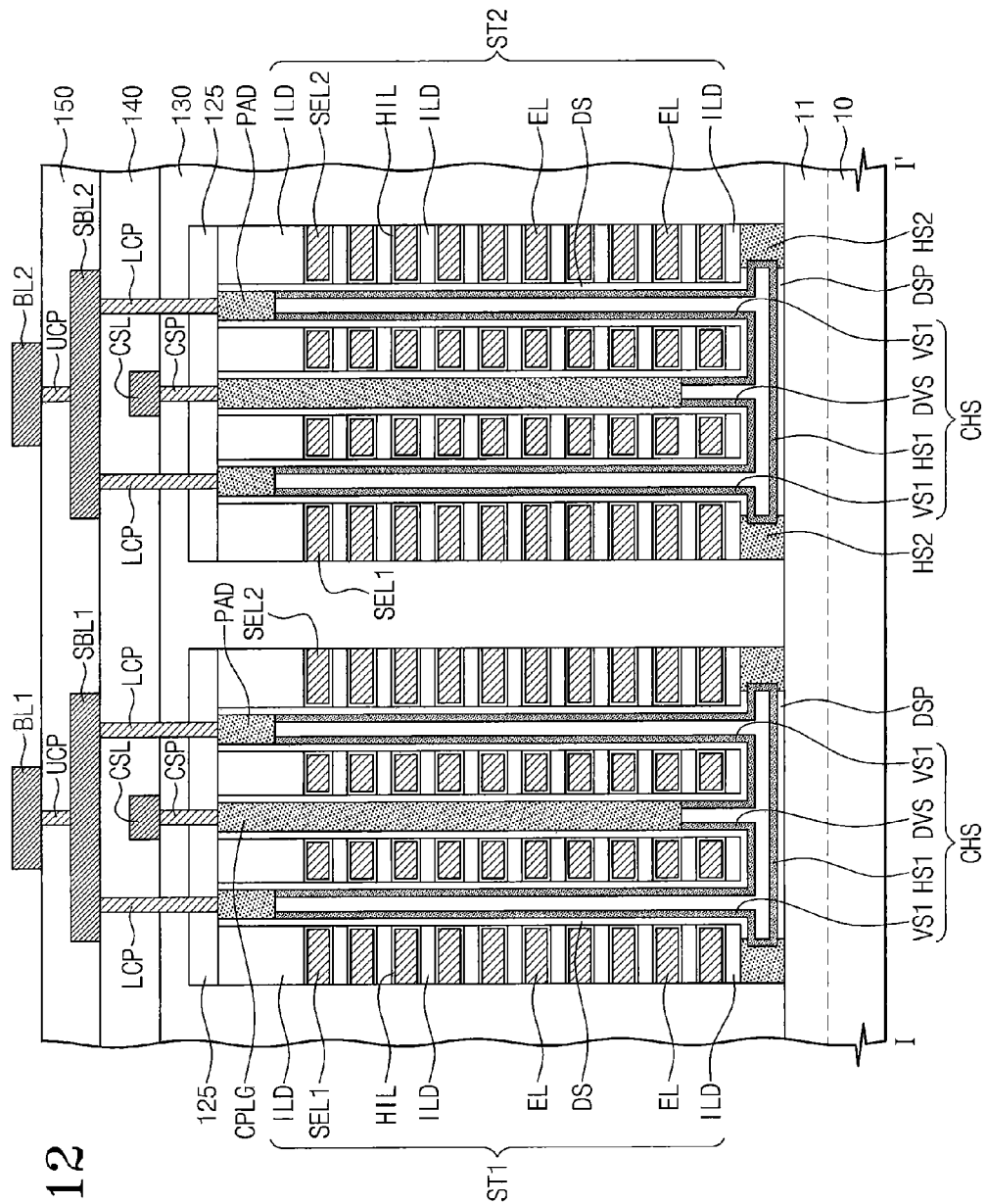

Referring to FIG. 12, the first and second stack structures ST1 and ST2 extending in the first direction D1 may be spaced apart from each other in the second direction D2 on the substrate 10. The first and second vertical channels VS1 and VS2 and the dummy vertical channels DVS may penetrate each of the first and second stack structures ST1 and ST2, and the first horizontal channel HS1 may be disposed under each of the first and second stack structures ST1 and ST2. The first horizontal channel HS1 may continuously extend from the vertical channels VS1, VS2, and DVS and may extend in parallel to each of the first and second stack structures ST1 and ST2 along the first direction D1.

Second horizontal channels HS2 may be disposed at both sides of the first horizontal channel HS1. The second horizontal channels HS2 may extend in the first direction D1 and may be in contact with both sidewalls of the first horizontal channel HS1, respectively. In some embodiments, the second horizontal channel HS2 disposed under an edge of the first stack structure ST1 adjacent the second stack structure ST2 may be separated from the second horizontal channel HS2 disposed under an edge of the second stack structure ST2 adjacent the first stack structure ST1. In other words, the filling insulation layer 130 disposed between the first and second stack structures ST1 and ST2 may penetrate the second horizontal channel HS2 so as to be in contact with the substrate 10, and the second horizontal channels HS2 may have sidewalls aligned with sidewalls of the first and second stack structures ST1 and ST2.

In some embodiments, the second horizontal channels HS2 may be doped with dopants of the first conductivity type, and the dopant concentration of the second horizontal channel HS2 may be higher than that of the first horizontal channel HS1. The dopant concentration of the first horizontal channel HS1 may be substantially equal to that of the well dopant layer 11.

Figure 13:
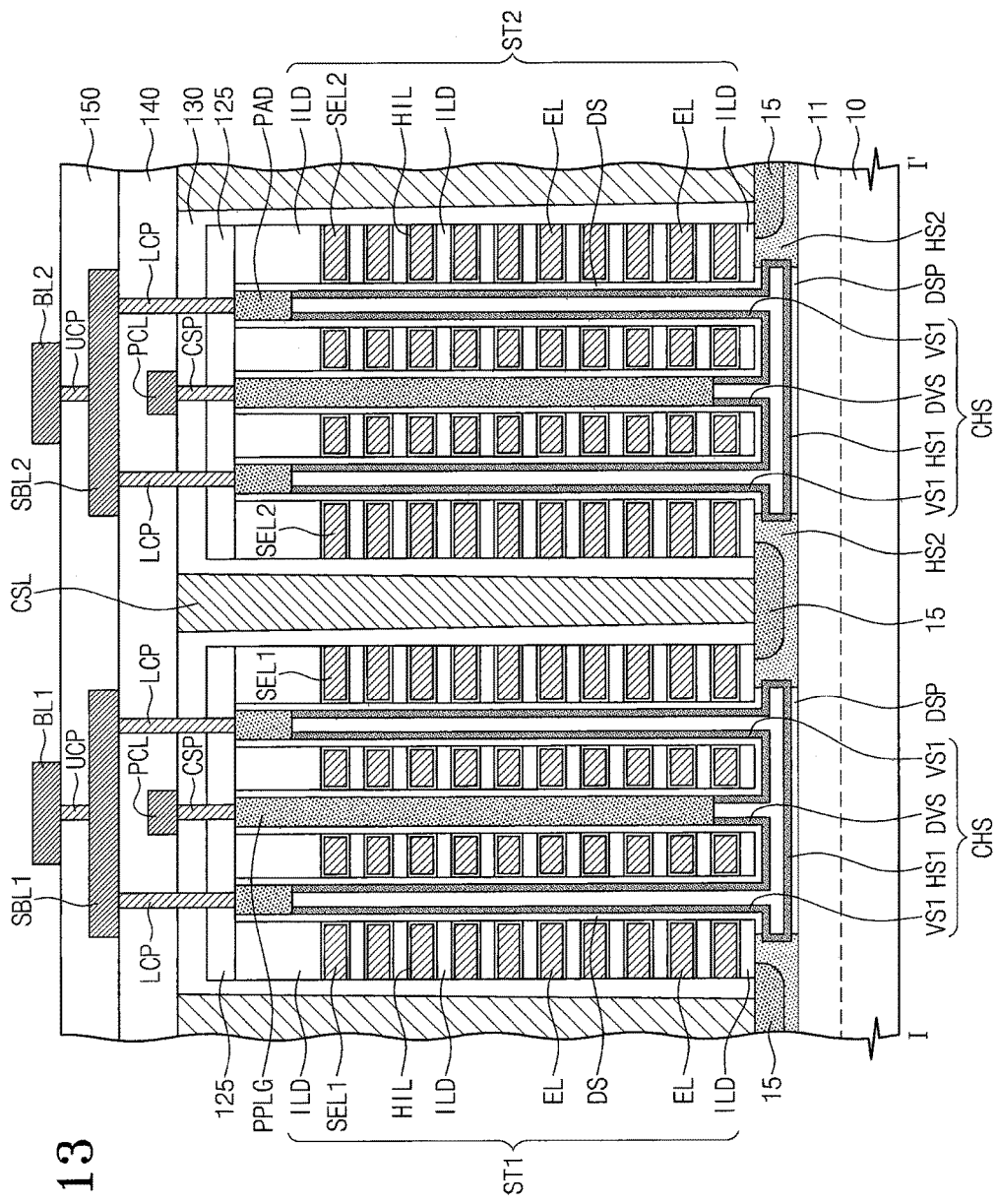

Referring to FIG. 13, the first and second stack structures ST1 and ST2 extending in the first direction D1 may be spaced apart from each other in the second direction D2 on the substrate 10. The first and second vertical channels VS1 and VS2 and the dummy vertical channels DVS may penetrate each of the first and second stack structures ST1 and ST2, and the first horizontal channel HS1 may be disposed under each of the first and second stack structures ST1 and ST2. The first horizontal channel HS1 may continuously extend from the vertical channels VS1, VS2, and DVS and may extend in parallel to each of the first and second stack structures ST1 and ST2 along the first direction D1. The second horizontal channels HS2 may be disposed at both sides of the first horizontal channel HS1. The second horizontal channels HS2 may extend in the first direction D1 and may be in contact with both sidewalls of the first horizontal channel HS1, respectively. The first and second vertical channels VS1 and VS2 may be continuously connected to the first horizontal channel HS1 without an interface therebetween, but an interface may be formed between the first horizontal channel HS1 and the second horizontal channel HS2 by semiconductor crystals.

In some embodiments, a common source region 15 may be disposed in each of the second horizontal channels HS2. The common source region 15 may have the second conductivity type opposite to the first conductivity type of the well dopant layer 11. The common source region 15 may extend in the first direction D1 between the first and second stack structures ST1 and ST2 when viewed from a plan view. The common source region 15 may be spaced apart from the well dopant layer 11.

In some embodiments, the conductive pads PAD may be disposed on the top ends of the first and second vertical channels VS1 and VS2, and pickup plugs PPLG may be disposed on the top ends of the dummy vertical channels DVS. The conductive pads PAD and the pickup plugs PPLG may be dopant regions doped with dopants or may be formed of a conductive material. In some embodiments, the pickup plugs PPLG may have the same conductivity type (i.e., the first conductivity type) as the well dopant layer 11, but the conductive pads PAD may have the second conductivity type opposite to the first conductivity type.

In some embodiments, a vertical length of the pickup plug PPLG may be longer than that of the conductive pad PAD. In other words, the bottom surface of the conductive pad PAD may be higher than the top surface of the uppermost electrode, and a bottom surface of the pickup plug PPLG may be lower than the bottom surface of the uppermost electrode. In certain embodiments, the bottom surfaces of the pickup plug PPLG and the conductive pad PAD may be higher than the top surface of the uppermost electrode.

In some embodiments, a well conductive line PCL may be disposed on the filling insulation layer 130 disposed on the each of the first and second stack structures ST1 and ST2 and may extend in the first direction D1. The well conductive line PCL may be connected to the pickup plugs PPLG arranged along the first direction D1 through contact plugs CSP. In the erase operation of the 3D semiconductor device, the erase voltage may be applied to the well conductive line PCL and the pickup plugs PPLG. The conductive pads PAD may be connected to the bit lines BL1 and BL2 through the upper and lower contact plugs LCP and UCP and the assistant interconnections SBL1 and SBL2.

In some embodiments, a common source line CSL may penetrate the filling insulation layer 130 between the first and second stack structures ST1 and ST2 so as to be connected to the common source region 15. In other words, a common source voltage may be applied to the common source line CSL and the common source region 15 in a program operation or the read operation of the 3D semiconductor device.

Figure 14:
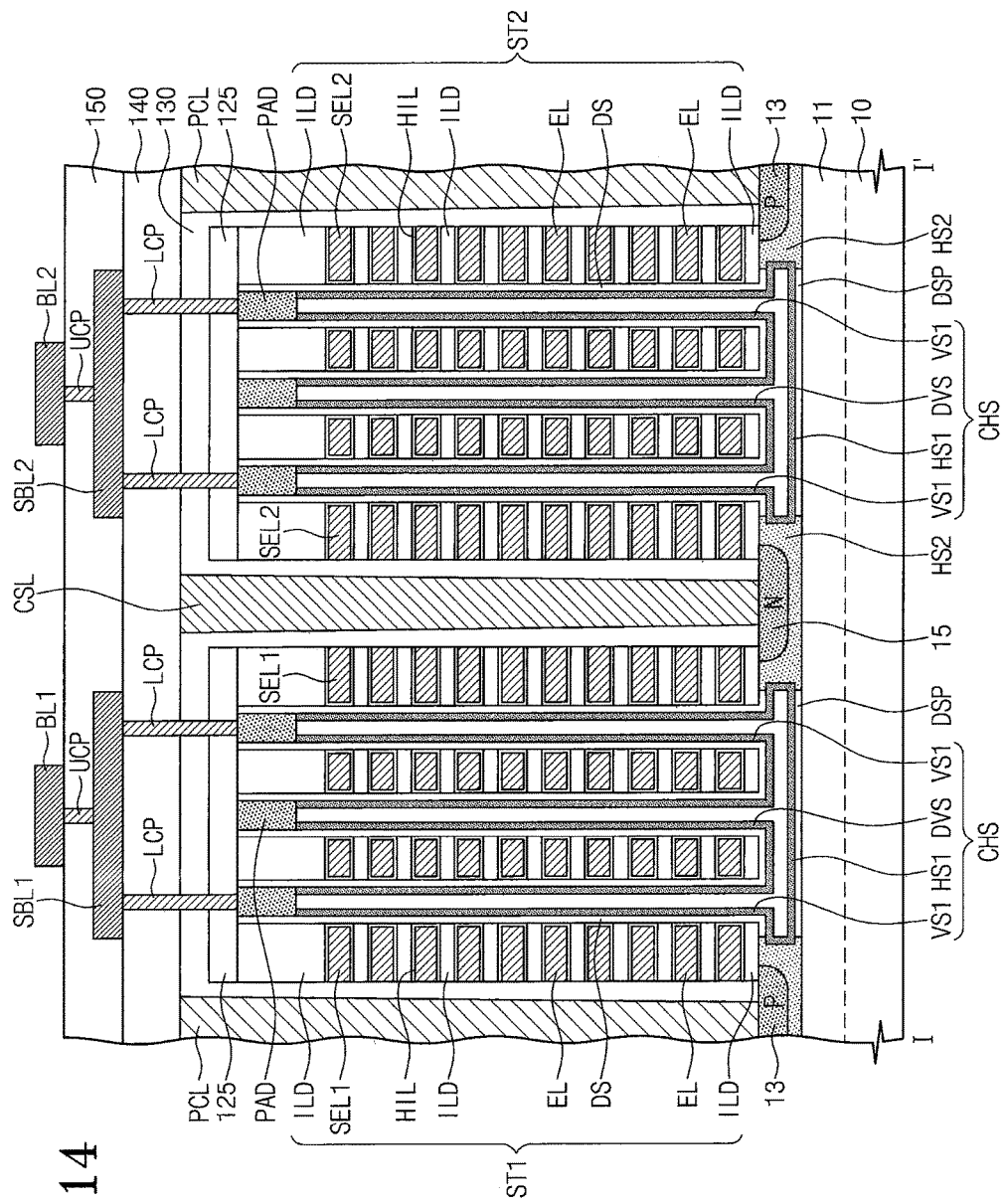

Referring to FIG. 14, the first and second stack structures ST1 and ST2 may extend in the first direction D1 on the substrate 10 and may be spaced apart from each other in the second direction D2. As described above, the one channel structure CHS may penetrate each of the first and second stack structures ST1 and ST2, and the second horizontal channels HS2 may be disposed at both sides of the first horizontal channel HS1.

In some embodiments, the conductive pads PAD may be disposed on the top ends of the first and second vertical channels VS1 and VS2 and the top ends of the dummy vertical channels DVS. The conductive pads PAD may be dopant regions doped with dopants and/or may be formed of a conductive material. In some embodiments, the conductive pads PAD may have the second conductivity type opposite to the first conductivity type.

In some embodiments, the common source region 15 may be disposed in the second horizontal channel HS2 disposed at one side of the first horizontal channel HS1, and a pickup dopant region 13 may be disposed in the second horizontal channel HS2 disposed at another side of the first horizontal channel HS1. The common source region 15 may be doped with dopants. Here, the common source region 15 may have the second conductivity type opposite to the first conductivity type of the well dopant layer 11, but the pickup dopant region 13 may have the same conductivity type (i.e., the first conductivity type) as the well dopant layer 11.

In some embodiments, the common source region 15 and the pickup dopant region 13 may extend in the first direction D1 and may be spaced apart from the well dopant layer 11. The first stack structure ST1 may have a first sidewall and a second sidewall opposite to each other. The common source region 15 may be disposed between the first stack structure ST1 and the second stack structure ST1 adjacent the first sidewall of the first stack structure ST1 in a plan view, and the pickup dopant region 13 may be disposed between the first stack structure ST1 and the second stack structure ST1 adjacent to the second sidewall of the first stack structure ST2 in a plan view.

In some embodiments, the common source line CSL may penetrate the filling insulation layer 130 between the first stack structure ST1 and the second stack structure ST2 adjacent the first sidewall of the first stack structure ST1 so as to be connected to the common source region 15. In the program or read operation of the 3D semiconductor device, the common source voltage may be applied to the common source line CSL and the common source region 15.

A well conductive line PCL may penetrate the filling insulation layer 130 between the first stack structure ST1 and the second stack structure ST2 adjacent the second sidewall of the first stack structure ST1 so as to be connected to the pickup dopant region 13. Thus, the erase voltage may be provided to the first and second horizontal channels HS1 and HS2 and the first and second vertical channels VS1 and VS2 through the well conductive line PCL and the pickup dopant region 13 in the erase operation of the 3D semiconductor device.

Figure 15:
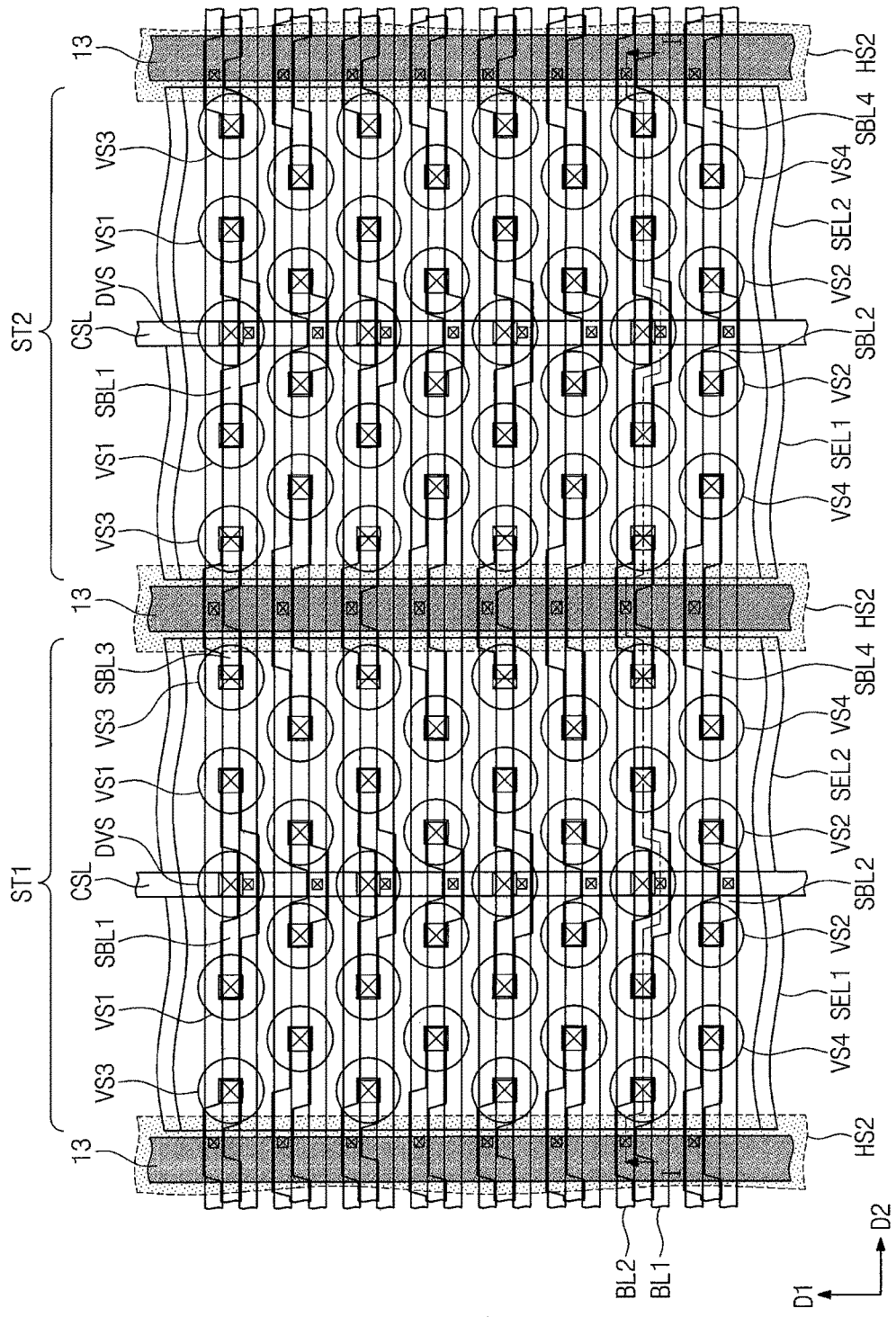
FIG. 15 is a plan view illustrating a 3D semiconductor device according to some embodiments of the inventive concepts.
Figure 16:
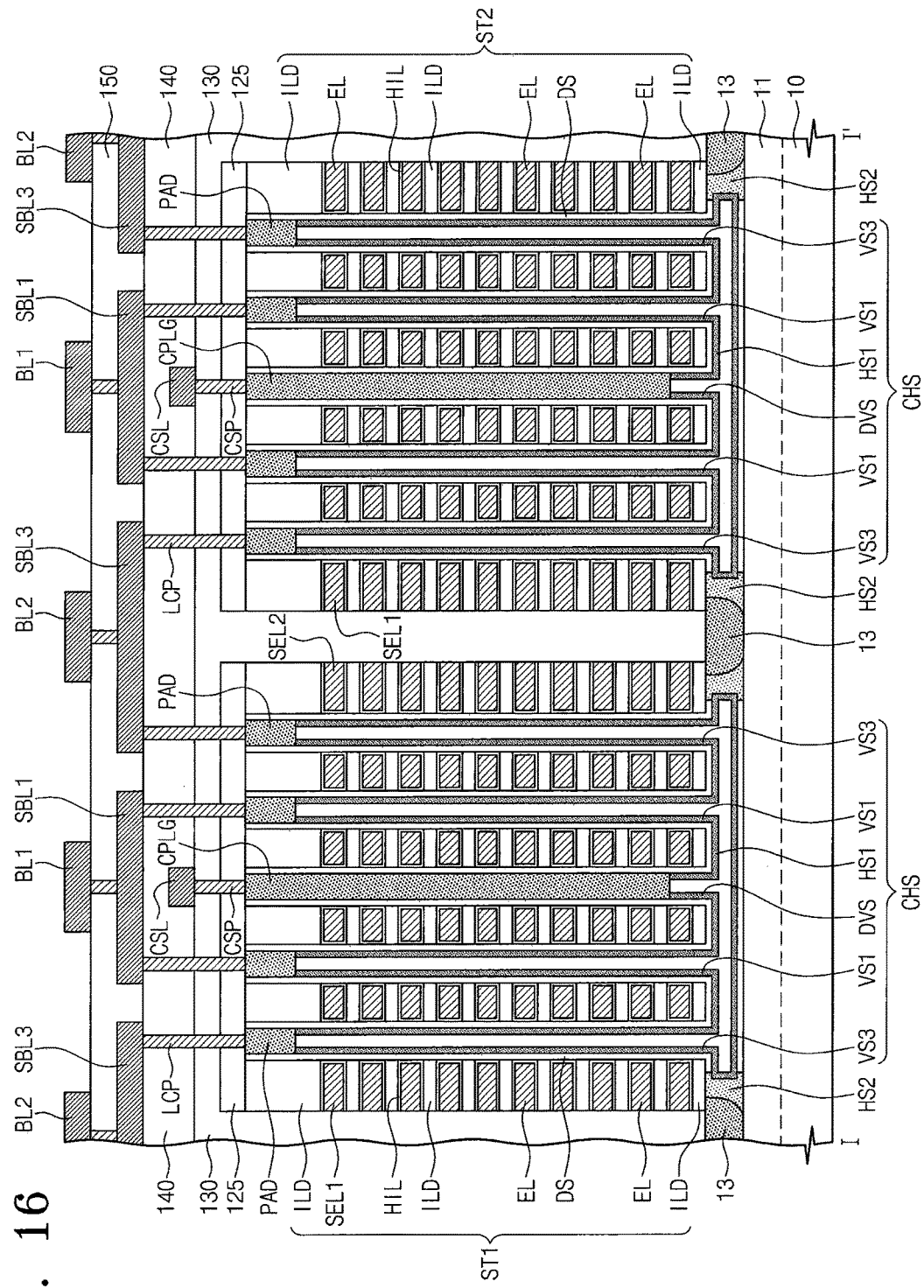
FIG. 16 is a cross-sectional view taken along a line I-I' of FIG. 15 to illustrate a 3D semiconductor device according to some embodiments of the inventive concepts.

FIG. 15 is a plan view illustrating a 3D semiconductor device according to some embodiments of the inventive concepts. FIG. 16 is a cross-sectional view taken along a line I-I' of FIG. 15 to illustrate a 3D semiconductor device according to some embodiments of the inventive concepts.

Referring to FIGS. 15 and 16, the first and second stack structures ST1 and ST2 may extend in the first direction D1 on the substrate 10 and may be spaced apart from each other in the second direction D2. Each of the first and second stack structures ST1 and ST2 may include electrodes EL vertically stacked on the substrate 10, and the uppermost electrode of each of the first and second stack structures ST1 and ST2 may be divided into the first string selection electrode SEL1 and the second string selection electrode SEL2 spaced apart from each other by the separation insulating pattern 115. The first and second string selection electrodes SEL1 and SEL2 may extend in the first direction D1.

One channel structure CHS may be provided in each of the first and second stack structures ST1 and ST2. The channel structure CHS may include a plurality of first to fourth vertical channels VS1, VS2, VS3, and VS4, dummy vertical channels DVS, and a first horizontal channel HS1.

The plurality of first to fourth vertical channels VS1, VS2, VS3, and VS4 and the dummy vertical channels DVS may penetrate each of the first and second stack structures ST1 and ST2. The dummy vertical channels DVS may be arranged along the first direction D1 between the first and second string selection electrodes SEL1 and SEL2. The first vertical channels VS1 may be arranged along the first direction D1 to constitute a first column, and the second vertical channels VS2 may be arranged along the first direction D2 to constitute a second column. The third vertical channels VS3 may be arranged along the first direction D1 to constitute a third column, and the fourth vertical channels VS4 may be arranged along the first direction D2 to constitute a fourth column.

The first to fourth vertical channels VS1 to VS4 penetrating the first string selection electrode SEL1 and the fourth to fourth vertical channels VS1 to VS4 penetrating the second string selection electrode SEL2 may be arranged in mirror symmetry with respect to the dummy vertical channels DVS. The first and third vertical channels VS1 and VS3 may be aligned with the second and fourth vertical channels VS2 and VS4 in a direction diagonal to the second direction D2, respectively.

The first to fourth vertical channels VS1 to VS4 and the dummy vertical channels DVS may have hollow pipe, tube and/or macaroni shapes. In some embodiments, the first to fourth vertical channels VS1 to VS4 and the dummy vertical channels DVS may have cylindrical shapes.

The first horizontal channel HS1 may be disposed under each of the first and second stack structures ST1 and ST2 and may continuously extend from the first to fourth vertical channels VS1, VS2, VS3, and VS4 and the dummy vertical channels DVS. In other words, the first to fourth vertical channels VS1, VS2, VS3, and VS4, the dummy vertical channels DVS, and the first horizontal channel HS1 may constitute one semiconductor layer that continuously extends to have a pipe shape in one body.

The first horizontal channel HS1 may extend in parallel to the first and second stack structures ST1 and ST2 and may have rounded sidewalls, as described with reference to FIG. 4B. In addition, a width of the first horizontal channel HS1 may be smaller than that of each of the first and second stack structures ST1 and ST2. The second horizontal channels HS2 may be disposed at both sides of the first horizontal channel HS1. The second horizontal channels HS2 may extend in the first direction D1 and may be in contact with the sidewalls of the first horizontal channel HS1. The first to fourth vertical channels VS1, VS2, VS3, and VS4 may be continuously connected to the first horizontal channel HS1 without an interface therebetween. An interface may be formed between the first horizontal channel HS1 and the second horizontal channel HS2 by semiconductor crystals.

The second horizontal channel HS2 may have the same conductivity type (i.e., the first conductivity type) as the well dopant layer 11. The second horizontal channel HS2 may have the dopant region 13, which is disposed between the first and second stack structures ST1 and ST2 when viewed from a plan view. The dopant region 13 may have the first conductivity type, and the dopant concentration of the dopant region 13 may be higher than that of the second horizontal channel HS2.

The conductive pads PAD may be disposed on top ends of the first to fourth vertical channels VS1, VS2, VS3, and VS4, respectively, and the source plugs CPLG may be disposed on the top ends of the dummy vertical channels DVS, respectively. The vertical length of the source plug CPLG may be longer than that of the conductive pad PAD. In other words, the bottom surfaces of the conductive pads PAD may be higher than the top surface of the uppermost electrode, and the bottom surfaces of the source plugs CPLG may be lower than the bottom surface of the uppermost electrode. For example, the source plug CPLG may vertically extend toward the substrate 10 such that the bottom surface of the source plug CPLG is adjacent the first horizontal channel HS1.

The conductive pads PAD and the source plugs CPLG may be dopant regions doped with dopants or may be formed of a conductive material. In some embodiments, the conductive pads PAD and the source plugs CPLG may have the second conductivity type opposite to the first conductivity type of the dopant region 13 and the well dopant layer 11. In some embodiments, as described with reference to FIG. 13, the pickup plug PPL1 having the first conductivity type may be disposed on the top end of the dummy vertical channel DVS, and the common source region 15 having the second conductivity type may be disposed in the second horizontal channel HS2.

The common source line CSL may be disposed on the filling insulation layer 130 covering the first and second stack structures ST1 and ST2. The common source line CSL may be connected to the source plugs CPLG through the contact plugs CSP. The common source line CSL may be disposed on each of the first and second stack structures ST1 and ST2 and may be electrically connected in common to the dummy vertical channels arranged along the first direction D1.

The first insulating layer 140 may be disposed on the filling insulating layer 130 to cover the common source lines CSL, and the first to fourth assistant interconnections SBL1, SBL2, SBL3, and SBL4 may be disposed on the first insulating layer 140.

In some embodiments, each of the first assistant interconnections SBL1 may be connected to the first vertical channels VS1 adjacent one another in the second direction D2 through lower contact plugs LCP. Each of the second assistant interconnections SBL2 may be connected to the second vertical channels VS2 adjacent one another in the second direction D2 through lower contact plugs LCP. In some embodiments, lengths of the second assistant interconnections SBL2 may be shorter than those of the first assistant interconnections SBL1.

Each of the third assistant interconnections SBL3 may be connected to the third vertical channels VS3 adjacent one another in the second direction D2 through lower contact plugs LCP. Each of the fourth assistant interconnections SBL4 may be connected to the fourth vertical channels VS4 adjacent one another in the second direction D2 through lower contact plugs LCP. In some embodiments, lengths of the fourth assistant interconnections SBL4 may be shorter than those of the third assistant interconnections SBL3.

The first and second assistant interconnections SBL1 and SBL2 may intersect the common source line CSL on each of the first and second stack structures ST1 and ST2, and the third and fourth assistant interconnections SBL3 and SBL4 may intersect the dopant region 13.

The second insulating layer 150 may be disposed on the first insulating layer and the first to fourth assistant interconnections SBL1 to SBL4, and the first and second bit lines BL1 and BL2 may be disposed on the second insulating layer 150. The first and second bit lines BL1 and BL2 may extend in the second direction D2 and may be alternately arranged in the first direction D1.

Each of the first bit lines BL1 may be connected to the first assistant interconnections SBL1 or the second assistant interconnections SBL2 through upper contact plugs UCP. Each of the second bit lines BL2 may be connected to the third assistant interconnections SBL3 or the fourth assistant interconnections SBL4 through upper contact plugs UCP.

In the embodiment of FIGS. 15 and 16, the first to fourth vertical channels VS1 to VS4 may be connected in common to the common source line CSL through the first horizontal channel HS1 and the dummy vertical channels DVS during the read operation. In the erase operation, the first to fourth vertical channels VS1 to VS4 may be connected to the second horizontal channel HS2, supplied with the erase voltage, through the first horizontal channel HS1.

Figure 17:
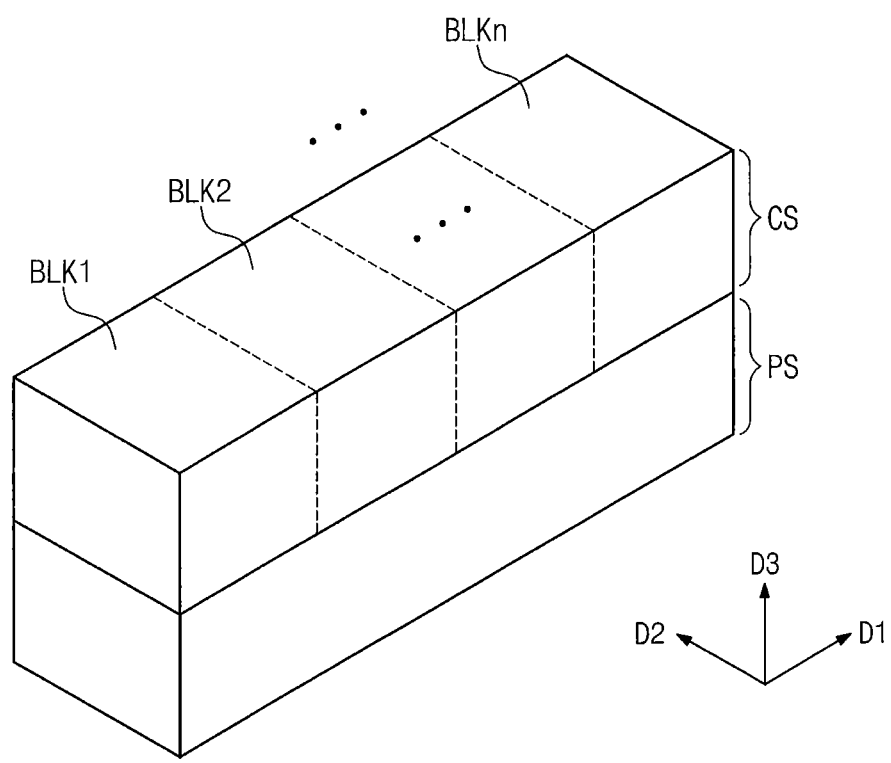
FIG. 17 is a schematic block diagram illustrating a 3D semiconductor device according to some embodiments of the inventive concepts.

FIG. 17 is a schematic block diagram illustrating a 3D semiconductor device according to some embodiments of the inventive concepts.

Referring to FIG. 17, a 3D semiconductor device according to some embodiments may include a peripheral logic structure PS and a cell array structure CS stacked on the peripheral logic structure PS. In other words, the peripheral logic structure PS and the cell array structure CS may overlap with each other when viewed from a plan view.

In some embodiments, the peripheral logic structure PS may include the row and column decoders 2 and 4, the page buffer 3, and the control circuit 5, which are described with reference to FIG. 1. The cell array structure CS may include a plurality of memory blocks BLK0 to BLKn of which each corresponds to a data erase unit. Each of the memory blocks BLK0 to BLKn may include a structure that is stacked on a plane, defined by first and second directions D1 and D2, along a third direction D3. Each of the memory blocks BLK0 to BLKn may include a memory cell array having a three-dimensional structure (or a vertical structure). The memory cell array may include the three-dimensionally arranged memory cells, the word lines, and the bit lines, which are described with reference to FIG. 2.

Figure 18:
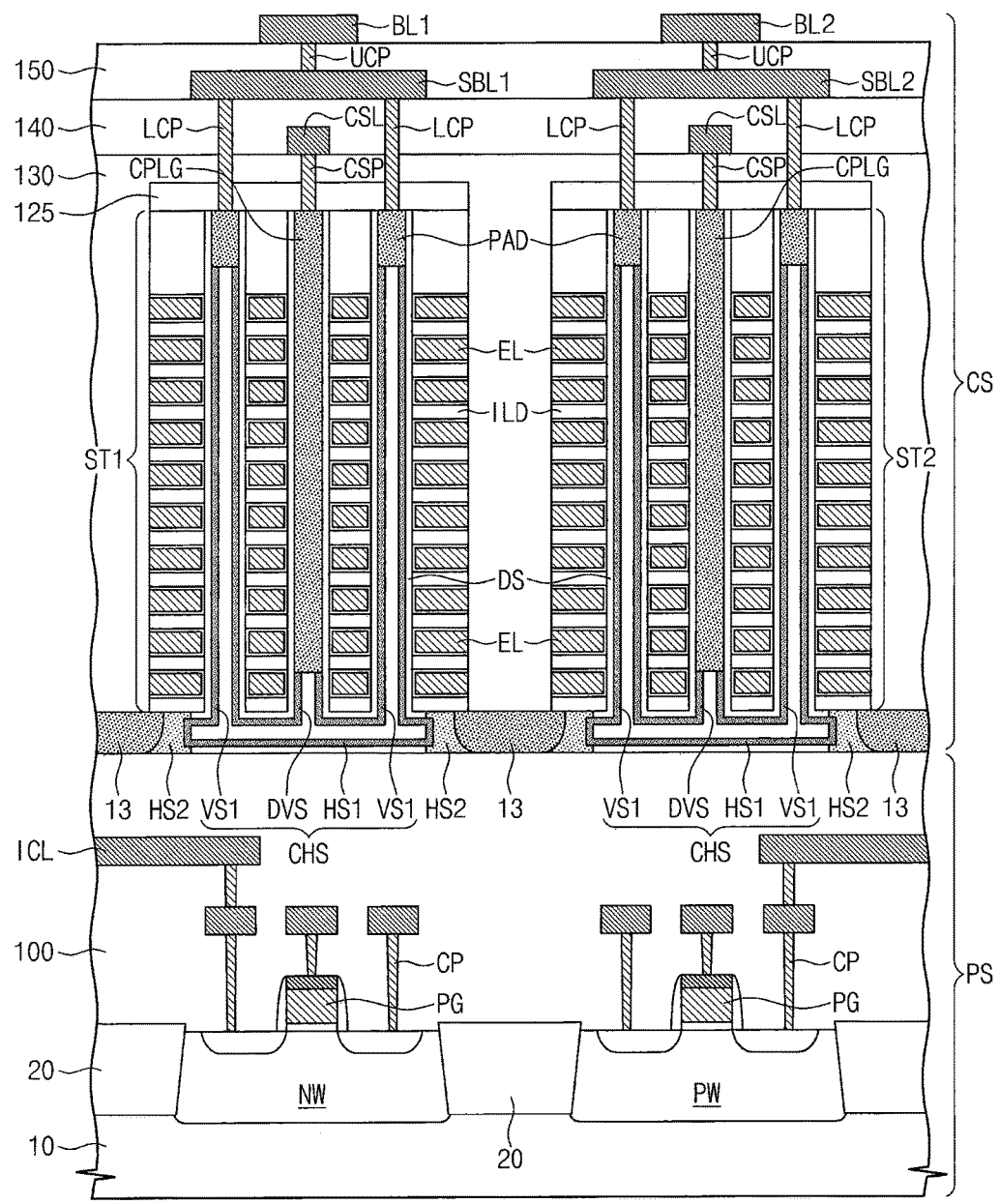
FIG. 18 is a cross-sectional view illustrating a 3D semiconductor device according to some embodiments of the inventive concepts.

FIG. 18 is a cross-sectional view illustrating a 3D semiconductor device according to some embodiments of the inventive concepts. Hereinafter, the descriptions to the same technical features as in the embodiment of FIGS. 3, 4A, 4B, 5, and 6 will be omitted or mentioned briefly for the purpose of ease and convenience in explanation.

Referring to FIG. 18, a peripheral logic structure PS and a cell array structure CS may be sequentially stacked on a semiconductor substrate 10. In other words, the peripheral logic structure PS may be disposed between the semiconductor substrate 10 and the cell array structure CS when viewed from a cross-sectional view. That is, the peripheral logic structure PS may overlap with the cell array structure CS when viewed from a plan view.

The semiconductor substrate 10 may be a bulk silicon substrate, a silicon-on-insulator (SOI) substrate, a germanium substrate, a germanium-on-insulator (GOI) substrate, a silicon-germanium substrate, and/or a substrate including an epitaxial layer obtained by performing a selective epitaxial growth (SEG) process.

The peripheral logic structure PS may include peripheral circuits including the row and column decoders 2 and 4 of FIG. 1, the page buffer 3 of FIG. 1, and the control circuit 5 of FIG. 1. In other words, the peripheral logic structure PS may include NMOS and PMOS transistors, a resistor, and a capacitor, which constitute the peripheral circuits and are electrically connected to the cell array structure CS. These peripheral circuits may be formed on an entire top surface of the semiconductor substrate 10. The semiconductor substrate 10 may include an N-well region NW doped with N-type dopants and a P-well region PW doped with P-type dopants. Active regions may be defined in the N-well region NW and the P-well region PW by a device isolation layer 20.

The peripheral logic structure PS may include peripheral gate electrodes PG, source and drain dopant regions disposed in the active region at both sides of each of the peripheral gate electrodes PG, peripheral contact plugs CP, peripheral circuit interconnections ICL, and a lower filling insulation layer 100 covering the peripheral circuits. The PMOS transistor may be formed on the N-well region NW, and the NMOS transistor may be formed on the P-well region PW. The peripheral circuit interconnections ICL may be electrically connected to the peripheral circuits through the peripheral contact plugs CP. In some embodiments, the peripheral contact plugs CP and the peripheral circuit interconnections ICL may be connected to the NMOS and PMOS transistors.

The lower filling insulation layer 100 may cover the peripheral circuits, the peripheral contact plugs CP, and the peripheral circuit interconnections ICL. The lower filling insulation layer 100 may include a plurality of stacked insulating layers.

The cell array structure CS may include the first and second stack structures ST1 and ST2 which extend in the first direction D1 and spaced apart from each other in the second direction D2 on the lower filling insulation layer 100. Each of the first and second stack structures ST1 and ST2 may include a plurality of electrodes EL vertically stacked on the lower filling insulation layer 100. In some embodiments, one channel structure CHS may be provided in each of the first and second stack structures ST1 and ST2. The channel structure CHS may include the first and second vertical channels VS1 and VS2, the dummy vertical channels DVS, and the first horizontal channel HS1.

The first and second vertical channels VS1 and VS2 and the dummy vertical channels DVS may penetrate each of the first and second stack structures ST1 and ST2, and the first horizontal channel HS1 may be disposed under each of the first and second stack structures ST1 and ST2. The first horizontal channel HS1 may continuously extend from the first and second vertical channels VS1 and VS2 and the dummy vertical channels DVS and may extend in parallel to each of the first and second stack structures ST1 and ST2, as described with reference to FIGS. 4A and 4B. The first horizontal channel HS1 may overlap with each of the first and second stack structures ST1 and ST2 when viewed from a plan view. The width of the first horizontal channel HS1 may be smaller than that of each of the first and second stack structures ST1 and ST2. In addition, the first horizontal channel HS1 may have the rounded sidewalls, as described with reference to FIG. 4B.

The second horizontal channels HS2 may be disposed at both sides of the first horizontal channel HS1. The second horizontal channels HS2 may extend in the first direction D1 and may be in contact with the sidewalls of the first horizontal channel HS1. The first and second vertical channels VS1 and VS2 may be continuously connected to the first horizontal channel HS1 without an interface therebetween, but an interface may be formed between the first horizontal channel HS1 and the second horizontal channel HS2 by semiconductor crystals.

In some embodiments, the second horizontal channel HS2 may be in direct contact with the lower filling insulation layer 100, and the dopant region having the first conductivity type may be disposed in the second horizontal channel HS2.

The data storage layer DS may be disposed between each of the first and second stack structures ST1 and ST2 and the vertical channels VS1, VS2, and DVS. The data storage layer DS may extend onto the bottom surface of the lowermost insulating layer ILD of each of the first and second stack structures ST1 and ST2. In some embodiments, the residual data storage pattern may be vertically spaced apart from the data storage layer DS and may be disposed between the first horizontal channel HS1 and the lower filling insulation layer 100.

The conductive pads PAD may be disposed on the top ends of the first and second vertical channels VS1 and VS2, and the source plugs CPLG may be disposed on the top ends of the dummy vertical channels DVS. In some embodiments, when the conductive pads PAD and the source plugs CPLG are dopant regions doped with dopants, the conductive pads PAD and the source plugs CPLG may have the second conductivity type opposite to the first conductivity type of the dopant region 13.

The capping insulating pattern 125 may be disposed on each of the first and second stack structures ST1 and ST2 to cover the top surfaces of the conductive pads PAD and the top surfaces of the source plugs CPLG.

An upper filling insulation layer 130 may be disposed on an entire top surface of the lower filling insulation layer 100 to cover the first and second stack structures ST1 and ST2 and may completely fill a space between the first and second stack structures ST1 and ST2. In some embodiments, the upper filling insulation layer 130 may be in contact with the top surface of the dopant region 13.

The common source line CSL may be disposed on the upper filling insulation layer 130. The common source line CSL may be electrically connected to the source plugs CPLG through the contact plugs CSP. The common source line CSL may be disposed on each of the first and second stack structures ST1 and ST2 and may be electrically connected in common to the dummy vertical channels DVS arranged along the first direction D1.

The first insulating layer 140 may be disposed on the upper filling insulation layer 130 to cover the common source lines CSL, and the first to fourth assistant interconnections SBL1 to SBL4 may be disposed on the first insulating layer 140. The first and third assistant interconnections SBL1 and SBL3 may be disposed on the first stack structure ST1, and the second and fourth assistant interconnections SBL1 and SBL4 may be disposed on the second stack structure ST2. The first and third assistant interconnections SBL1 and SBL3 may intersect the common source line CSL disposed on the first stack structure ST1, and the second and fourth assistant interconnections SBL2 and SBL4 may intersect the common source line CSL disposed on the second stack structure ST2.

The second insulating layer 150 may be disposed on the first insulating layer 140 to cover the first to fourth assistant interconnections SBL1 to SBL4, and the first and second bit lines BL1 and BL2 may be disposed on the second insulating layer 150. The first and second bit lines BL1 and BL2 may extend in the second direction D2 and may be alternately arranged in the first direction D1.

The first bit lines BL1 may be connected to the first assistant interconnections SBL1 and the third assistant interconnections SBL3 through upper contact plugs UCP, and the second bit lines BL2 may be connected to the second assistant interconnections SBL2 and the fourth assistant interconnections SBL4 through upper contact plugs UCP.

FIGS. 19 to 29 are cross-sectional views taken along the line I-I' of FIG. 4A to illustrate methods of manufacturing a 3D semiconductor device according to some embodiments of the inventive concepts. FIGS. 30 to 35 are enlarged views of portions 'A' of FIGS. 21 to 26, respectively, to illustrate a method of manufacturing a 3D semiconductor device according to some embodiments of the inventive concepts.

Figure 19:
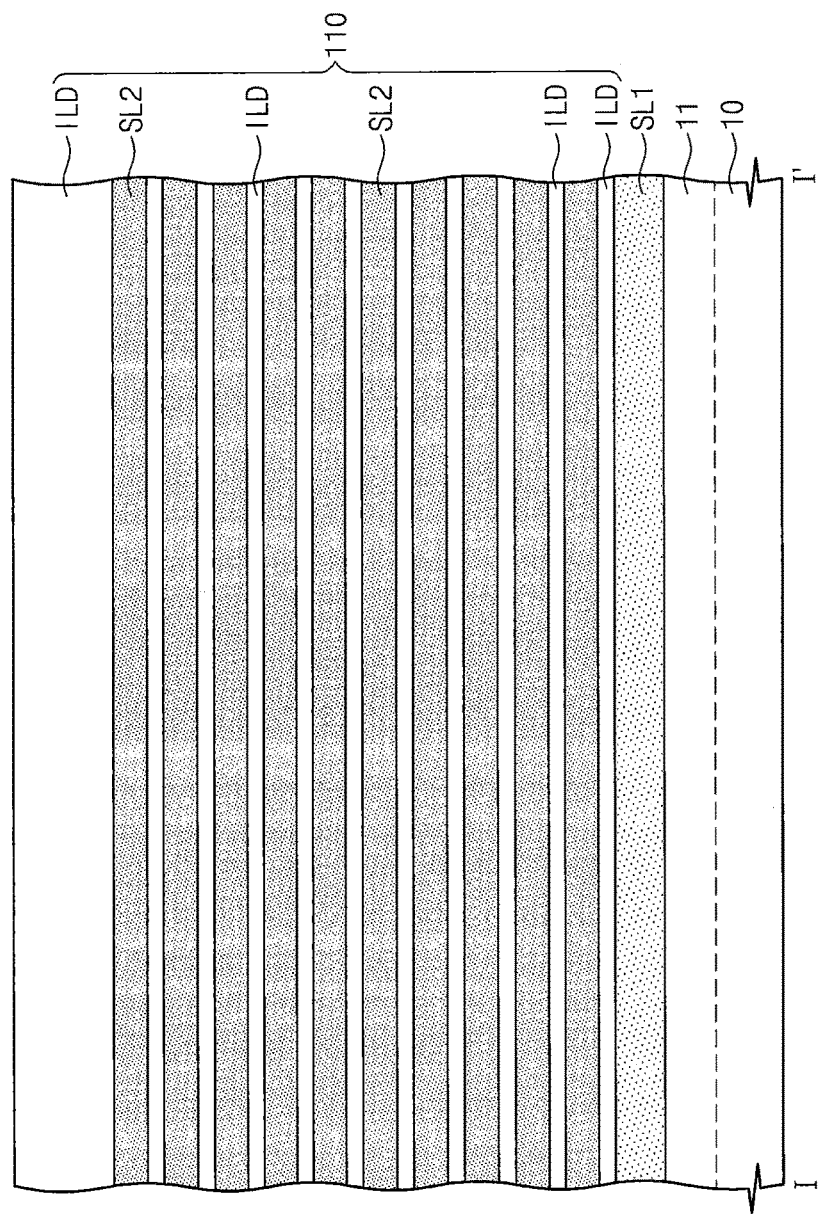
FIGS. 19 to 29 are cross-sectional views taken along the line I-I' of FIG. 4A to illustrate methods of manufacturing a 3D semiconductor device according to some embodiments of the inventive concepts.

Referring to FIGS. 4A and 19, a first sacrificial layer SL1 may be formed on a substrate 10. Insulating layers ILD and second sacrificial layers SL2 may be alternately and repeatedly formed on the first sacrificial layer SL1 to form a thin layer structure 110.

In some embodiments, the substrate 10 may be formed of a semiconductor material. For example, the substrate 10 may be a bulk silicon substrate, a SOI substrate, a germanium substrate, a GOI substrate, a silicon-germanium substrate, and/or a substrate including an epitaxial layer obtained by performing a SEG process. In some embodiments, the substrate 10 may include a well dopant layer 11 doped with dopants of a first conductivity type, and the first sacrificial layer SL1 may be formed on a top surface of the well dopant layer 11.

In some embodiments, the substrate 10 may be formed of an insulating material. In some embodiments, the substrate 10 may include a single layer or a plurality of thin layers. For example, the substrate 10 may be formed of at least one of a silicon oxide layer, a silicon nitride layer, or a low-k dielectric layer. In this case, the first sacrificial layer SL1 may be formed on a top surface of the substrate 10.

The first sacrificial layer SL1 may be formed of a material having an etch selectivity with respect to the insulating layers ILD and the second sacrificial layers SL2. For example, the first sacrificial layer SL1 may include at least one of a silicon oxide layer, a silicon carbide layer, a silicon-germanium layer, a silicon oxynitride layer, and/or a silicon nitride layer.

In the thin layer structure 110, the second sacrificial layers SL2 may be formed of a material having an etch selectivity with respect to the insulating layers ILD. For example, a difference between an etch rate of the second sacrificial layers SL2 and an etch rate of the insulating layers ILD may be great in a wet etching process using a chemical solution, but a difference between an etch rate of the second sacrificial layers SL2 and an etch rate of the insulating layers ILD may be small in a dry etching process using an etching gas.

In some embodiments, the second sacrificial layers SL2 and the insulating layers ILD may be formed of insulating materials, and the second sacrificial layers SL2 may have an etch selectivity with respect to the insulating layers ILD. For example, the second sacrificial layers SL2 may include at least one of a silicon layer, a silicon oxide layer, a silicon carbide layer, a silicon-germanium layer, a silicon oxynitride layer, and/or a silicon nitride layer. At this time, the second sacrificial layers SL2 may include a different material from the first sacrificial layer SL1. The insulating layers ILD may include at least one of a silicon layer, a silicon oxide layer, a silicon carbide layer, a silicon oxynitride layer, and/or a silicon nitride layer. At this time, the insulating layers ILD may include a different material from the first and second sacrificial layers SL1 and SL2.

For example, the first sacrificial layer SL1 may be formed of a poly-silicon layer, the second sacrificial layers SL2 may be formed of silicon nitride layers, and the insulating layers ILD may be formed of low-k dielectric layers. In some embodiments, the second sacrificial layers SL2 may be formed of a conductive material, and the insulating layers ILD may be formed of an insulating material.

Each of the layers SL1, SL2, and IDL may be deposited using a thermal chemical vapor deposition (thermal CVD) technique, a plasma-enhanced CVD technique, a physical CVD technique, and/or an atomic layer deposition (ALD) technique.

In some embodiments, the second sacrificial layers SL2 may have the same thickness, and the first sacrificial layer SL1 may be thicker than the second sacrificial layers SL2. In some embodiments, the first sacrificial layer SL1 may be thinner than the second sacrificial layers SL2. In certain embodiments, the lowermost one and the uppermost one of the second sacrificial layers SL2 may be thicker than other second sacrificial layers SL2 disposed therebetween. In some embodiments, the insulating layers ILD may have the same thickness, or one or some of the insulating layers ILD may have a different thickness from another or others of the insulating layers ILD.

Figure 20:
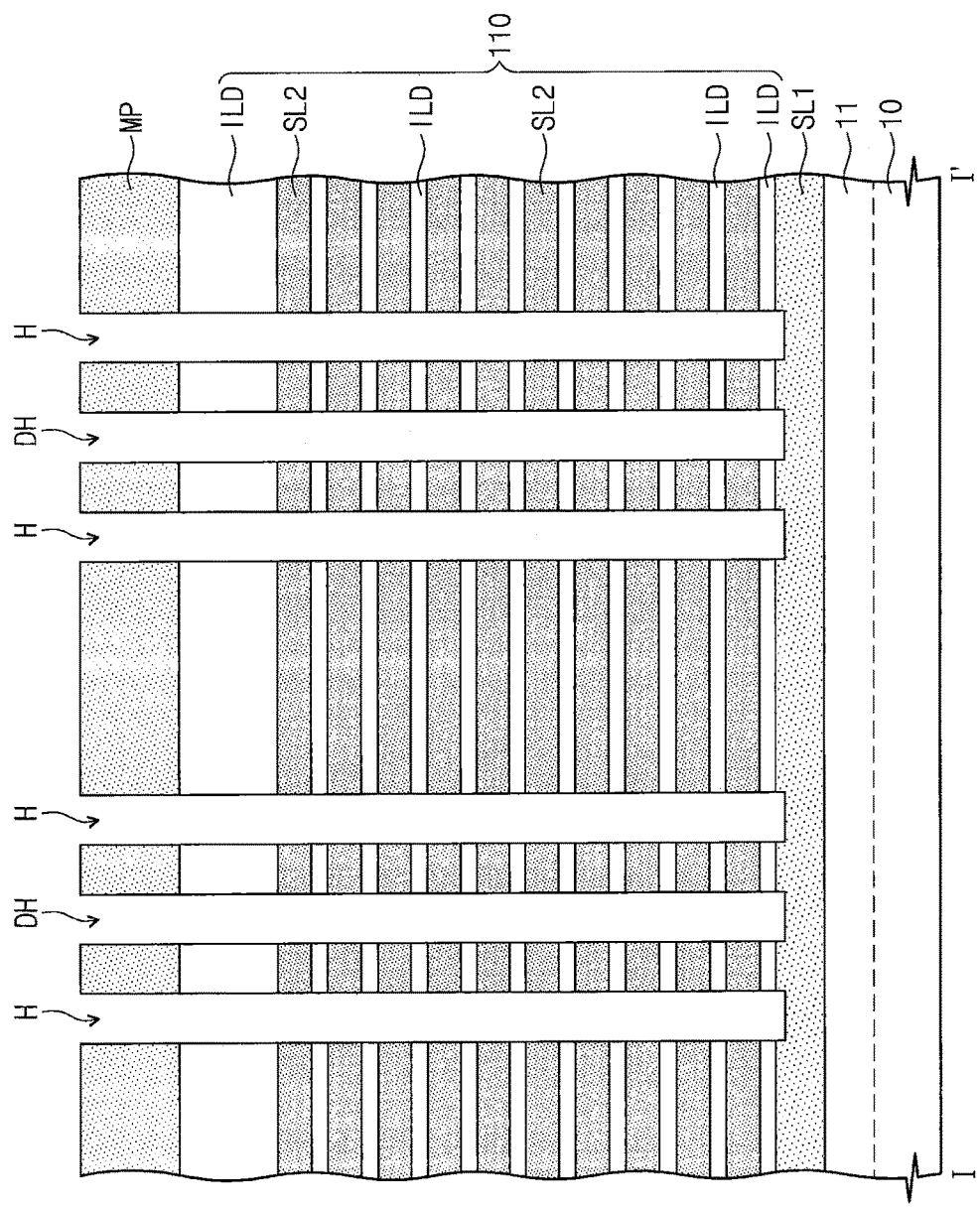

Referring to FIGS. 4A and 20, vertical holes H and DH may be formed to penetrate the thin layer structure 110. The vertical holes H and DH may expose a top surface of the first sacrificial layer SL1.

A mask pattern MP may be formed on the thin layer structure 110, and the thin layer structure 110 may be anisotropically etched using the mask pattern MP as an etch mask to form the vertical holes H and DH. In the anisotropic etching process, the top surface of the first sacrificial layer SL1 may be over-etched such that the first sacrificial layer SL1 exposed through the vertical holes H and DH may be recessed by a predetermined depth. In some embodiments, a width of a lower portion of each of the vertical holes H and DH may be smaller than that of an upper portion of each of the vertical holes H and DH. In some embodiments, the vertical holes H and DH may be arranged in a matrix form along the first and second directions D1 and D2 when viewed from a plan view. In certain embodiments, the vertical holes H and DH constituting two columns which are adjacent one another and are parallel to the first direction D1 may be arranged in a zigzag form along the first direction D1 when viewed from a plan view.

In some embodiments, the vertical holes H and DH may include first and second vertical holes H and dummy vertical holes DH. The first and second vertical holes H may correspond to the first and second vertical channels VS1 and VS2 described with reference to FIG. 4A, and the dummy vertical holes DH may correspond to the dummy vertical channels DVS described with reference to FIG. 4A.

Figure 21:
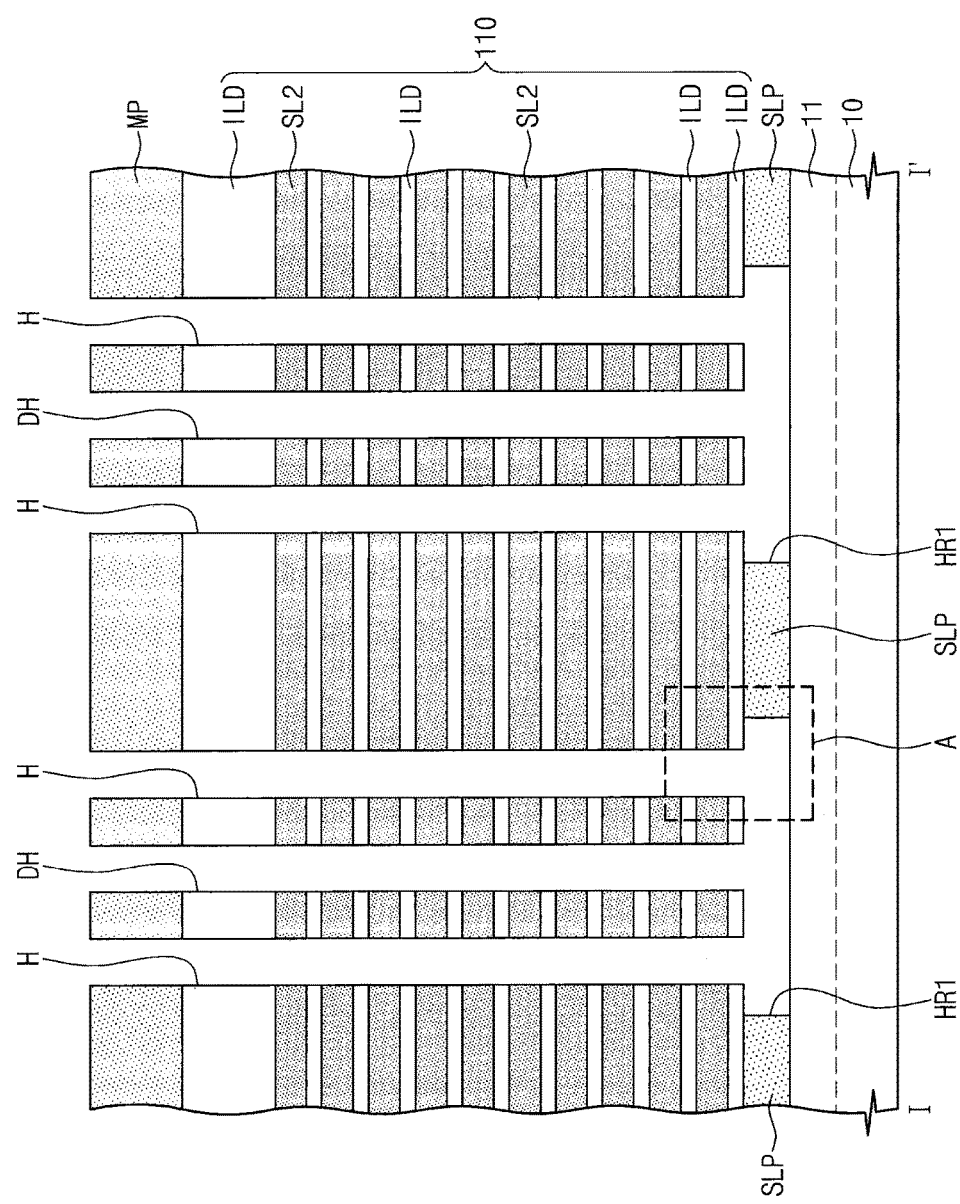
Figure 30:
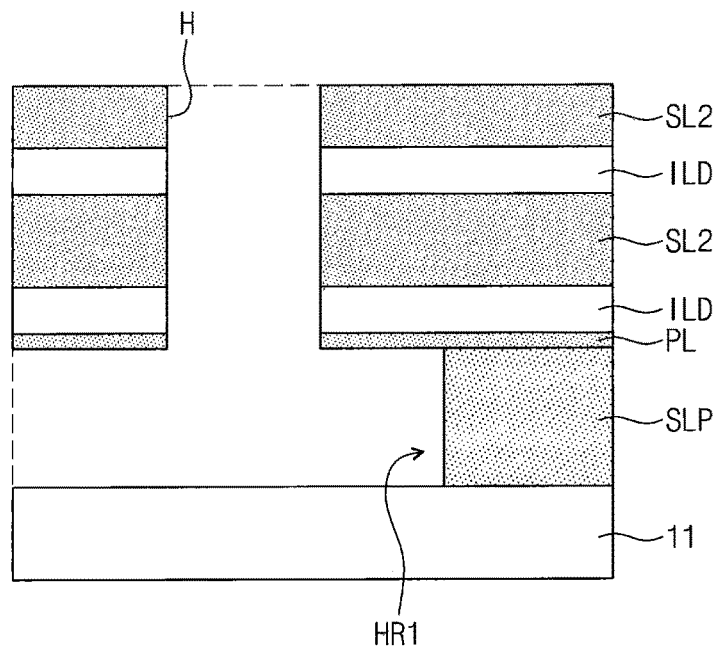
FIGS. 30 to 35 are enlarged views of portions 'A' of FIGS. 21 to 26, respectively, to illustrate methods of manufacturing a 3D semiconductor device according to some embodiments of the inventive concepts.

Referring to FIGS. 4A, 21, and 30, the first sacrificial layer SL1 exposed through the vertical holes H and DH may be laterally etched to form first recess regions HR1.

The first recess regions HR1 may be formed by isotropically etching the first sacrificial layer SL1 using an etch recipe having an etch selectivity with respect to the second sacrificial layers SL2, the insulating layers ILD, and the substrate 10. Thus, the first recess regions HR1 may be connected to the vertical holes H and DH arranged along the first and second directions D1 and D2 and may have rounded sidewalls as illustrated in FIG. 4B.

When the first recess regions HR1 are formed, a portion of the first sacrificial layer SL1 may remain under the thin layer structure 110 between the vertical holes H and DH which are widely spaced apart from each other. The remaining portion of the first sacrificial layer SL1 may be defined as a first sacrificial pattern SLP. The first sacrificial pattern SLP may extend in the first direction D1 between the first recess regions HR1 adjacent one another in the second direction D2. The first sacrificial patterns SLP remaining under the thin layer structure 110 may act as supporters supporting the thin layer structure 110.

In addition, a protection insulating layer PL may be formed between the thin layer structure 110 and the first sacrificial layer SL1, as illustrated in FIG. 30. The vertical holes H and DH may further penetrate the protection insulating layer PL. The protection insulating layer PL may prevent the lowermost insulating layer ILD of the thin layer structure 110 from being etched during the formation of the first recess regions HR1.

Figure 22:
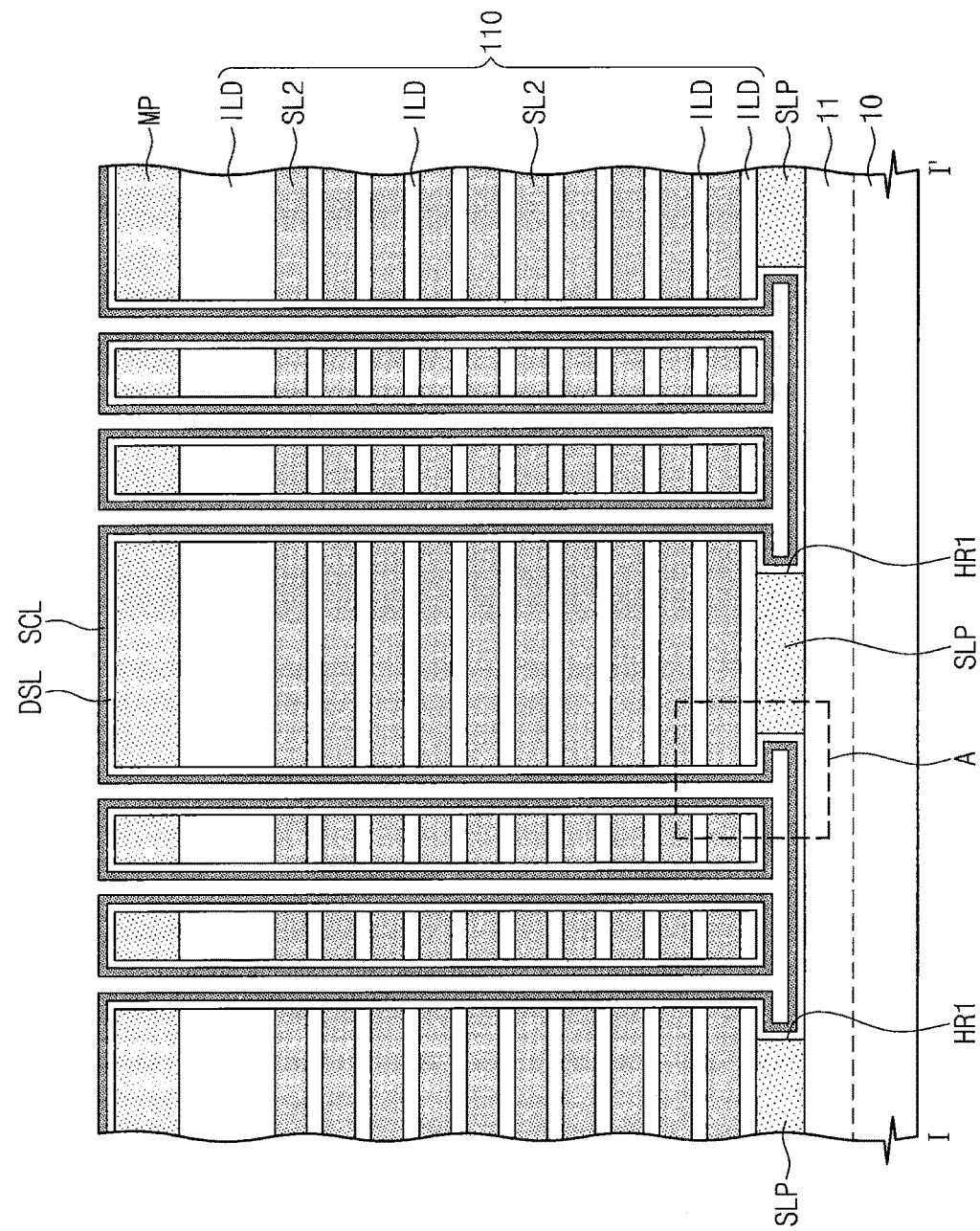
Figure 31:
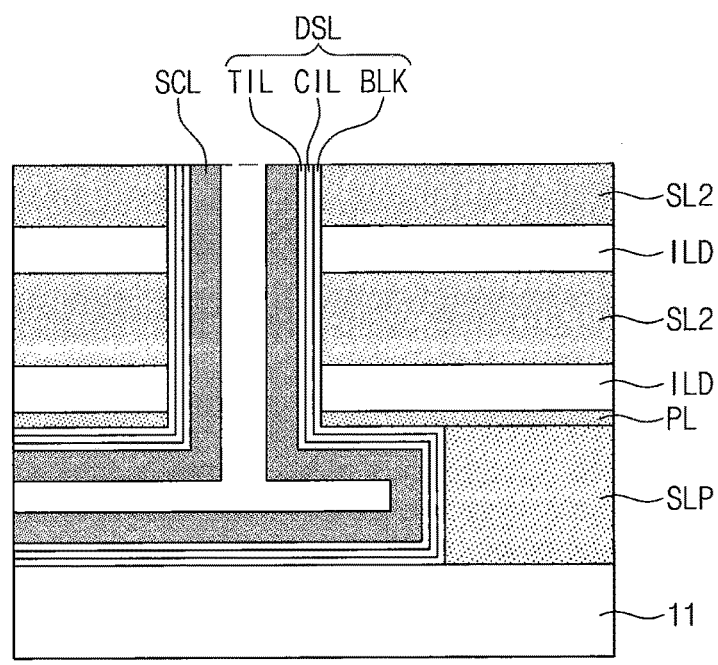

Referring to FIGS. 4A, 22, and 31, a data storage layer DSL and a semiconductor layer SCL may be sequentially formed on inner surfaces of the first recess regions HR1 and inner surfaces of the vertical holes H and DH. The data storage layer DSL and the semiconductor layer SCL may also be formed on the top surface of the thin layer structure 110.

The data storage layer DSL may be formed of a single layer or a plurality of thin layers. In some embodiments, the data storage layer DSL may include a blocking insulating layer BLK, a charge storage layer CIL, and a tunnel insulating layer TIL which are sequentially stacked. The data storage layer DSL may be formed to have a substantially uniform thickness on the inner surfaces of the vertical holes H and DH and the inner surfaces of the first recess regions HR1. In other words, the data storage layer DSL may extend from the inner surfaces of the vertical holes H and DH onto a bottom surface of the thin layer structure 110 and a surface of the substrate 10.

The semiconductor layer SCL may be formed to have a substantially uniform thickness on the data storage layer DSL and may extend from the inner surfaces of the vertical holes H and DH onto the bottom surface of the thin layer structure 110 and the surface of the substrate 10.

The semiconductor layer SCL and the data storage layer DSL may be formed using a CVD technique and/or an ALD technique. The semiconductor layer SCL may have a hollow pipe or macaroni shape that continuously extends through the vertical holes H and DH and the first recess region HR1. The semiconductor layer SCL may include silicon (Si), germanium (Ge), or a combination thereof. The semiconductor layer SCL may be doped with dopants or may be an intrinsic semiconductor not doped with dopants. The semiconductor layer may have a crystal structure including at least one of a single-crystalline structure, an amorphous structure, or a poly-crystalline structure.

In some embodiments, a sum of thicknesses of the data storage layer DSL and the semiconductor layer SCL may be smaller than a half of a thickness of the first sacrificial pattern SLP. Thus, a gap region may be defined in the first recess region HR1 by the data storage layer DSL and the semiconductor layer SCL. In certain embodiments, the thickness of the data storage layer DSL may be smaller than a half of a thickness of the first sacrificial pattern SLP, and the semiconductor layer SCL may have a hollow pipe shape in each of the vertical holes H and DH but may completely fill the first recess region HR1.

Figure 23:
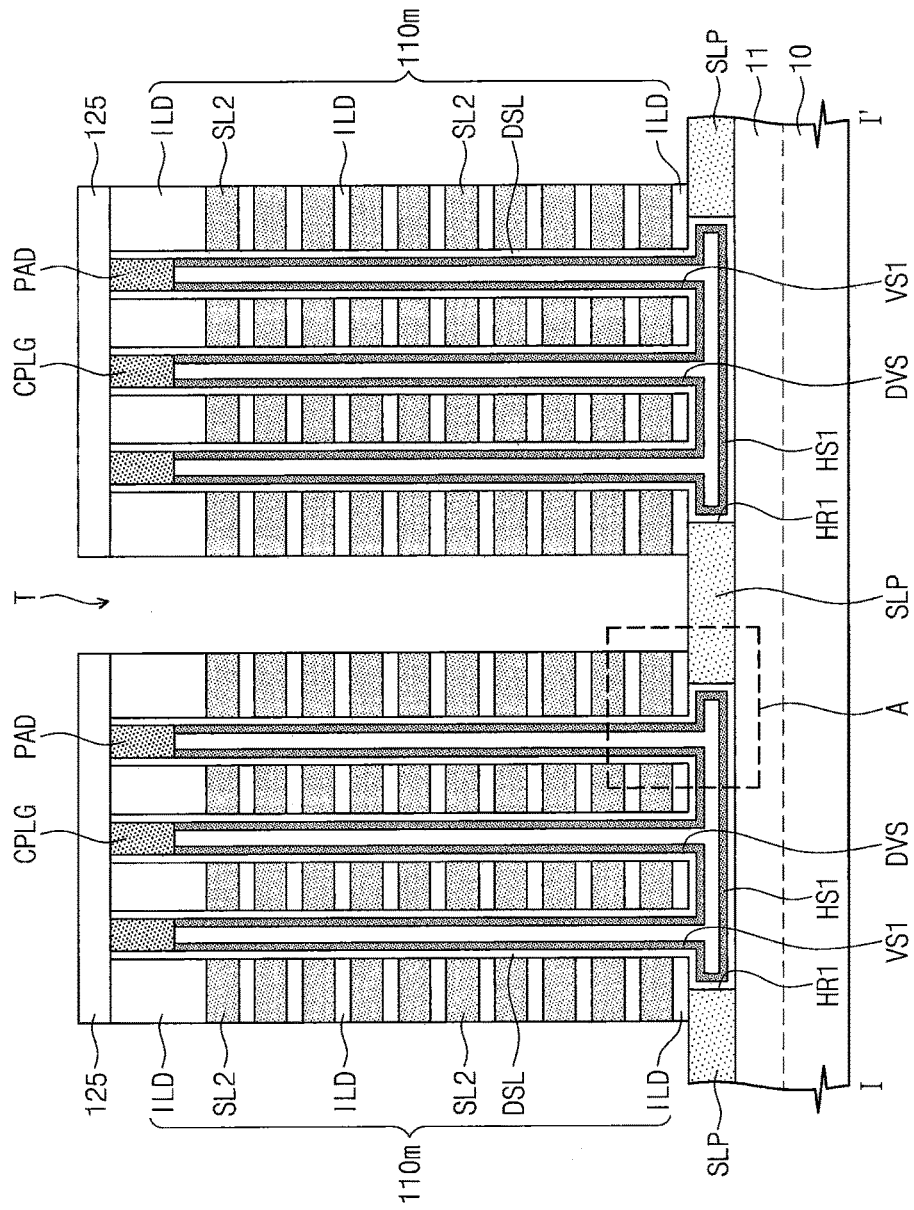
Figure 32:
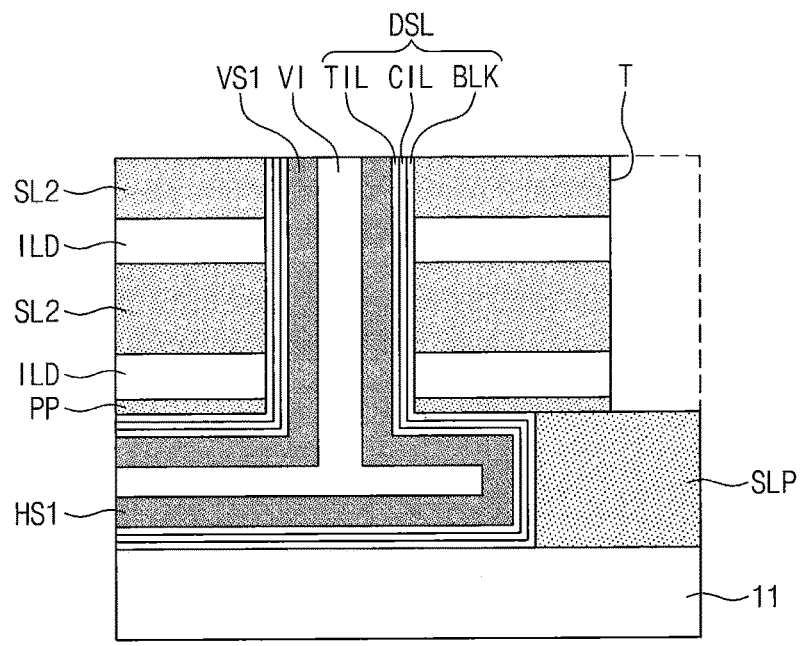

Referring to FIGS. 4A, 23, and 32, after the formation of the semiconductor layer SCL, a filling insulation pattern VI may be formed to fill an inner space surrounded by the semiconductor layer SCL in the vertical holes H and DH and the first recess region HR1. The data storage layer DSL and the semiconductor layer SCL on the top surface of the thin layer structure 110 may be removed by a planarization process exposing the uppermost insulating layer ILD. Thus, a channel structure including vertical channels VS1, VS2, and DVS and a first horizontal channel HS1 may be formed. The vertical channels VS1, VS2, and DVS may be formed in the vertical holes H and DH, respectively, and the first horizontal channel HS1 may be formed under the thin layer structure 110.

Next, conductive pads PAD may be formed on the vertical channels VS1 and VS2, and source plugs CPLG may be formed on the dummy vertical channels DVS. The conductive pads PAD and the source plugs CPLG may be dopant regions doped with dopants or may be formed of a conductive material. In some embodiments, bottom surfaces of the conductive pads PAD and the source plugs CPLG may be higher than a top surface of the uppermost one of the second sacrificial layers SL2. In some embodiments, as illustrated in FIG. 5, a vertical length of the source plug CPLG may be longer than that of the conductive pad PAD. In other words, the bottom surface of the source plug CPLG may be lower than a bottom surface of the uppermost one of the second sacrificial layers SL2. The methods of forming the conductive pads PAD and the source plugs CPLG will be described later in more detail with reference to FIGS. 36 to 40.

In some embodiments, the uppermost insulating layer ILD and the uppermost second sacrificial layer SL2 may be patterned before or after the formation of the conductive pads PAD and the source plugs CPLG. Thus, second sacrificial patterns laterally spaced apart from each other may be formed at the uppermost second sacrificial layer of the thin layer structure 110. The separation insulating pattern 115 of FIG. 6 may be formed between the second sacrificial patterns. The separation insulating pattern 115 of FIG. 6 may be connected to the data storage layer DSL surrounding the dummy vertical channel DVS in the first direction D1.

Subsequently, a capping insulating layer covering the conductive pads PAD and the source plugs CPLG may be formed on the thin layer structure 110. The capping insulating layer and the thin layer structure 110 may be patterned to form trenches T of which each exposes the first sacrificial pattern SLP between the channel structures adjacent one another.

Forming the trenches T may include forming a mask pattern (not shown) defining planar positions of the trenches T on the capping insulating layer, and anisotropically etching the capping insulating layer and the thin layer structure 110 using the mask pattern (not shown) as an etch mask.

The trenches T may be spaced apart from the vertical channels VS1, VS2, and DVS and may expose sidewalls of the insulating layers ILD and sidewalls of the second sacrificial layers SL2. Each of the trenches T may have a linear or rectangular shape extending in the first direction D1 in a plan view and may expose a top surface of the first sacrificial pattern SLP in a cross-sectional view. When the trenches T are formed, the first sacrificial patterns SLP under the trenches T may be recessed by a predetermined depth due to over-etching. In some embodiments, each of the trenches T may have an inclined sidewall.

Since the trenches T are formed, the thin layer structure 110 may be divided into a plurality of mold structures 110m. In addition, a capping insulating pattern 125 may be formed on each of the mold structures 110m. The capping insulating patterns 125 may correspond to portions of the capping insulating layer. The mold structures 110m may have liner shapes extending in the first direction D1 and may be spaced apart from each other in the second direction D2. In addition, a portion of the first sacrificial pattern SLP may be exposed through the trench T between the mold structures 110m adjacent one another. Furthermore, since the trenches T are formed, a protection insulating pattern PP may be formed on the bottom surface of the lowermost insulating layer ILD of each of the mold structures 110m.

Figure 24:
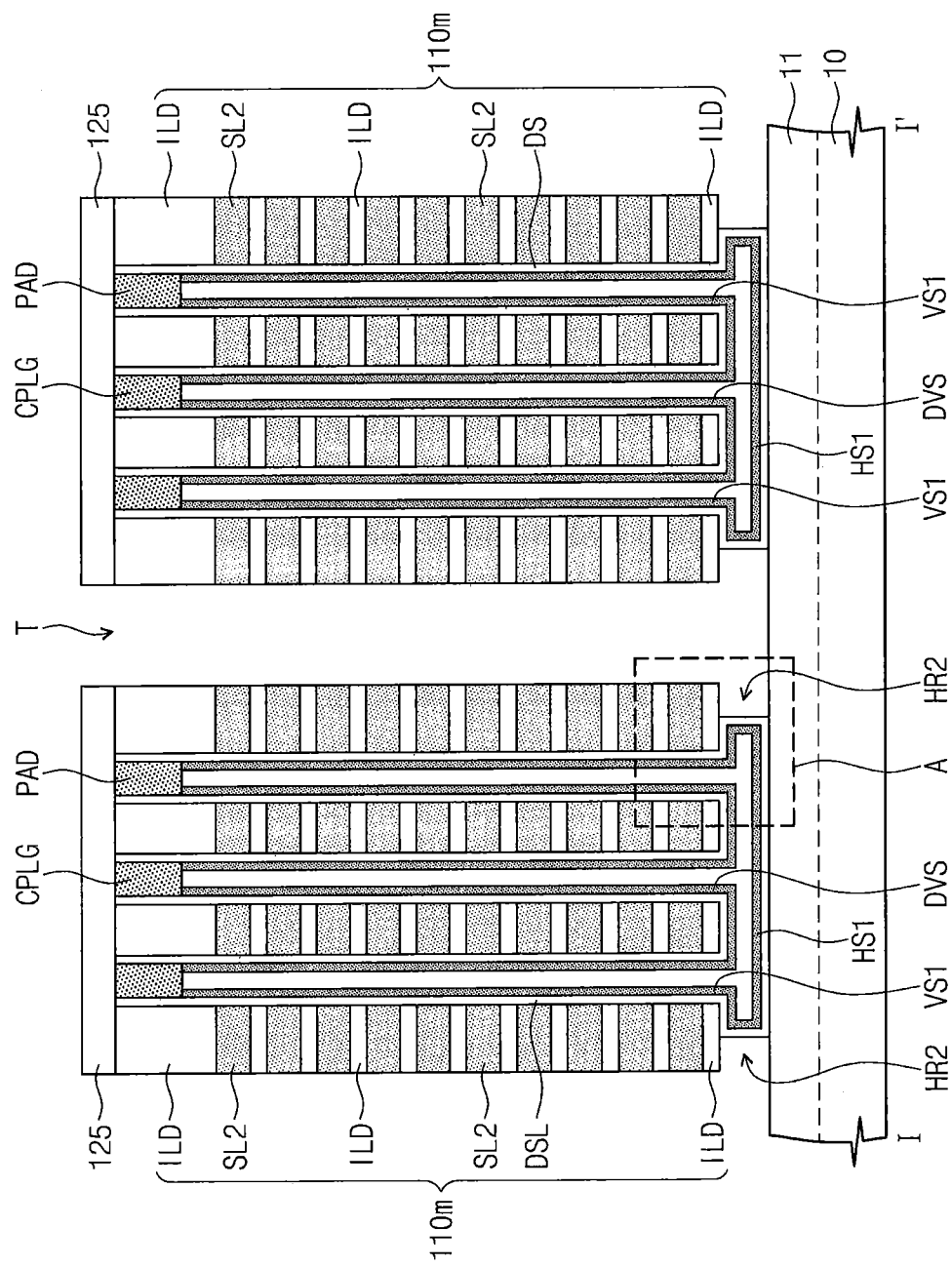
Figure 33:
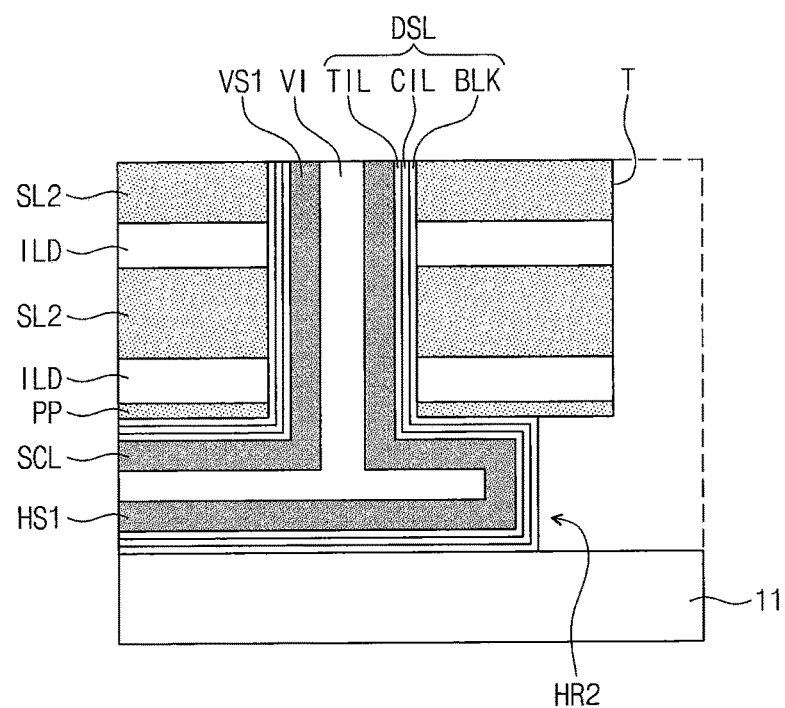

Referring to FIGS. 4A, 24, and 33, the first sacrificial pattern SLP exposed through the trench T may be removed to form a second recess region HR2 exposing a portion of the data storage layer DSL.

The second recess region HR2 may be formed by isotropically etching the first sacrificial pattern SLP using an etch recipe having an etch selectivity with respect to the second sacrificial layers SL2, the insulating layers ILD, and the substrate 10. The second recess region HR2 may expose a portion of the substrate 10. In addition, as illustrated in FIG. 33, the protection insulating pattern PP may prevent the lowermost insulating layer ILD from being etched during the formation of the second recess region HR2. Thus, a variation in thickness of the lowermost insulating layer ILD may be reduced or minimized during the formation of the second recess region HR2.

Figure 25:
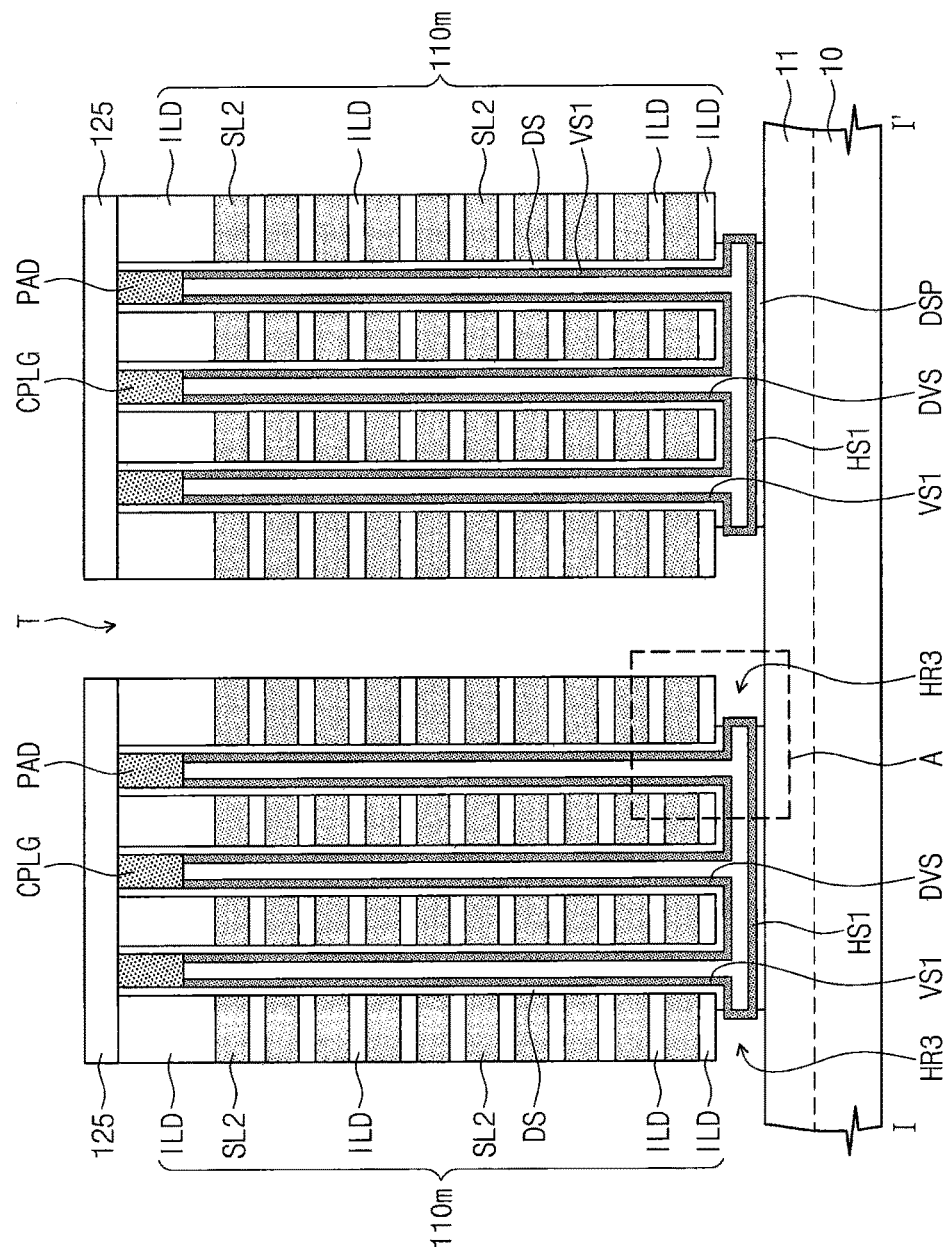
Figure 34:
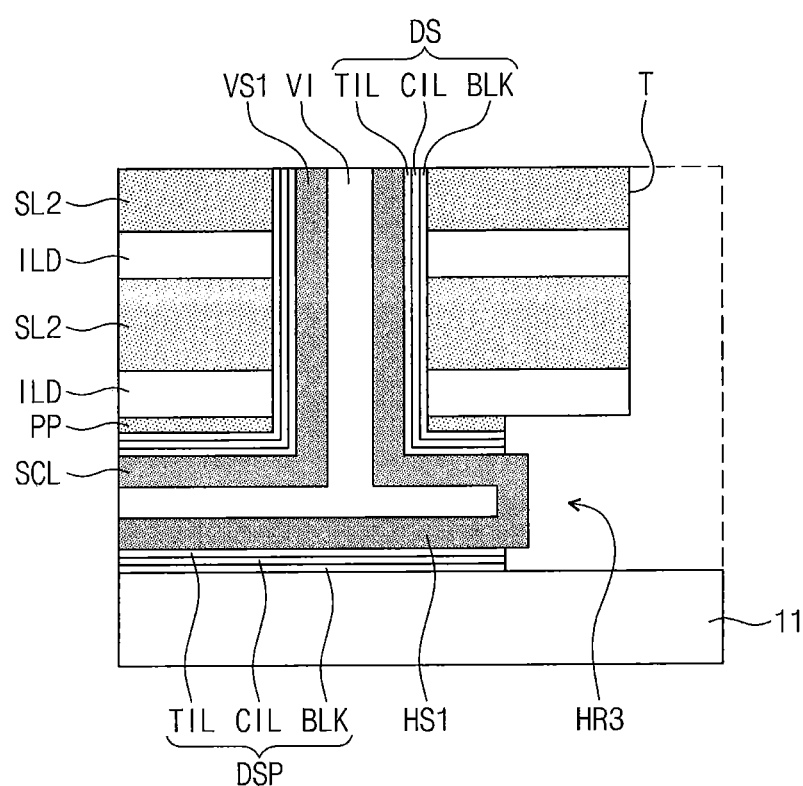

Referring to FIGS. 4A, 25, and 34, the portion of the data storage layer DSL exposed by the second recess region HR2 may be removed to form a third recess region HR3 exposing a portion of the first horizontal channel HS1.

The third recess region HR3 may be formed by isotropically etching the data storage layer DSL using an etch recipe having an etch selectivity with respect to the second sacrificial layers SL2, the insulating layers ILD, and the substrate 10. For example, the process of forming the third recess region HR3 may include a process of isotropically etching the blocking insulating layer BLK, a process of isotropically etching the charge storage layer CIL, and a process of isotropically etching the tunnel insulating layer TIL, which are sequentially performed.

Since the third recess region HR3 is formed, a residual data storage pattern DSP may be formed between the first horizontal channel HS1 and the substrate 10, and a portion of the first horizontal channel HS1 and a portion of a data storage layer DS may be exposed by the third recess region HR3. The data storage layer DS may be disposed on the first horizontal channel HS1 and may be spaced apart from the residual data storage pattern DSP. In some embodiments, under the mold structure 110m, a sidewall of the data storage layer DS may be laterally recessed from the sidewall of the first horizontal channel HS1.

In some embodiments, a portion of the protection insulating pattern PP exposed by the second recess region HR2 may also be etched in the process of etching the portion of the data storage layer DSL. Thus, the third recess region HR3 may also expose a portion of the bottom surface of the lowermost insulating layer ILD. In some embodiments, the protection insulating pattern PP may be used as an etch stop layer during the formation of the third recess region HR3, and thus it is possible to prevent the bottom surface of the lowermost insulating layer ILD from being exposed.

Figure 26:
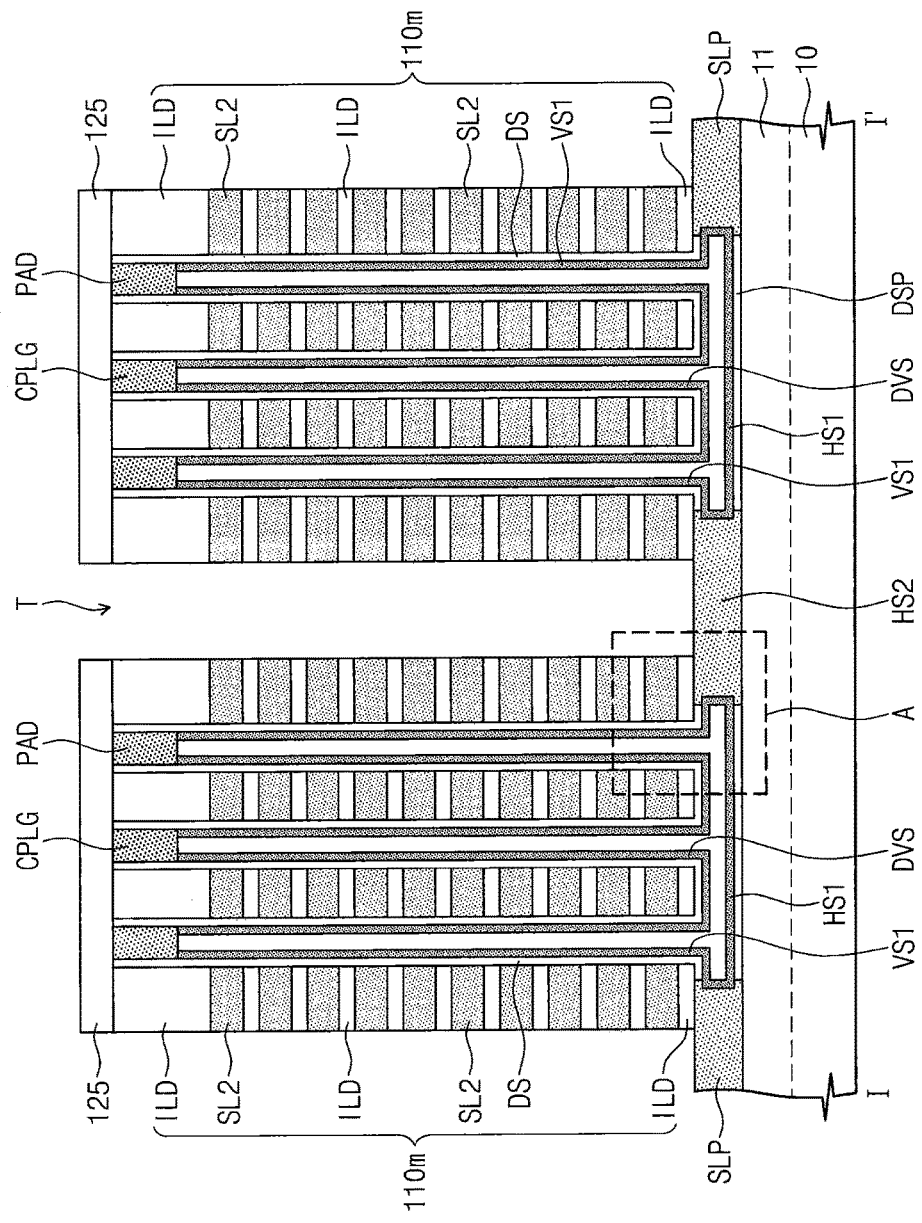
Figure 35:
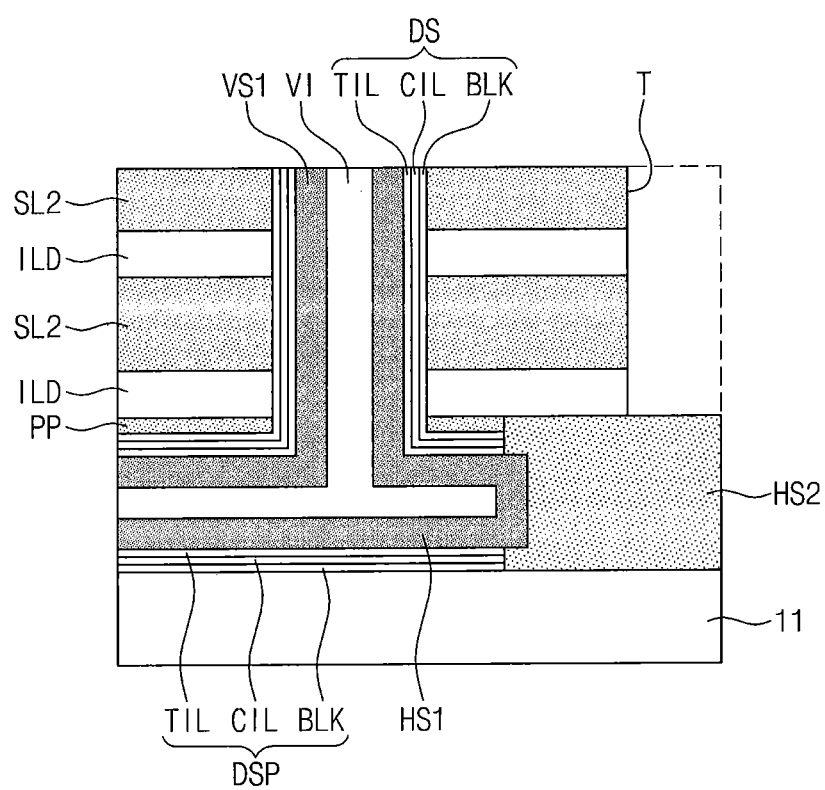

Referring to FIGS. 4A, 26, and 35, a second horizontal channel HS2 may be formed in the third recess region HR3. The second horizontal channel HS2 may be in contact with the first horizontal channel HS1.

In some embodiments, a semiconductor layer may be deposited in the trench T and the third recess region HR3, and the semiconductor layer disposed in the trench T may be removed to form the second horizontal channel HS2. Here, the semiconductor layer for the second horizontal channel HS2 may be formed using a CVD technique or an ALD technique. The semiconductor layer for the second horizontal channel HS2 may be doped with dopants or may include an intrinsic semiconductor not doped with dopants. In some embodiments, the semiconductor layer for the second horizontal channel HS2 may be doped with dopants of the first conductivity type. In addition, the semiconductor layer for the second horizontal channel HS2 may have a crystal structure including at least one of a single-crystalline structure, an amorphous structure, or a poly-crystalline structure. The second horizontal channel HS2 may be in contact with the sidewall of the first horizontal channel HS1, the data storage layer DS, and the residual data storage pattern, which are disposed under the mold structure 110m. In addition, the second horizontal channel HS2 may be in direct contact with the well dopant layer 11 formed in the substrate 10.

Figure 27:
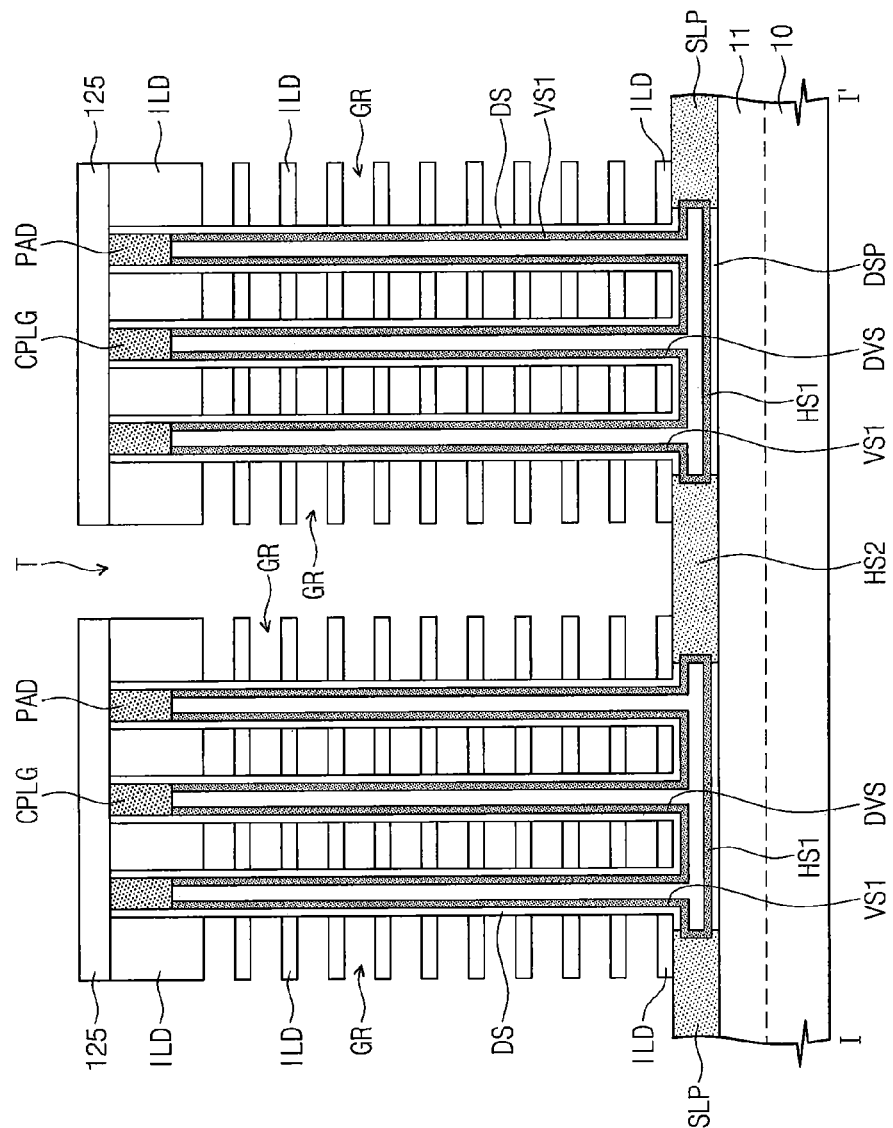

Referring to FIGS. 4A and 27, the second sacrificial layers SL2 exposed through the trenches T may be removed to form gate regions GR between the insulating layers ILD.

The gate regions GR may be formed by isotropically etching the second sacrificial layers SL2 using an etch recipe having an etch selectivity with respect to the insulating layers ILD, the vertical channels VS1, VS2, and DVS, the data storage layer DS, and the second horizontal channel HS2. Here, the second sacrificial layers SL2 may be completely removed by the isotropic etching process. For example, in the event that the second sacrificial layers SL2 are silicon nitride layers and the insulating layers ILD are silicon oxide layers, the second sacrificial layers SL2 may be removed by the isotropic etching process using an etching solution including phosphoric acid. In addition, the data storage layer DS may be used as an etch stop layer in the isotropic etching process for forming the gate regions GR. The gate regions GR may laterally extend from the trench T into between the insulating layers ILD and may expose portions of a sidewall of the data storage layer DS or portions of sidewalls of the vertical channels VS1 and VS2. In other words, each of the gate regions GR may be defined by the sidewall of the data storage layer DS and the insulating layers ILD vertically adjacent one another.

Figure 28:
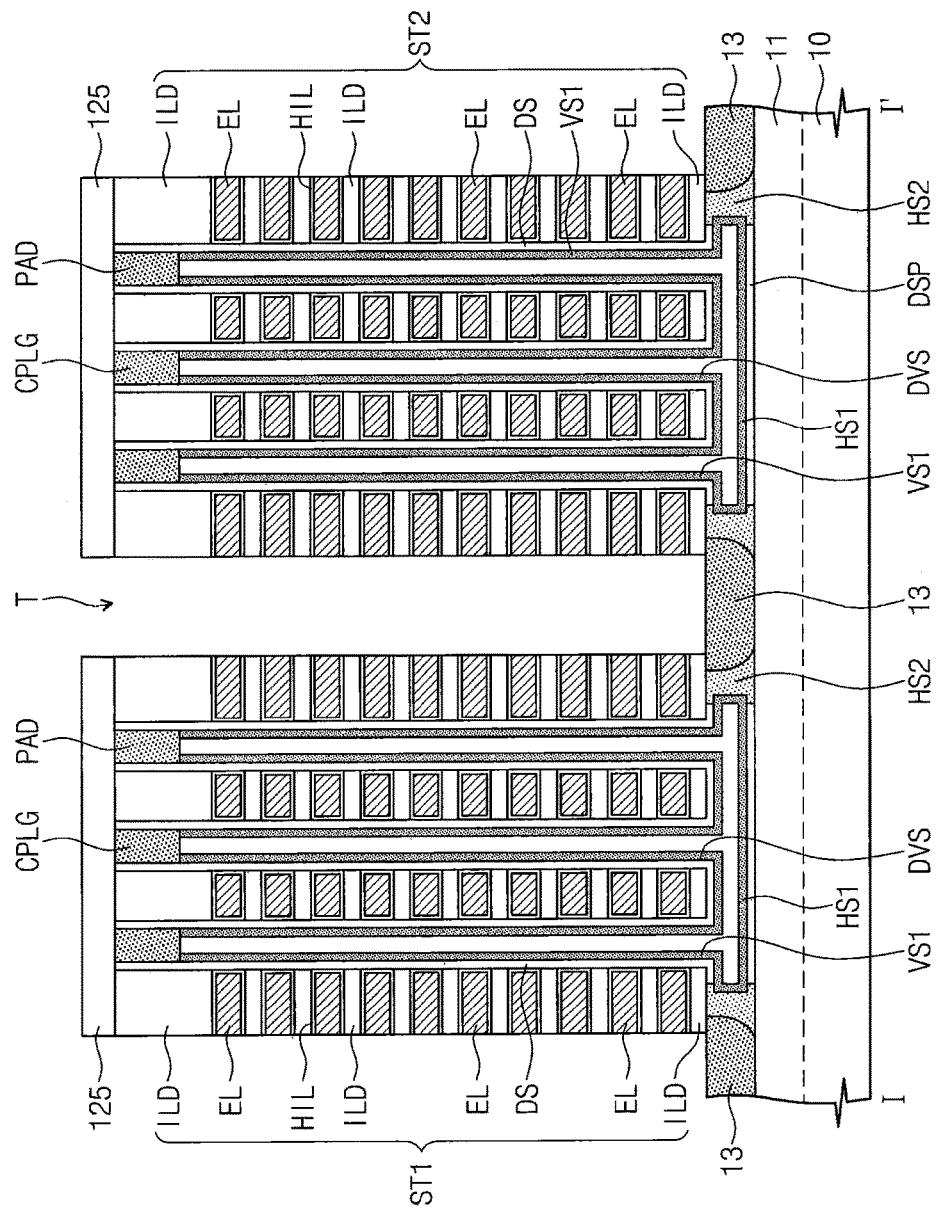

Referring to FIGS. 4A and 28, a horizontal insulating layer may be formed on inner surfaces of the trenches T and inner surfaces of the gate regions GR. The horizontal insulating layer may have a substantially uniform thickness on the inner surfaces of the gate regions OR. The horizontal insulating layer may be formed of a single layer or a plurality of thin layers. In some embodiments, the horizontal insulating layer may be a portion of a data storage layer of a charge trap-type flash memory transistor.

Electrodes EL may be respectively formed in the gate regions GR in which the horizontal insulating layer is formed. The electrodes EL may partially or fully fill the gate regions GR. In some embodiments, forming the electrodes EL may include sequentially depositing a barrier metal layer and a metal layer. For example, the barrier metal layer may include a metal nitride layer such as a titanium nitride (TiN) layer, a tantalum nitride (TaN) layer, and/or a tungsten nitride (WN) layer. For example, the metal layer may include at least one of metal materials such as W, Al, Ti, Ta, Co, and/or Cu. The barrier metal layer and the metal layer disposed outside the gate regions GR may be removed to confinedly form the electrodes EL in the gate regions GR. After the formation of the electrodes EL, the horizontal insulating layer disposed outside the gate regions GR may be removed to form horizontal insulating patterns HIL in the gate regions GR, respectively.

Since the electrodes EL are formed, first and second stack structures ST1 and ST2 may be formed on the substrate 10. Each of the first and second stack structures ST1 and ST2 may include the insulating layers ILD and the electrodes EL which are alternately and repeatedly stacked on the substrate 10. The first and second stack structures ST1 and ST2 may extend in the first direction D1, and sidewalls of the first and second stack structures ST1 and ST2 may be exposed by the trenches T. In addition, the second horizontal channel HS2 may be exposed between the first and second stack structures ST1 and ST2 adjacent one another.

A dopant region 13 may be formed in the second horizontal channel HS2 between the first and second stack structures ST1 and ST2. The dopant region 13 may be doped with dopants of the first conductivity type. The dopants of the same conductivity type as the well dopant layer 11 may be injected into the second horizontal channel HS2 to form the dopant region 13. In certain embodiments, the second horizontal channel HS2 may be doped with dopants during the formation of the second horizontal channel HS2. In such cases, the process of forming the dopant region 13 may be omitted.

Figure 29:
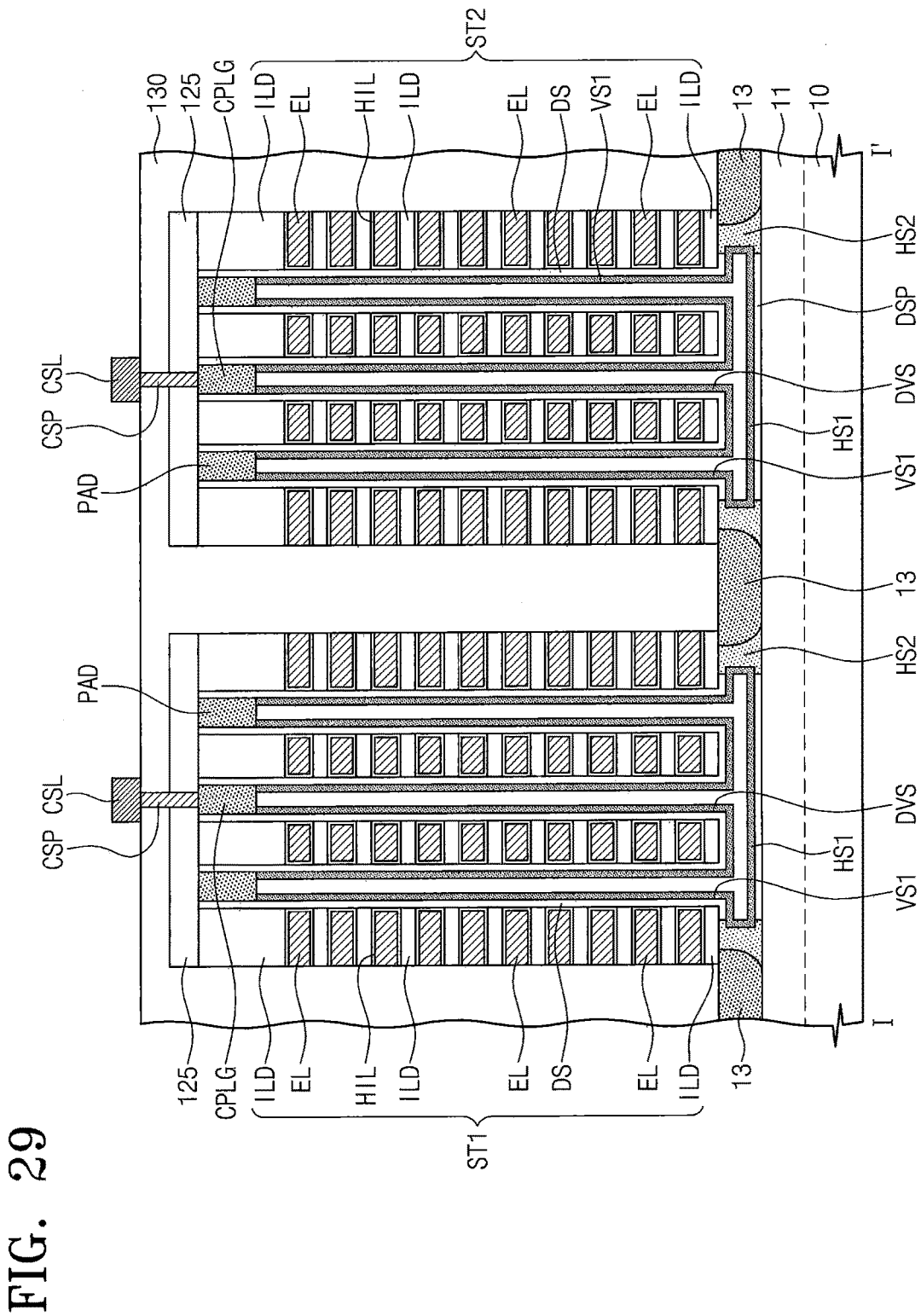

Referring to FIGS. 4A and 29, a filling insulation layer 130 may be formed to fill the trench T between the first and second stack structures ST1 and ST2. The filling insulation layer 130 may be in contact with the second horizontal channel HS2 and may cover the first and second stack structures ST1 and ST2.

A common source line CSL extending in the first direction D1 may be formed on the filling insulation layer 130. The common source line CSL may be electrically connected to the dummy vertical channels DVS arranged in the first direction D1. The common source line CSL may be electrically connected to the source plugs CPLG disposed on the dummy vertical channels DVS through contact plugs CSP penetrating the filling insulation layer 130 and the capping insulating pattern 125. The common source line CSL may be formed on the filling insulation layer 130 disposed on each of the first and second stack structures ST1 and ST2.

Subsequently, as described with reference to FIGS. 4A, 5, and 6, the first insulating layer 140 may be formed on the filling insulation layer 130, and the lower contact plugs LCP may be formed to penetrate the first insulating layer 140, the filling insulation layer 130, and the capping insulating pattern 125. The lower contact plugs LCP may be connected to the vertical channels VS1 and VS2. Next, the first to fourth assistant interconnections SBL1 to SBL4 may be formed on the first insulating layer 140. The second insulating layer 150 may be formed on the first insulating layer 140 and the assistant interconnections SBL1 to SBL4, and the upper contact plugs UCP may be formed to penetrate the second insulating layer 150. The upper contact plugs UCP may be connected to the assistant interconnections SBL1 to SBL4. The first and second bit lines BL1 and BL2 may be formed on the second insulating layer 150.

FIGS. 36 to 40 are cross-sectional views illustrating methods of forming a conductive pad and a source plug of a 3D semiconductor device according to some embodiments of the inventive concepts. Hereinafter, the descriptions to the same technical features as in the embodiment of FIGS. 19 to 29 will be omitted or mentioned briefly for the purpose of ease and convenience in explanation. Thus, processes of forming conductive pads and source plugs according to the present embodiment will be performed after the processes described with reference to FIG. 22.

Figure 36:
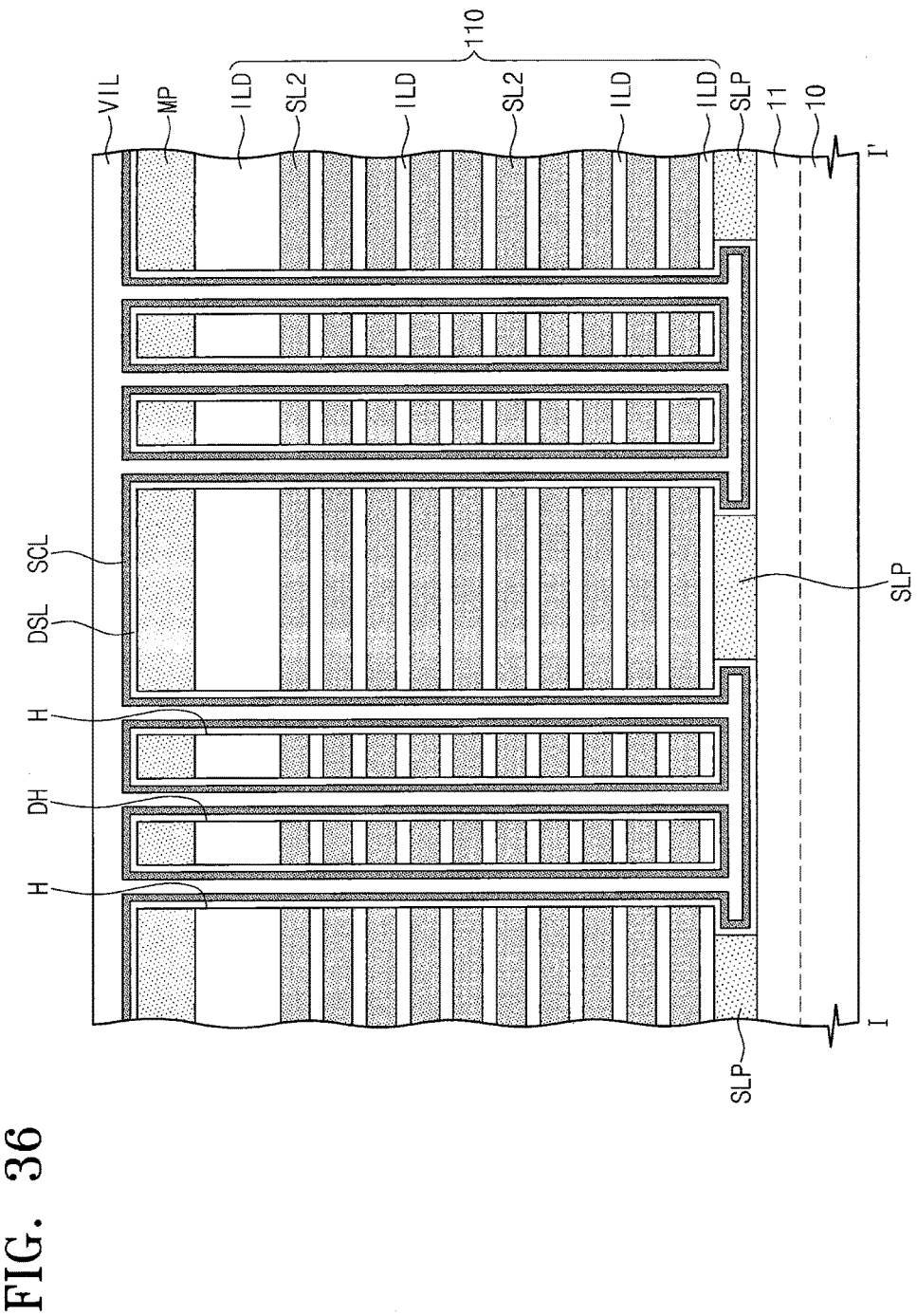
FIGS. 36 to 40 are cross-sectional views illustrating methods of forming a conductive pad and a source plug of a 3D semiconductor device according to some embodiments of the inventive concepts.

Referring to FIG. 36, the data storage layer DSL and the semiconductor layer SCL may have substantially uniform thicknesses and may continuously cover the inner surfaces of the vertical holes H, the inner surfaces of the dummy vertical holes DH, and the inner surface of the first recess region HR1. Here, the vertical holes H may correspond to the first and second vertical channels VS1 and VS2 illustrated in FIG. 4A, and the dummy vertical holes DH may correspond to the dummy vertical channels DVS illustrated in FIG. 4A. The semiconductor layer SCL may have a hollow pipe shape. After the formation of the semiconductor layer SCL, an insulating layer VIL may be formed on an entire top surface of the substrate 10 to fill the inner space of the semiconductor layer SCL.

Figure 37:
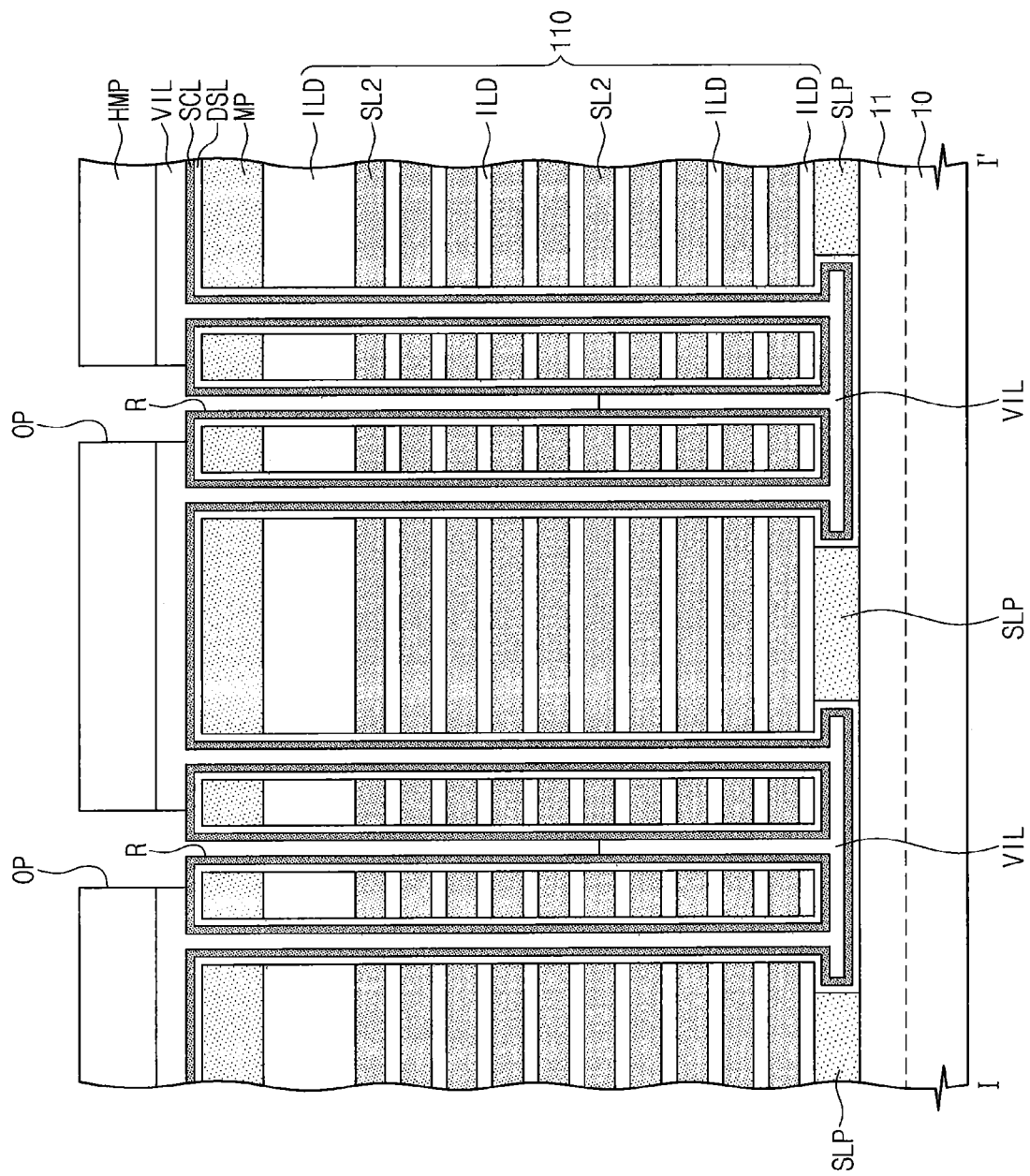

Referring to FIG. 37, a hard mask pattern HMP having openings OP may be formed on the insulating layer VIL. Each of the openings OP may have a liner shape extending in the first direction D1 and may be disposed on the dummy vertical holes DH (see the dummy vertical channels DVS of FIGS. 4A and 4B) arranged along the first direction D1. Next, the insulating layer VIL may be etched using the hard mask pattern HMP as an etch mask. In other words, portions of the insulating layer VIL filling the dummy vertical holes DH may be removed to form preliminary holes R exposing portions of the semiconductor layer SCL formed in the dummy vertical holes DH. Thus, top surfaces of the insulating layer VIL, which are exposed through the preliminary holes R, may be lower than the bottom surface of the uppermost one of the second sacrificial layers SL2. After the formation of the preliminary holes R, the hard mask pattern HMP may be removed to expose the top surface of the insulating layer VIL.

Figure 38:
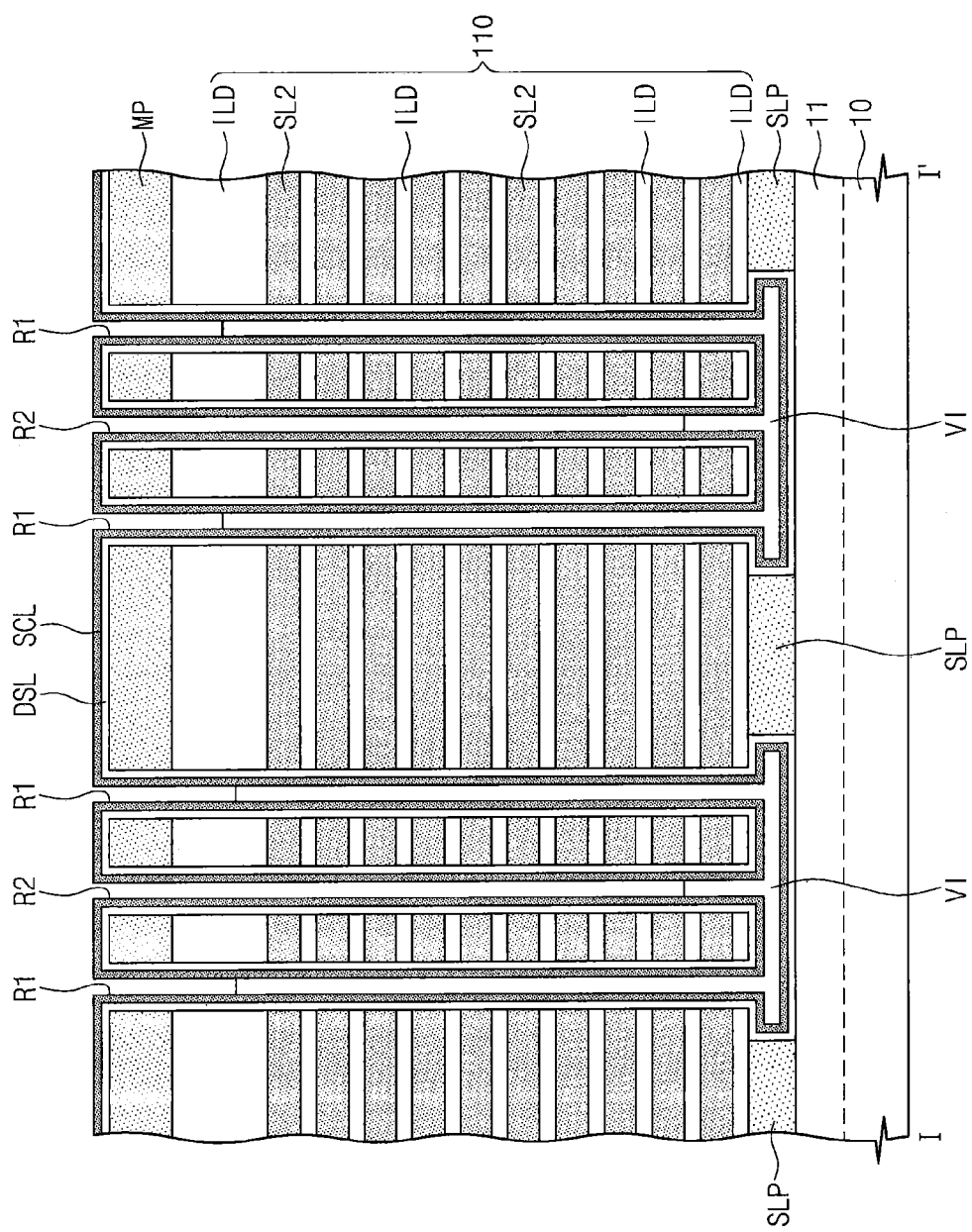

Referring to FIG. 38, a blanket anisotropic etching process may be performed on the insulating layer VIL to form fine holes R1 exposing portions of the semiconductor layer SCL formed in the vertical holes H and to form dummy fine holes R2 exposing portions of the semiconductor layer SCL formed in the dummy vertical holes DH. Since the fine holes R1 and R2 are formed, the filling insulation pattern VI may be formed to fill the inner space of the semiconductor layer SCL.

Since the preliminary holes are formed before the formation of the filling insulating pattern VI, the top surface of the filling insulation pattern VI exposed by the dummy fine hole R2 may be lower than the top surface of the filling insulation pattern VI exposed by the fine hole R1. In other words, a vertical depth of the dummy fine hole R2 may be greater than that of the fine hole R1. The top surface of the filling insulation pattern VI exposed by the fine hole R1 may be higher than the top surface of the uppermost one of the second sacrificial layers SL2.

Figure 39:
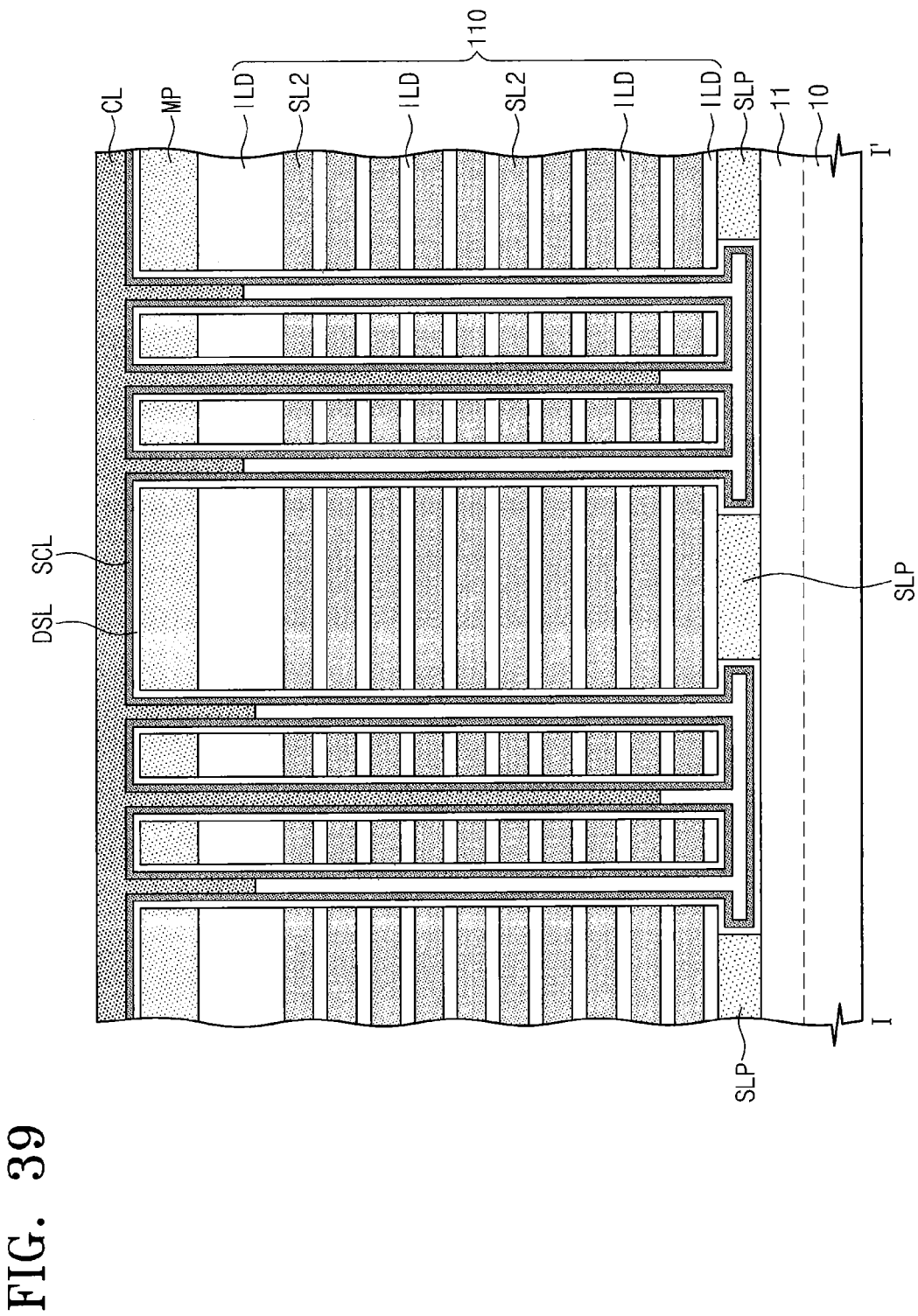

Referring to FIG. 39, a conductive layer CL may be formed on an entire top surface of the substrate 10 to fill the fine holes R1 and the dummy fine holes R2. In some embodiments, the conductive layer CL may have the second conductivity type opposite to the first conductivity type of the well dopant layer 11. In some embodiments, the conductive layer CL may be formed of poly-silicon doped with dopants of the second conductivity type or a metal.

Figure 40:
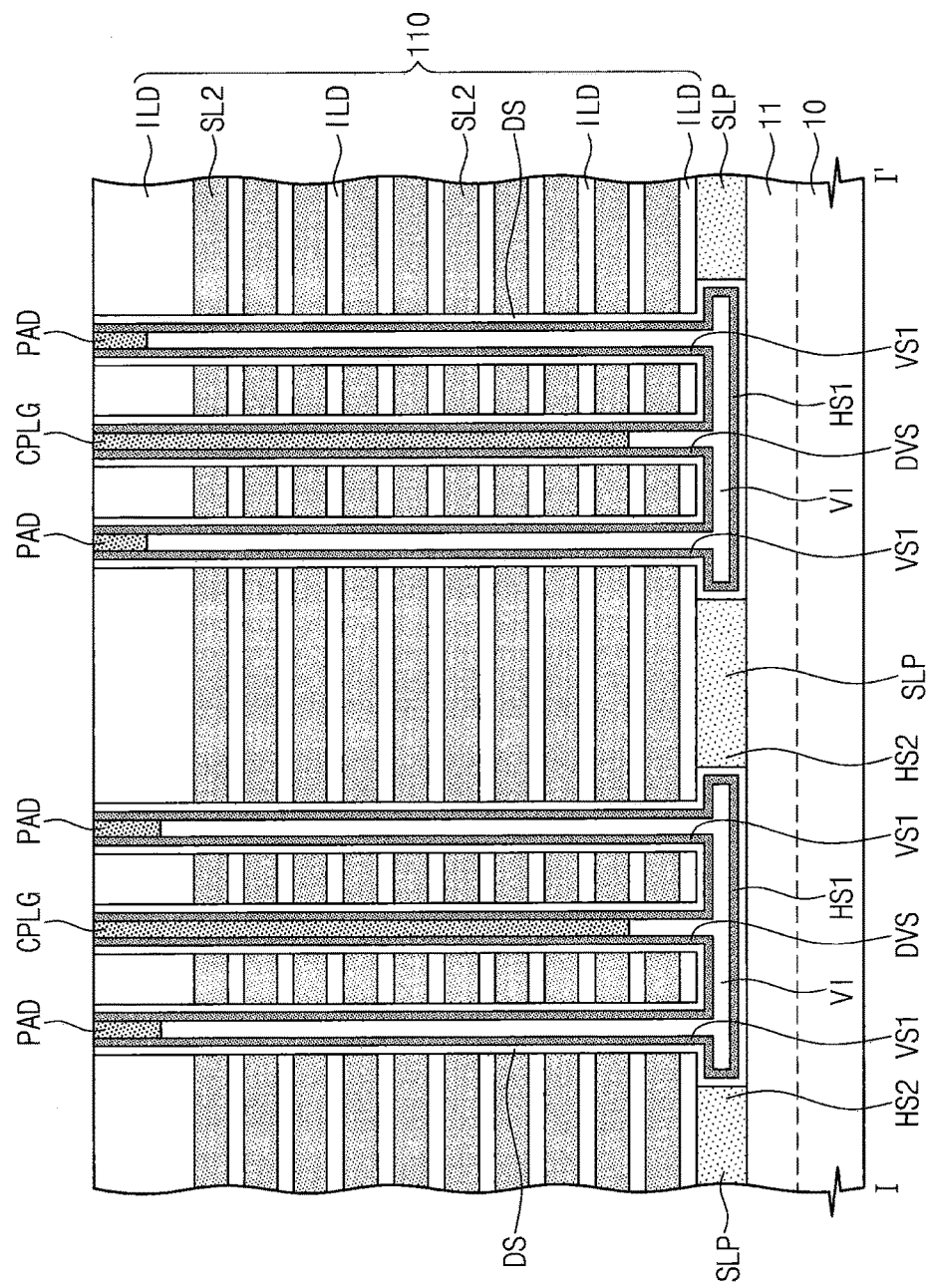

Referring to FIGS. 4A and 40, the conductive layer CL, the semiconductor layer SCL, and the data storage layer DSL may be sequentially etched until the top surface of the thin layer structure 110 is exposed. Thus, the vertical channels VS1 and VS2 may be formed in the vertical holes H and the dummy vertical channels DVS may be formed in the dummy vertical holes DH. At the same time, the conductive pad PAD may be disposed on a top end of each of the vertical channels VS1 and VS2 and the source plug CPLG may be formed on a top end of each of the dummy vertical channels DVS. In some embodiments, the conductive pad PAD may include a first portion of the conductive layer CL and a first portion of the semiconductor layer SCL. The first portion of the conductive layer CL may fill the fine hole R1, and the first portion of the semiconductor layer SCL may be in contact with the first portion of the conductive layer CL. Likewise, the source plug CPLG may include a second portion of the conductive layer CL and a second portion of the semiconductor layer SCL. The second portion of the conductive layer CL may fill the dummy fine hole R2, and the second portion of the semiconductor layer SCL may be in contact with the second portion of the conductive layer CL. In some embodiments, the first and second portions of the semiconductor layer SCL may have the second conductivity type by an ion implantation process or a thermal diffusion process. In the thermal diffusion process, the dopants of the first conductivity type may be diffused from the conductive layer CL into the first and second portions of the semiconductor layer CSL. In certain embodiments, the semiconductor layer SCL exposed by the fine holes R1 and the dummy fine holes R2 may be removed before the formation of the conductive layer CL. In this case, the conductive pad PAD may be formed of a portion of the conductive layer CL, and the source plug CPLG may be formed of another portion of the conductive layer CL.

According to some embodiments of the inventive concepts, the vertical channels and the dummy vertical channels penetrating the stack structure may be connected to the first horizontal channel to constitute one semiconductor layer which continuously extends without an interface therein. Thus, a process of connecting the first horizontal channel to the vertical channels may be omitted. In addition, since the source plugs are formed on the dummy vertical channels, the vertical channels may be connected in common to the source plugs through the first horizontal channel. Thus, a flow of a current may be generated through the vertical channels and the first horizontal channel, thereby electrically connecting the bit line to the source plugs. In addition, since the second horizontal channel is formed to be in contact with the sidewall of the second horizontal channel and the well dopant layer, electrical holes may be provided to the vertical channels through the first and second horizontal channels.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor device comprising:
    a stack structure comprising electrodes that are vertically stacked on a substrate;
    a channel structure coupled to the electrodes to constitute a plurality of memory cells that are three-dimensionally arranged on the substrate, the channel structure comprising:
        first vertical channels and second vertical channels that penetrate the stack structure; and
        a first horizontal channel that is under the stack structure and that laterally connects the first vertical channels and the second vertical channels to each other;
    a second horizontal channel that is connected to a sidewall of the first horizontal channel of the channel structure, the second horizontal channel having a first conductivity type; and
    conductive plugs that are on top ends of the second vertical channels, the conductive plugs having a second conductivity type.

2. The 3D semiconductor device of claim 1, wherein the stack structure, the first horizontal channel, and the second horizontal channel extend in parallel to each other along a direction.

3. The 3D semiconductor device of claim 1, wherein the first vertical channels are arranged along a first direction and along a second direction that is perpendicular to the first direction, and
    wherein the first horizontal channel is connected to the first vertical channels that are arranged along the first direction and the first vertical channels that are arranged along the second direction.

4. The 3D semiconductor device of claim 1, wherein the first horizontal channel overlaps with the stack structure when viewed from a plan view.

5. The 3D semiconductor device of claim 1, wherein the first horizontal channel has a rounded sidewall that is in contact with the second horizontal channel.

6. The 3D semiconductor device of claim 1, wherein the first vertical channels, the second vertical channels, and the first horizontal channel constitute one semiconductor layer that continuously extends without an interface therein.

7. The 3D semiconductor device of claim 1, wherein the first horizontal channel and the second horizontal channel include a semiconductor material, and
    wherein an interface exists between the first horizontal channel and the second horizontal channel.

8. The 3D semiconductor device of claim 1, wherein the substrate includes a well dopant layer that is doped with dopants of the first conductivity type, and
    wherein the second horizontal channel is in direct contact with the well dopant layer.

9. The 3D semiconductor device of claim 1, further comprising:
    a data storage layer that is between the stack structure and the first vertical channels and that is between the stack structure and the second vertical channels; and
    a residual data storage pattern that is between the first horizontal channel and the substrate.

10. The 3D semiconductor device of claim 9, wherein the stack structure further comprises: insulating layers that are between the electrodes, and
    wherein the data storage layer extends between a bottom surface of a lowermost insulating layer of the stack structure and the first horizontal channel.

11. The 9D semiconductor device of claim 10, wherein the second horizontal channel is in contact with a portion of the data storage layer and a portion of the residual data storage pattern.

12. The 3D semiconductor device of claim 1, wherein bottom surfaces of the conductive plugs are lower than a bottom surface of an uppermost one of the electrodes.

13. The 3D semiconductor device of claim 1, further comprising:
    a conductive line that extends in a first direction on the stack structure and that is connected to the second vertical channels.

14. The 3D semiconductor device of claim 1, wherein an uppermost one of the electrodes comprises: a first string selection electrode and a second string selection electrode that are laterally spaced apart from each other, and
    wherein the second vertical channels are between the first string selection electrode and the second string selection electrode.

15. A three-dimensional (3D) semiconductor device comprising:
    a stack structure that extends in a first direction and that includes a plurality of electrodes that are vertically stacked on a substrate;
    first vertical channels and second vertical channels that penetrate the stack structure;
    a first horizontal channel that extends in the first direction under the stack structure and that connects the first vertical channels and the second vertical channels to each other;
    a second horizontal channel that extends in the first direction to contact both sidewalls of the first horizontal channel and has a first conductivity type; and
    conductive plugs that are on top ends of the second vertical channels, the conductive plugs having a second conductivity type that different from the first conductivity type.

16. The 3D semiconductor device of claim 15, wherein the first vertical channels are arranged along the first direction and along a second direction that is perpendicular to the first direction, and
    wherein the first horizontal channel is connected to the first vertical channels that are arranged along the first direction and the first vertical channels that are arranged along the second direction.

17. The 3D semiconductor device of claim 15, wherein the first vertical channels, the second vertical channels, and the first horizontal channel constitute one semiconductor layer that continuously extends without an interface therein, and
    wherein an interface exists between the first horizontal channel and the second horizontal channel.

18. The 3D semiconductor device of claim 15, further comprising:

source plugs that are on top ends of the second vertical channels,
wherein the source plugs have a conductivity type opposite to a conductivity type of the second horizontal channel, and
wherein bottom surfaces of the source plugs are lower than a bottom surface of an uppermost one of the electrodes.

19. The 3D semiconductor device of claim 15, further comprising:
a data storage layer that is between the stack structure and the first vertical channels and that is between the stack structure and the second vertical channels; and
a residual data storage pattern that is between the first horizontal channel and the substrate,
wherein the stack structure further comprises: insulating layers that are between the electrodes,
wherein the data storage layer extends between a bottom surface of a lowermost insulating layer of the stack structure and the first horizontal channel, and
wherein the second horizontal channel is in contact with a portion of the data storage layer and a portion of the residual data storage pattern.

20. The 3D semiconductor device of claim 15, further comprising:
a conductive pad that is on a top end of each of the first vertical channels,
wherein the conductive pad has the second conductivity type, and
wherein a bottom surface of the conductive pad is higher than a top surface of an uppermost one of the electrodes.

* * * * *